(12) United States Patent
Tsuruda

(10) Patent No.: US 11,243,164 B2
(45) Date of Patent: Feb. 8, 2022

(54) TERAHERTZ DEVICE

(71) Applicant: ROHM CO., LTD., Kyoto (JP)

(72) Inventor: Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/983,443

(22) Filed: Aug. 3, 2020

(65) Prior Publication Data

US 2021/0063305 A1 Mar. 4, 2021

(30) Foreign Application Priority Data

Sep. 2, 2019 (JP) .............................. JP2019-159603

(51) Int. Cl.
| | |
|---|---|
| *G01N 21/3581* | (2014.01) |
| *G01R 31/28* | (2006.01) |
| *G02F 2/02* | (2006.01) |
| *H01L 23/00* | (2006.01) |
| *H01Q 21/00* | (2006.01) |
| *H01L 23/29* | (2006.01) |
| *H03B 7/08* | (2006.01) |
| *H04N 5/225* | (2006.01) |

(52) U.S. Cl.
CPC ..... *G01N 21/3581* (2013.01); *G01R 31/2831* (2013.01); *G02F 2/02* (2013.01); *H01L 23/00* (2013.01); *H01L 23/29* (2013.01); *H01Q 21/00* (2013.01); *H03B 7/08* (2013.01); *H04N 5/22521* (2018.08); *H03B 2200/0084* (2013.01)

(58) Field of Classification Search
CPC .. G01N 21/3581; G01R 31/2831; G02F 2/02; H03B 2200/0084; H03B 7/08; H01L 23/00; H01L 23/29; H01Q 21/00; H04N 5/22521
USPC ............ 331/107 T, 154; 333/239; 250/341.1
See application file for complete search history.

(56) References Cited

U.S. PATENT DOCUMENTS

| | | | | |
|---|---|---|---|---|
| 9,461,826 | B2 * | 10/2016 | Kreft ....................... | G06F 21/45 |
| 2012/0314270 | A1 * | 12/2012 | Cho .......................... | H01S 1/06 |
| | | | | 359/230 |
| 2021/0111130 | A1 * | 4/2021 | Ishita .................. | H01L 21/4853 |

FOREIGN PATENT DOCUMENTS

JP 2016111542 A 6/2016

* cited by examiner

*Primary Examiner* — Arnold M Kinkead
(74) *Attorney, Agent, or Firm* — Hamre, Schumann, Mueller & Larson, P.C.

(57) ABSTRACT

There is provided a terahertz device including: a terahertz element configured to generate an electromagnetic wave; a reflection film provided at a position facing the terahertz element and configured to reflect the electromagnetic wave generated from the terahertz element in one direction; and an encapsulating material configured to encapsulate the terahertz element and the reflection film.

19 Claims, 51 Drawing Sheets

TERAHERTZ DEVICE

CROSS-REFERENCE TO RELATED APPLICATION

This application is based upon and claims the benefit of priority from Japanese Patent Application No. 2019-159603, filed on Sep. 2, 2019, the entire contents of which are incorporated herein by reference.

TECHNICAL FIELD

The present disclosure relates to a terahertz device.

BACKGROUND

In recent years, electronic devices such as transistors or the like have been miniaturized, and the size of electronic devices has reached a nanometer scale. Therefore, a phenomenon called a quantum effect has been observed. Thus, development aimed at the realization of ultra-high-speed devices and new-function devices utilizing this quantum effect is under way.

In such an environment, attempts have been made to carry out large-capacity communications, information processing, imaging, measurements and the like using electromagnetic waves in a frequency region called a terahertz band having a frequency of 0.1 THz to 10 THz. This frequency range has the characteristics of both light and radio waves. If a device that operates in this frequency band is realized, the device can be used in many applications, e.g., measurement in various fields such as physical properties, astronomy, living things and the like, in addition to the aforementioned imaging, large-capacity communications and information processing.

As an element for generating or receiving an electromagnetic wave having a terahertz band frequency, for example, an element having a structure in which a resonant tunnel diode and a fine slot antenna are integrated is known.

SUMMARY

In a terahertz device having the terahertz element as described above, there may be a case where improvement in gain is required. Some embodiments of the present disclosure provide a terahertz device capable of improving gain.

According to one embodiment of the present disclosure, a terahertz device includes: a terahertz element configured to generate an electromagnetic wave; a reflection film provided at a position facing the terahertz element and configured to reflect the electromagnetic wave generated from the terahertz element in one direction; and an encapsulating material configured to encapsulate the terahertz element and the reflection film.

According to this configuration, the electromagnetic wave generated in the terahertz element propagates to the reflection film via the encapsulating material and is reflected by the reflection film in one direction. As a result, it is possible to increase the output of the electromagnetic wave. Therefore, it is possible to improve the gain of the terahertz device.

Furthermore, the terahertz element and the reflection film are encapsulated by an encapsulating material. As a result, it is possible to prevent a foreign material from entering between the terahertz element and the reflection film. Therefore, it is possible to prevent the propagation of the electromagnetic wave from being hindered by the foreign material. Since the exposure of the reflection film to the air can be suppressed, it is possible to suppress the deterioration of the reflection film due to the moisture and oxygen in the air.

According to another embodiment of the present disclosure, a terahertz device includes: a terahertz element configured to receive an electromagnetic wave; a reflection film provided at a position facing the terahertz element and configured to reflect the electromagnetic wave incident on the reflection film toward the terahertz element; and an encapsulating material configured to encapsulate the terahertz element and the reflection film.

According to this configuration, the electromagnetic wave incident on the reflection film is reflected by the reflection film toward the terahertz element and is received by the terahertz element. As a result, it is possible to increase the reception intensity of the electromagnetic wave of the terahertz device. Therefore, it is possible to improve the gain of the terahertz device.

Furthermore, the terahertz element and the reflection film are encapsulated by an encapsulating material. As a result, it is possible to prevent a foreign material from entering between the terahertz element and the reflection film. Therefore, it is possible to prevent the propagation of the electromagnetic wave from being hindered by the foreign material. Since the exposure of the reflection film to the air can be suppressed, it is possible to suppress the deterioration of the reflection film due to the moisture and oxygen in the air.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the terahertz device will be described with reference to the drawings. Each embodiment described below exemplifies a configuration and a method for embodying a technical idea, and does not limit the material, shape, structure, arrangement, dimensions, etc. of each component to the following ones. Various modifications may be added to each of the following embodiments. In addition, the drawings are partly schematically shown for the sake of convenience of illustration.

In the present disclosure, the expression "A is formed on B" includes a configuration in which A is formed directly on B and a configuration in which A is formed on B via an object interposed between A and B, unless otherwise specified. Similarly, the expression "A is arranged on B" includes a configuration in which A is arranged directly on B and a configuration in which A is arranged on B via an object interposed between A and B, unless otherwise specified.

Furthermore, the expression "A overlaps with B when viewed in a certain direction" includes a configuration in which the entirety of A overlaps with B and a configuration in which a part of A overlaps with B, unless otherwise specified.

First Embodiment

Figure 1:
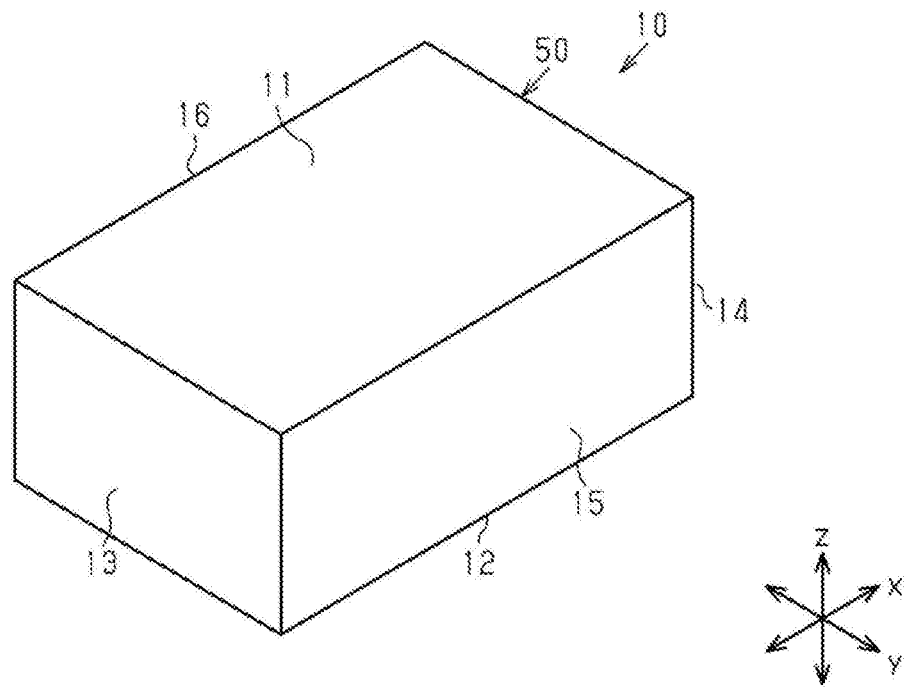
FIG. 1 is a perspective view of a terahertz device according to a first embodiment as viewed from above.
Figure 2:
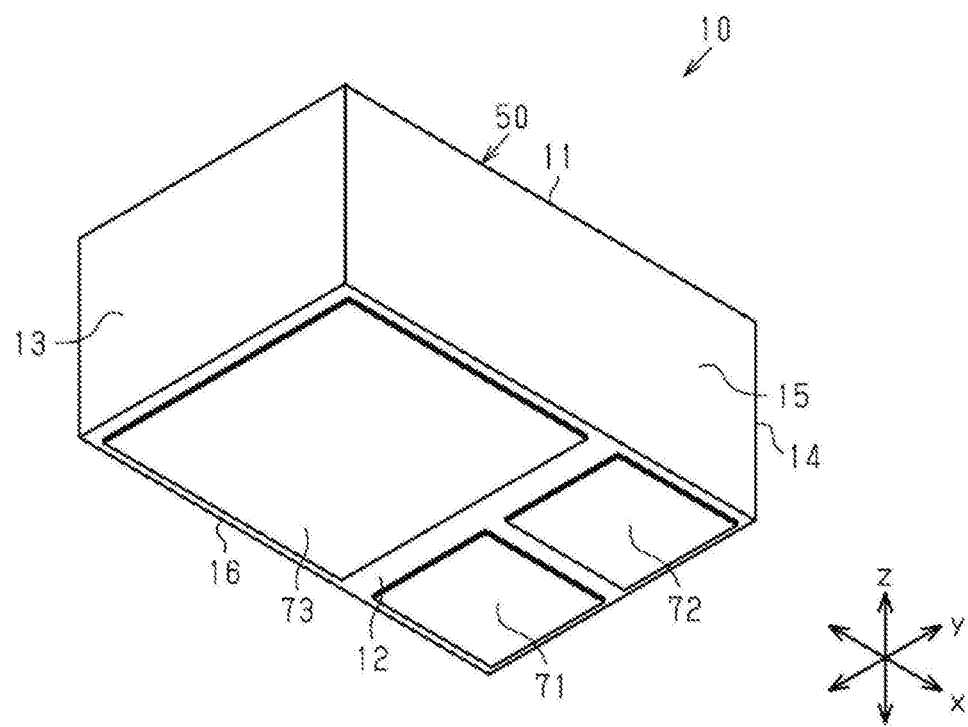
FIG. 2 is a perspective view of the terahertz device as viewed from below.
Figure 3:
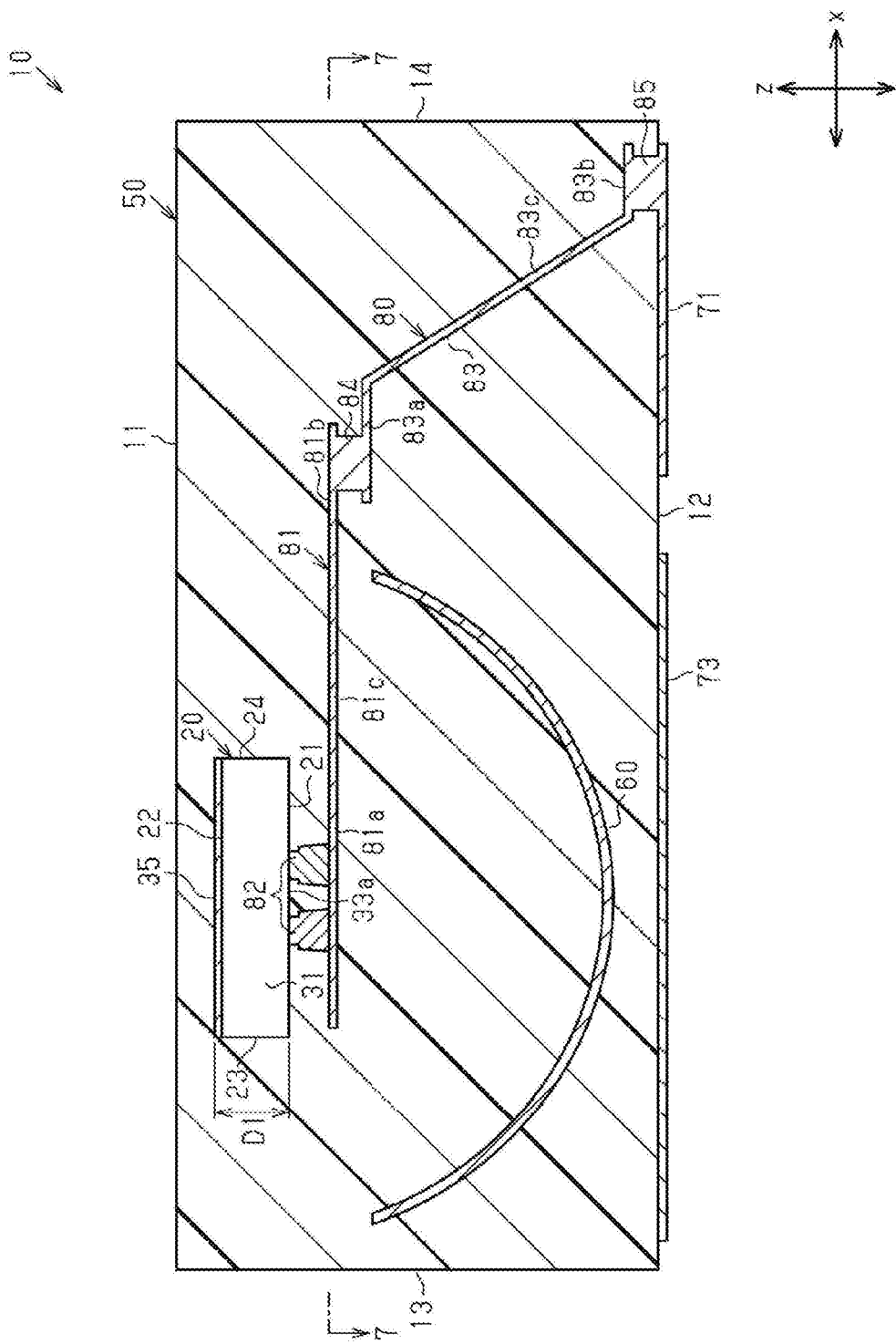
FIG. 3 is an end view for explaining the cross-sectional structure of the terahertz device.
Figure 4:
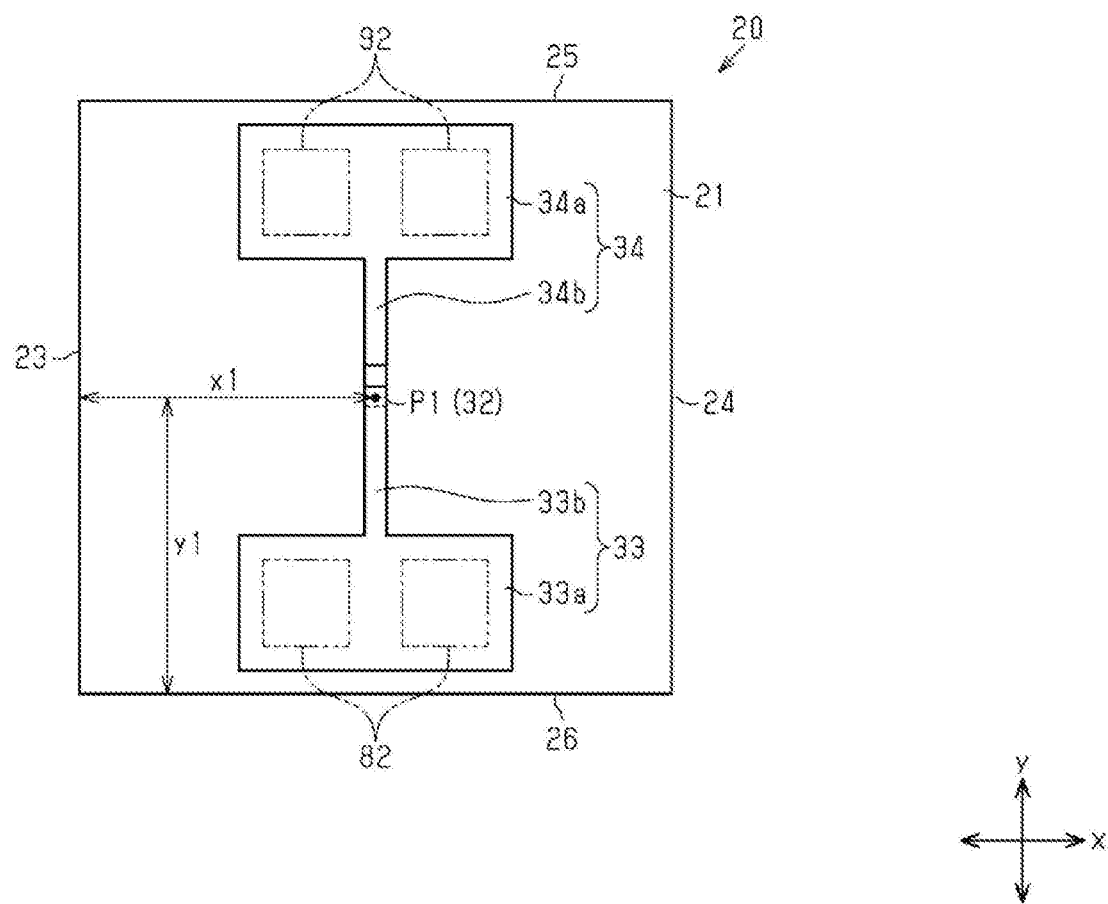
FIG. 4 is a front view of a terahertz element.
Figure 5:
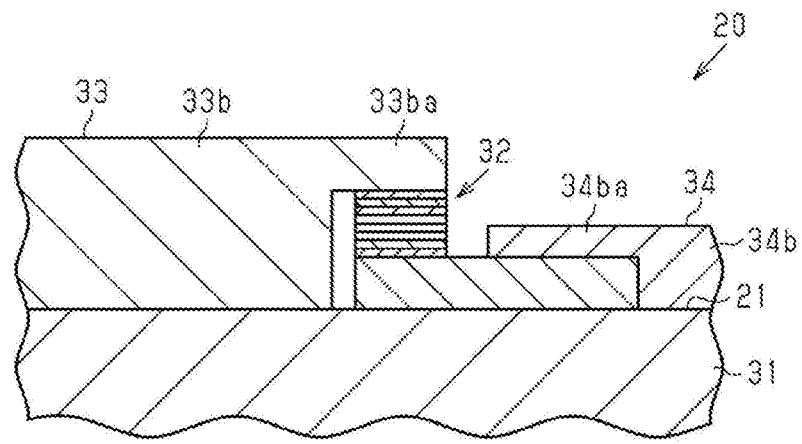
FIG. 5 is an end view schematically showing an active element and its periphery.
Figure 6:
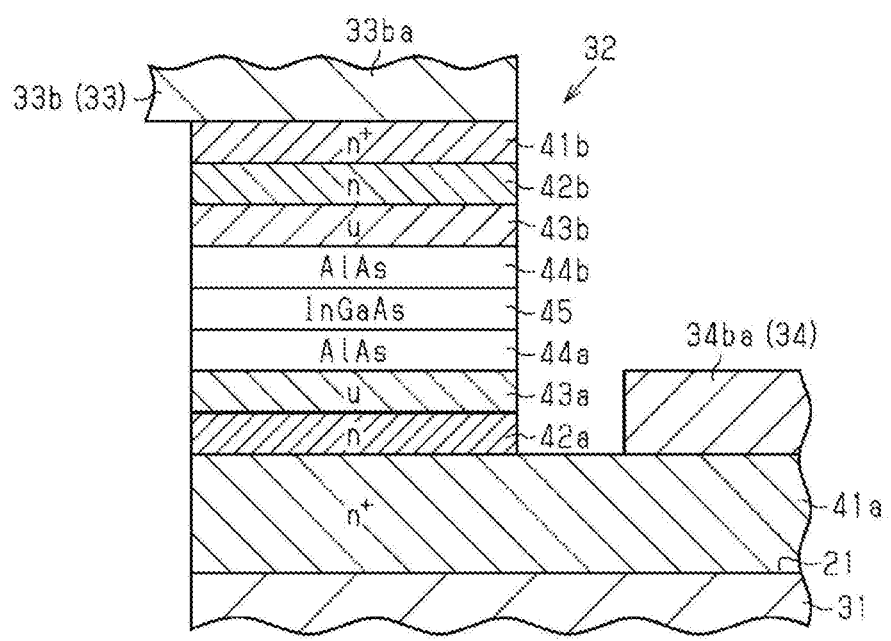
FIG. 6 is a partial enlarged view of FIG. 5.
Figure 7:
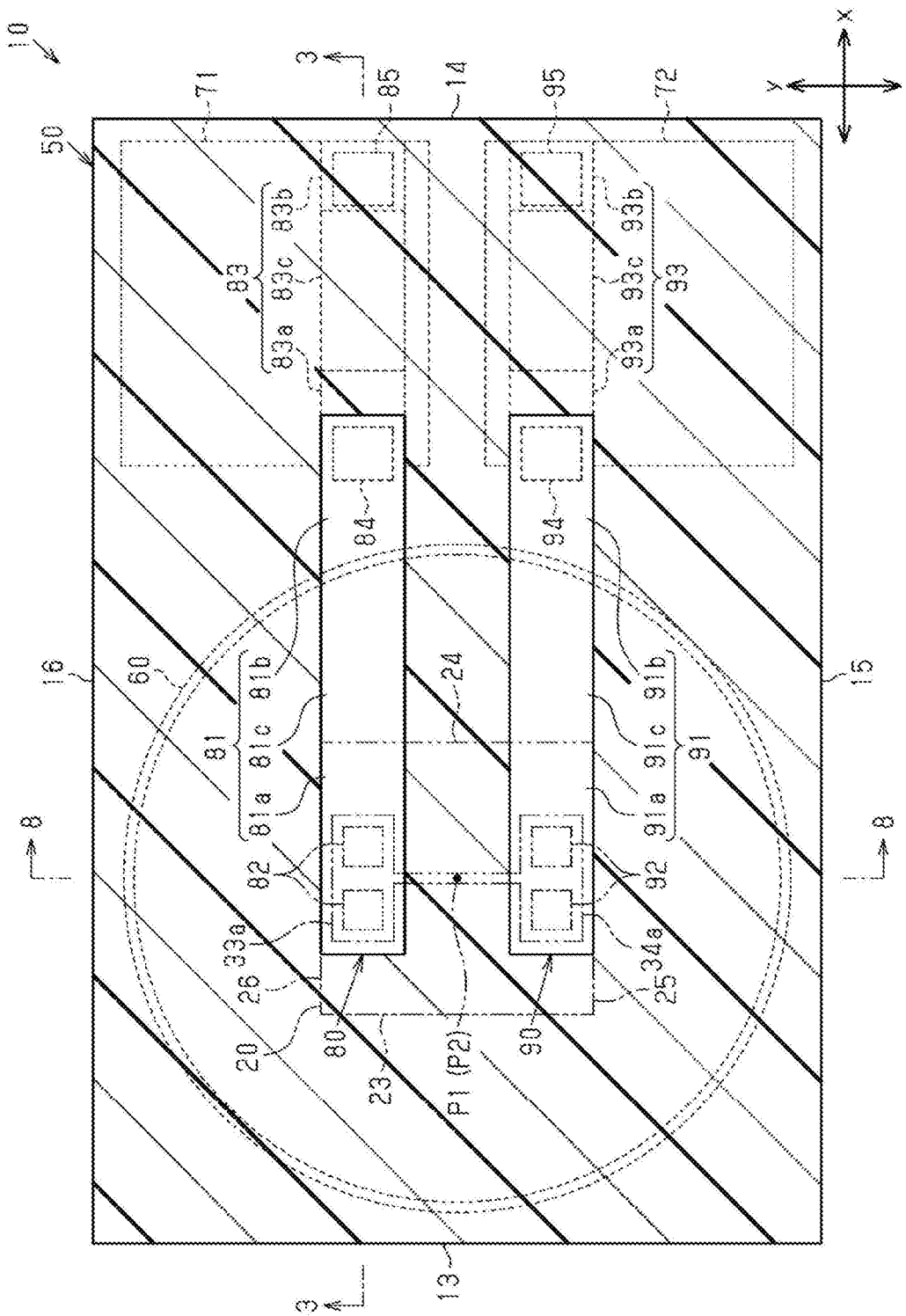
FIG. 7 is a cross-sectional view taken along line 7-7 in FIG. 3.
Figure 8:
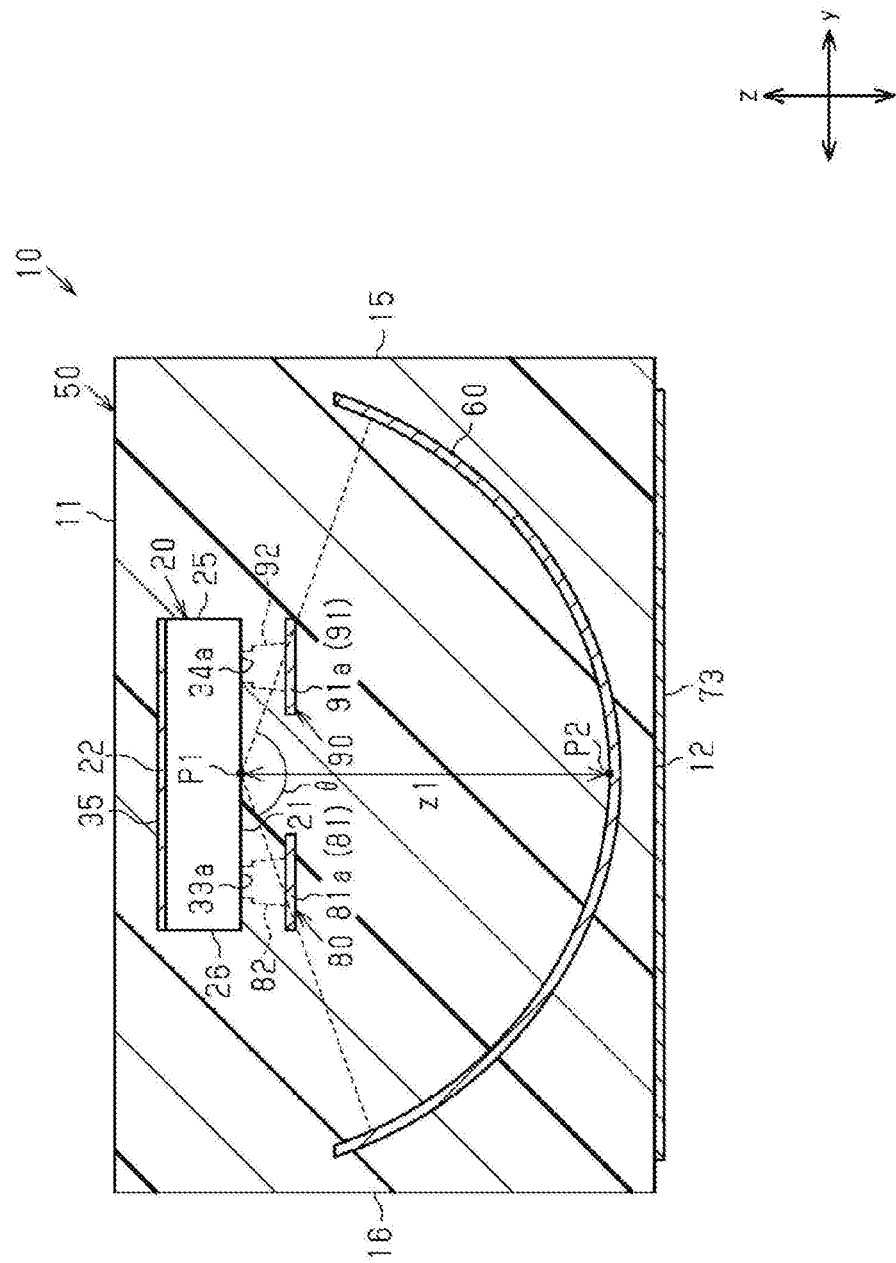
FIG. 8 is a cross-sectional view taken along line 8-8 in FIG. 7.
Figure 9:
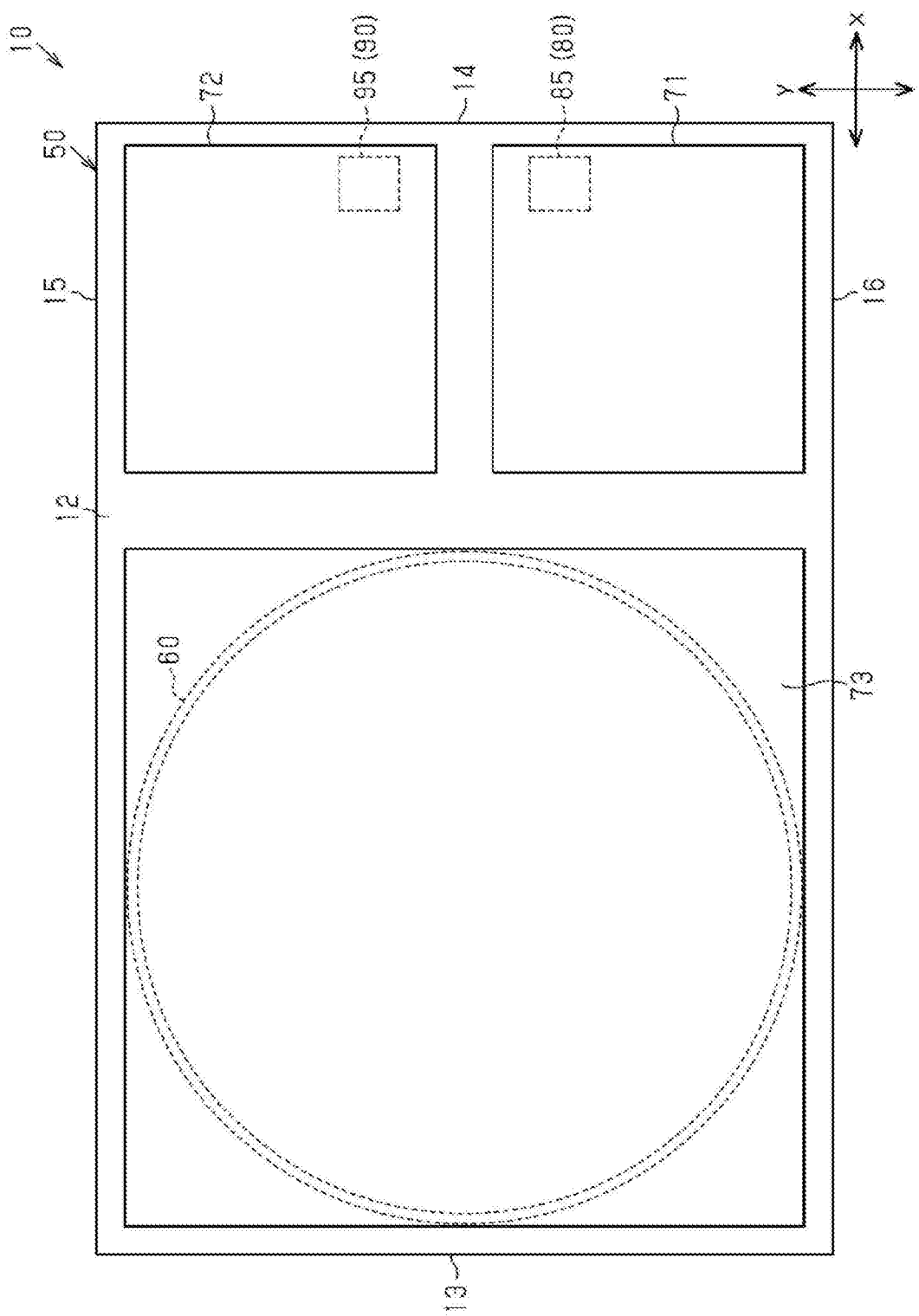
FIG. 9 is a bottom view of the terahertz device.

FIGS. 1 to 9 show a terahertz device 10 according to a first embodiment of the present disclosure. More specifically, FIGS. 1 and 2 are perspective views of the terahertz device 10. FIG. 3 is an end view for explaining a cross-sectional structure of the terahertz device and corresponds to an end view taken along line 3-3 in FIG. 7. FIG. 4 is a front view of a terahertz element, FIG. 5 is an end view schematically showing an active element and its periphery, and FIG. 6 is a partial enlarged view of FIG. 5. FIG. 7 is a cross-sectional view taken along line 7-7 in FIG. 3, and FIG. 8 is a cross-sectional view taken along line 8-8 in FIG. 7. FIG. 9 is a bottom view of the terahertz device. For the sake of convenience of illustration, hatching for conductive portions 80 and 90 is omitted in FIG. 7.

As shown in FIGS. 1 and 2, the terahertz device 10 of the present embodiment is formed in a rectangular parallelepiped shape as a whole. The terahertz device 10 includes a device main surface 11, a device back surface 12 which is a surface opposite to the device main surface 11, and four device side surfaces 13 to 16. The device main surface 11 is a rectangle having a longitudinal direction and a lateral direction orthogonal to each other. The terahertz device 10 of the present embodiment outputs (i.e., irradiates) an electromagnetic wave from the device main surface 11.

For the sake of convenience of explanation, in the present embodiment, the longitudinal direction of the device main surface 11 is denoted as an x direction, and the lateral direction of the device main surface 11 is denoted as a y direction. A direction orthogonal to both the x direction and the y direction is denoted as a z direction. The z direction may be said to be the height direction of the terahertz device 10.

The device main surface 11 and the device back surface 12 are surfaces intersecting with the z direction and are orthogonal to the z direction in the present embodiment. It can be said that the device main surface 11 and the device back surface 12 are both end faces in the height direction of the terahertz device 10.

For the sake of convenience of description, the direction from the device back surface 12 to the device main surface 11 in the z direction is referred to as "upper side." It can be said that the upper side is a direction orthogonal to the device main surface 11 and a direction going away from the device main surface 11. The terahertz device 10 of the present embodiment outputs an electromagnetic wave to the upper side.

The first device side surface 13 and the second device side surface 14 are both end surfaces of the terahertz device 10 in the x direction and intersect with the x direction. The first device side surface 13 and the second device side surface 14 of the present embodiment are orthogonal to the x direction and extend along the y direction and the z direction.

The third device side surface 15 and the fourth device side surface 16 are both end surfaces of the terahertz device 10 in the y direction and intersect with they direction. The third device side surface 15 and the fourth device side surface 16 of the present embodiment are orthogonal to the y direction and extend along the x direction and the z direction.

The terahertz device 10 includes a terahertz element 20, an encapsulating material 50, and a reflection film 60 encapsulated by the encapsulating material 50. The terahertz element 20 is an element that performs conversion between an electromagnetic wave in a terahertz band and electric energy. The electromagnetic wave includes the concept of one or both of light and a radio wave. The terahertz element 20 is oscillated to convert the inputted electric energy into an electromagnetic wave in a terahertz band. Thus, the terahertz element 20 generates an electromagnetic wave (i.e., a terahertz wave). The frequency (oscillation frequency) of the electromagnetic wave generated by the terahertz element 20 is, for example, 0.1 Thz to 10 Thz.

As shown in FIGS. 3 and 4, the terahertz element 20 has a plate shape having a thickness direction extending in the z direction and has a rectangular plate shape as a whole in the present embodiment. In the present embodiment, the terahertz element 20 has a square shape when viewed in the z direction (hereinafter also referred to as "in a plan view"). The plan view shape of the terahertz element 20 is not limited to the square shape, and may be a rectangular shape, a circular shape, an elliptical shape, or a polygonal shape.

Additionally, when considering that the z direction and the thickness direction of the terahertz element 20 coincide with each other, the expression "when viewed in the z direction" may be said to be "when viewed in the thickness direction of the terahertz element 20." Furthermore, when considering that the terahertz device 10 of the present embodiment outputs an electromagnetic wave toward the upper side, the expression "when viewed in the z direction" may be said to be "when viewed in the output direction of the electromagnetic wave" or "when viewed from the upper side."

The element thickness D1, which is the dimension of the terahertz element 20 in the z direction set based on, for example, the frequency of the oscillating electromagnetic wave. As an example, the element thickness D1 may become smaller as the frequency of the electromagnetic wave becomes higher, and may become larger as the frequency of the electromagnetic wave becomes lower.

The terahertz element 20 includes an element main surface 21 and an element back surface 22 which are surfaces that intersect with the thickness direction of the terahertz element 20. The element main surface 21 and the element back surface 22 are surfaces intersecting with the z direction and are orthogonal to the z direction in the present embodiment. Therefore, the z direction may be said to be a direction orthogonal to the element main surface 21.

The element main surface 21 and the element back surface 22 have a rectangular shape, for example, a square shape when viewed in the z direction. However, the shapes of the element main surface 21 and the element back surface 22 are not limited thereto and may be arbitrary. As shown in FIG. 3, the terahertz element 20 of the present embodiment is arranged in a state in which the element back surface 22 faces upward (i.e., the element main surface 21 faces downward). The element main surface 21 is arranged closer to the device back surface 12 than the element back surface 22, and the element back surface 22 is arranged closer to the device main surface 11 than the element main surface 21.

The terahertz element 20 includes a first element side surface 23 and a second element side surface 24 which are both end surfaces in the x direction, and a third element side surface 25 and a fourth element side surface 26 which are both end surfaces in the y direction. The first element side surface 23 and the second element side surface 24 are surfaces intersecting with the x direction, and are orthogonal to the x direction in the present embodiment. The third element side surface 25 and the fourth element side surface 26 are surfaces intersecting with the y direction, and are orthogonal to the y direction in the present embodiment. The first element side surface 23 and the second element side surface 24 are orthogonal to the third element side surface 25 and the fourth element side surface 26.

As shown in FIG. 4, the terahertz element 20 has an oscillation point P1 that oscillates an electromagnetic wave. In the present embodiment, the oscillation point P1 is a point (i.e., a region) where an electromagnetic wave is generated. The oscillation point P1 is formed on the element main surface 21. The element main surface 21 having the oscillation point P1 thereon constitutes an active surface that oscillates an electromagnetic wave. It can be said that the z direction (i.e., the thickness direction of the terahertz element 20 or the height direction of the terahertz device 10) is a direction orthogonal to the surface on which the oscillation point P1 is provided.

The oscillation point P1 of the present embodiment is arranged at the center of the element main surface 21. In the present embodiment, an electromagnetic wave is radially emitted from the oscillation point P1 in the x direction, the y direction, and the z direction. However, the position of the oscillation point P1 is not limited to the center of the element main surface 21 and is arbitrary.

In the present embodiment, the first vertical distance x1 between the first element side surface 23 (or the second element side surface 24) and the oscillation point P1 may be, for example, $(\lambda'_{Inp}/2)+(\lambda'_{Inp}/2)\times N$ (where N is an integer of 0 or more: N=0, 1, 2, . . . ).

Here, $\lambda'_{Inp}$ is the effective wavelength of the electromagnetic wave propagating inside the terahertz element 20.

When the element refractive index, which is the refractive index of the terahertz element 20, is assumed to be n1, the speed of light is assumed to be c, and the central frequency of the electromagnetic wave is assumed to be fc, $\lambda'_{Inp}$ is $(1/n1) \times (c/fc)$. It can be said that fc is the target frequency of the terahertz element 20. Furthermore, fc may be the frequency having the highest output in the electromagnetic waves generated from the terahertz element 20.

Although details will be described later, the element refractive index n1 is higher than the encapsulating refractive index n2, which is the refractive index of the encapsulating material 50 that surrounds the terahertz element 20. Therefore, the electromagnetic wave oscillated from the terahertz element 20 is free-end-reflected by the first element side surface 23. Therefore, by setting the first vertical distance x1 as described above, the terahertz element 20 is designed as a resonator (primary resonator) in the terahertz device 10.

Similarly, the second vertical distance y1 between the third element side surface 25 (or the fourth element side surface 26) and the oscillation point P1 may be, for example, $(\lambda'_{Inp}/2)+(\lambda'_{Inp}/2) \times N)$ (where N is an integer of 0 or more: N=0, 1, 2, ... ).

The vertical distances x1 and y1 may be different values for the element side surfaces 23, 24, 25, and 26 as long as they are values calculated by the above calculation formula. For example, the first vertical distance x1 between the first element side surface 23 and the oscillation point P1 may be different from the first vertical distance between the second element side surface 24 and the oscillation point P1. Similarly, the second vertical distance y1 between the third element side surface 25 and the oscillation point P1 may be different from the second vertical distance between the fourth element side surface 26 and the oscillation point P1.

As shown in FIGS. 5 and 6, the terahertz element 20 includes an element substrate 31, an active element 32, a first element conductive layer 33, and a second element conductive layer 34. The element substrate 31 is made of a semiconductor and has a semi-insulating property. The semiconductor constituting the element substrate 31 is, for example, InP (indium phosphide).

The element refractive index n1 is the refractive index (absolute refractive index) of the element substrate 31. When the element substrate 31 is InP, the element refractive index n1 is about 3.4. In the present embodiment, the element substrate 31 has a rectangular plate shape, for example, a square shape in a plan view. The element main surface 21 and the element back surface 22 are the main surface and the back surface of the element substrate 31, and the element side surfaces 23 to 26 are the side surfaces of the element substrate 31.

The active element 32 performs conversion between the terahertz band electromagnetic wave and the electrical energy. The active element 32 is formed on the element substrate 31. In the present embodiment, the active element 32 is provided at the center of the element main surface 21. It can be said that the oscillation point P1 is the position at which the active element 32 is provided.

The active element 32 is typically a resonant tunneling diode (RTD). However, the active element 32 is not limited thereto. The active element 32 may be, for example, a tunnel injection transit time (TUNNETT) diode, an impact ionization avalanche transit time (IMPATT) diode, a GaAs field effect transistor (FET), a GaN-based FET, a high electron mobility transistor (HEMT), or a hetero junction bipolar transistor (HBT).

An example for realizing the active element 32 will be described. A semiconductor layer 41a is formed on the element substrate 31. The semiconductor layer 41a is made of, for example, GaInAs. The semiconductor layer 41a is doped with an n-type impurity at a high concentration.

A GaInAs layer 42a is stacked on the semiconductor layer 41a. The GaInAs layer 42a is doped with an n-type impurity. For example, the impurity concentration of the GaInAs layer 42a is lower than the impurity concentration of the semiconductor layer 41a.

A GaInAs layer 43a is stacked on the GaInAs layer 42a. The GaInAs layer 43a is not doped with an impurity. An AlAs layer 44a is stacked on the GaInAs layer 43a, an InGaAs layer 45 is stacked on the AlAs layer 44a, and an AlAs layer 44b is stacked on the InGaAs layer 45. An RTD portion is composed of the AlAs layer 44a, the InGaAs layer 45, and the AlAs layer 44b.

A GaInAs layer 43b, which is not doped with an impurity, is stacked on the AlAs layer 44b. A GaInAs layer 42b doped with an n-type impurity is stacked on the GaInAs layer 43b. A GaInAs layer 41b is stacked on the GaInAs layer 42b. The GaInAs layer 41b is heavily doped with an n-type impurity. For example, the impurity concentration of the GaInAs layer 41b is higher than the impurity concentration of the GaInAs layer 42b.

The specific configuration of the active element 32 is arbitrary as long as it can generate (or receive, and generate or receive) an electromagnetic wave. In other words, it can be said that the active element 32 may be any element as long as it can oscillate with respect to an electromagnetic wave in a terahertz band.

As shown in FIG. 3, an element reflection layer 35 that reflects an electromagnetic wave is formed on the element back surface 22 of the present embodiment. The electromagnetic wave emitted upward from the oscillation point P1 (active element 32) is reflected by the element reflection layer 35 to be directed downward.

Here, the element thickness D1 may be set so that the resonance condition of the electromagnetic wave is satisfied. Specifically, in the present embodiment in which the element reflection layer 35 is formed, the electromagnetic wave is fixed-end-reflected at the interface between the element back surface 22 and the element reflection layer 35. Therefore, the phase is deviated by 7E. Considering this point, the element thickness D1 of the present embodiment may be set to $(\lambda'_{InP}/4)+(\lambda'_{InP}/2) \times N$ (where N is an integer of 0 or more: N=0, 1, 2, ... ). By setting the element thickness D1 as described above, the standing wave can be excited inside the terahertz element 20.

When the element reflection layer 35 is not formed, the element thickness D1 may be set to $(\lambda'_{InP}/2)+(\lambda_{InP}/2) \times N$ (where N is an integer of 0 or more: N=0, 1, 2, ... ). However, the element thickness D1 is not limited to the above and is arbitrary.

As shown in FIG. 4, each of the first element conductive layer 33 and the second element conductive layer 34 is formed on the element main surface 21. Each of the first element conductive layer 33 and the second element conductive layer 34 has a stacked structure of metal. The stacked structure of each of the first element conductive layer 33 and the second element conductive layer 34 is, for example, a structure in which Au (gold), Pd (palladium), and Ti (titanium) are stacked. Alternatively, the stacked structure of each of the first element conductive layer 33 and the second element conductive layer 34 is a structure in which Au and Ti are stacked. Both the first element conductive layer 33 and the second element conductive layer 34 are formed by a vacuum deposition method, a sputtering method, or the like.

The element conductive layers 33 and 34 include pads 33a and 34a, which are opposed to each other and spaced apart in a predetermined direction (the y direction in the present embodiment) with the oscillation point P1 (active element 32) interposed therebetween, and element conducting portions 33b and 34b extending from the pads 33a and 34a toward the active element 32.

The pads 33a and 34a extend, for example, in a direction orthogonal to the opposing direction of the pads 33a and 34a (the x direction in the present embodiment). The pads 33a and 34a have, for example, a shape having a longitudinal direction and a lateral direction when viewed in the z direction. Specifically, the pads 33a and 34a have a rectangular shape whose longitudinal direction is the x direction and whose lateral direction is the y direction.

The pads 33a and 34a are arranged at positions that do not overlap with the oscillation point P1 when viewed in the z direction. For example, the pads 33a and 34a are arranged on both sides of the oscillation point P1 (i.e., the active element 32) in the y direction and are arranged closer to the element side surfaces 25 and 26 than the oscillation point P1 in the present embodiment.

The element conducting portions 33b and 34b have, for example, an elongated shape extending in the y direction, and the length of the element conducting portions 33b and 34b in the x direction is shorter than the length of the pads 33a and 34a in the x direction. As shown in FIG. 6, the tip portions 33ba and 34ba of the element conducting portions 33b and 34b overlap with the active element 32 when viewed in the z direction, and are electrically connected to the active element 32. Specifically, the tip portion 33ba of the first element conducting portion 33b is located on the GaInAs layer 41b and is in contact with the GaInAs layer 41b.

In addition, the semiconductor layer 41a extends in the y direction toward the second pad 34a more than other layers such as the GaInAs layer 42a and the like. The tip portion 34ba of the second element conducting portion 34b is stacked on a portion of the semiconductor layer 41a where the GaInAs layer 42a and the like are not stacked. As a result, the active element 32 is electrically connected to both element conductive layers 33 and 34 (i.e., both pads 33a and 34a). The second element conducting portion 34b and other layers such as the GaInAs layer 42a and the like are spaced apart in the y direction.

Although not shown, unlike FIG. 6, a GaInAs layer doped with an n-type impurity at a high concentration may be interposed between the GaInAs layer 41b and the tip portion 33ba of the first element conducting portion 33b. Thus, it is possible to improve the contact between the first element conductive layer 33 and the GaInAs layer 41b.

Next, the encapsulating material 50 will be described. As shown in FIGS. 1 and 2, the encapsulating material 50 has a rectangular parallelepiped shape. For example, the encapsulating material 50 has a rectangular parallelepiped shape whose longitudinal direction is the x direction, whose lateral direction is the y direction and whose height direction is the z direction. The encapsulating material 50 constitutes the outer shell of the terahertz device 10. In the present embodiment, the main surface of the encapsulating material 50 constitutes the device main surface 11, and the back surface of the encapsulating material 50 constitutes the device back surface 12. The respective side surfaces of the encapsulating material 50 constitute the device side surfaces 13 to 16.

The encapsulating material 50 is made of, for example, a dielectric material that is a material through which the electromagnetic wave generated from the terahertz element 20 is transmitted. In the present embodiment, the encapsulating material 50 is made of a resin material, for example, an epoxy resin (e.g., a glass epoxy resin). The encapsulating material 50 has an insulating property and a heat transfer property. The color of the encapsulating material 50 is an arbitrary color such as black or the like.

The encapsulating refractive index n2, which is the refractive index (absolute refractive index) of the encapsulating material 50, is lower than the element refractive index n1. For example, the encapsulating refractive index n2 is 1.55. The encapsulating material 50 may have a single-layer structure or a multi-layer structure. That is, one or more interfaces may be formed in the encapsulating material 50.

As shown in FIG. 3, the encapsulating material 50 encapsulates the terahertz element 20 and surrounds the terahertz element 20. In the present embodiment, the encapsulating material 50 surrounds the entire terahertz element 20 and covers the element main surface 21, the element back surface 22, and the element side surfaces 23 to 26 of the terahertz element 20.

The element main surface 21, the element back surface 22, and the element side surfaces 23 to 26 of the terahertz element 20 are in contact with the encapsulating material 50. That is, the encapsulating material 50 of the present embodiment surrounds the terahertz element 20 so that no gap is created between the encapsulating material 50 and the terahertz element 20.

As shown in FIG. 3, the terahertz element 20 is provided in the encapsulating material 50 in a state in which the element main surface 21 faces the device back surface 12. The terahertz element 20 is arranged between the device main surface 11 and the device back surface 12. In the present embodiment, the terahertz element 20 is arranged so as to be closer to the device main surface 11 than to the device back surface 12.

Next, the reflection film 60 will be described. The reflection film 60 reflects the electromagnetic wave generated by the terahertz element 20 in one direction. The reflection film 60 is formed of a material that reflects the electromagnetic wave generated by the terahertz element 20, and is formed of, for example, a metal such as Cu or the like, or an alloy. The reflection film 60 may have a single-layer structure or a multi-layer structure.

As shown in FIGS. 3, 7, and 8, the reflection film 60 has an antenna shape. As an example, the reflection film 60 has a parabolic antenna shape. That is, the reflection film 60 is a rotational parabolic mirror and is curved in mortar-shape. The reflection film 60 has a circular shape when viewed in the z direction. The reflection film 60 is curved so as to be convex toward the device back surface 12. The reflection film 60 is opened in one direction (to the upper side in the present embodiment).

The reflection film 60 is encapsulated by the encapsulating material 50 in a state in which the reflection film 60 is arranged at a position facing the terahertz element 20 in the z direction. In the present embodiment, the terahertz element 20 is arranged so as to biased closer to the device main surface 11 than to the device back surface 12, and the reflection film 60 is arranged closer to the device back surface 12 than to the terahertz element 20. That is, the reflection film 60 is disposed between the terahertz element 20 and the device back surface 12.

The terahertz element 20 is arranged inside the encapsulating material 50 with the element main surface 21 facing the reflection film 60. The reflection film 60 is arranged not on the element back surface 22 but on the element main surface 21 on which the oscillation point P1 exists. The reflection film 60 faces the terahertz element 20 (the element main surface 21 in the present embodiment). In other words, the terahertz element 20 and the reflection film 60 are encapsulated by the encapsulating material 50 with the element main surface 21 and the reflection film 60 facing each other in the z direction. As a result, the relative position between the terahertz element 20 and the reflection film 60 is fixed, and a misalignment between the terahertz element 20 and the reflection film 60 is less likely to occur. Considering the positional relationship between the pads 33a and 34a and the reflection film 60, it can be said that the pads 33a and 34a face the reflection film 60.

In the present embodiment, the space between the terahertz element 20 and the reflection film 60 is filled with the encapsulating material 50. Therefore, the electromagnetic wave generated at the terahertz element 20 (specifically, the oscillation point P1) propagates toward the reflection film 60 through the encapsulating material 50.

The reflection film 60 is arranged, for example, so that the focal point of the reflection film 60 is at the oscillation point P1. As shown in FIG. 8, in the present embodiment, the center point P2 of the reflection film 60 and the oscillation point P1 coincide with each other when viewed in the z direction. In the present embodiment, the center point P2 is the center of the circular reflection film 60 viewed in the z direction.

If the vertical distance from the oscillation point P1 to the reflection film 60 is denoted as z1, the coordinate of the reflection film 60 in the z direction is denoted as Z, and the position of the reflection film 60 in the y direction is denoted as Y, then the reflection film 60 may be curved so as to satisfy the condition of $Y=(1/(4z1))Y^2$. Y is "0" at the center point P2. This applies to the position of the reflection film 60 in the x direction.

The z direction may also be said to be the opposing direction of the reflection film 60 and the terahertz element 20 (the element main surface 21). Furthermore, the z direction may be said to be the opposing direction of the center point P2 of the reflection film 60 and the oscillation point P1, and the specified distance z1 may be said to be the distance between the oscillation point P1 and the center point P2.

Further, the reflection film 60 may be arranged at a position corresponding to the frequency of the electromagnetic wave so that the electromagnetic wave generated from the terahertz element 20 resonates. Specifically, the specified distance z1 may be set so as to satisfy the resonance condition of the electromagnetic wave generated from the terahertz element 20. For example, the specified distance z1 may be $(\lambda'_A/4)+(\lambda'_A/2)\times N$ (where N is an integer of 0 or more: N=0, 1, 2, . . . ). $\lambda'_A$ is an effective wavelength of the electromagnetic wave propagating through the encapsulating material 50, and is, for example, $(1/n2)(c/fc)$ (where c is a speed of light, and fc is a central frequency of oscillation).

That is, the reflection film 60 may be curved so that the oscillation point P1 is located at the focal point of the reflection film 60 while the specified distance z1 satisfies the resonance condition. However, the present disclosure is not limited thereto. The focal point of the reflection film 60 and the oscillation point P1 may deviate from each other while the specified distance z1 satisfies the resonance condition, or vice versa. The curved form of the reflection film 60 is arbitrary. Furthermore, the specified distance z1 is arbitrary, and the resonance condition may not be satisfied.

The reflection film 60 is formed to be larger than the terahertz element 20 when viewed in the z direction. Specifically, the reflection film 60 is formed to be larger than the terahertz element 20 in both the x direction and they direction. If the distance from one end to the other end of the reflection film 60 in the x direction or the y direction when viewed in the z direction is defined as the opening width of the reflection film 60, the opening width of the reflection film 60 is set to be larger than both the x direction length of the terahertz element 20 and they direction length of the terahertz element 20.

In the present embodiment, the reflection film 60 reflects the electromagnetic wave generated from the terahertz element 20 and propagating in the encapsulating material 50 in the z direction (specifically, to the upper side). In other words, it can be said that the reflection film 60 guides the electromagnetic wave generated at the oscillation point P1 and propagating in the encapsulating material 50 in one direction.

As shown in FIG. 8, the terahertz element 20 may radiate an electromagnetic wave radially from the oscillation point P1 over a range of an opening angle θ. That is, the electromagnetic wave generated from the terahertz element 20 may have directivity. The opening angle θ is, for example, 120° to 180°. However, the opening angle θ is not limited thereto and may be arbitrarily changed.

In this configuration, the reflection film 60 may be formed, for example, over an angular range of the opening angle θ or more with respect to the oscillation point P1. As a result, it is possible to reduce the electromagnetic wave which is not reflected by the reflection film 60. This makes it possible to improve gain.

As shown in FIGS. 7 to 9, the terahertz device 10 includes electrodes 71 and 72 used for electrical connection to the outside and conductive portions 80 and 90 provided inside the encapsulating material 50 and electrically connected to the terahertz element 20.

As shown in FIG. 9, the electrodes 71 and 72 of the present embodiment are formed on the device back surface 12. Specifically, the electrodes 71 and 72 are arranged so as to be biased to one of both ends of the device back surface 12 in the x direction. For example, the electrodes 71 and 72 are arranged at positions that do not overlap with the terahertz element 20 and the reflection film 60 when viewed in the z direction.

More specifically, as shown in FIG. 3, the terahertz element 20 and the reflection film 60 are arranged closer to the first device side surface 13 than to the central portion of the encapsulating material 50 in the x direction. Thus, the electrodes 71 and 72 are arranged near one of both ends of the device back surface 12 in the x direction, which is located on the end of the second device side surface 14 side opposite to the end of the first device side surface 13 side. Therefore, when viewed in the z direction, the terahertz element 20 and the electrodes 71 and 72 are arranged so as to be spaced apart from each other in the x direction.

The electrodes 71 and 72 are arranged so as to be spaced apart from each other in the y direction. The electrodes 71 and 72 are insulated from each other. The electrodes 71 and 72 of the present embodiment have a rectangular shape. However, the present disclosure is not limited thereto. The shape and size of the electrodes 71 and 72 are arbitrary.

The electrodes 71 and 72 have a stacked structure including, for example, a Ni layer and an Au layer. However, the present disclosure is not limited thereto. The configuration of the electrodes 71 and 72 can be arbitrarily changed. In one example, the electrodes 71 and 72 may have a configuration including a Pd layer or a configuration including a Sn layer.

As shown in FIG. 3, the conductive portions 80 and 90 are provided inside the encapsulating material 50. That is, the encapsulating material 50 encapsulates the terahertz element 20 and the reflection film 60 for each of the conductive portions 80 and 90.

Here, the conductive portions 80 and 90 and the reflection film 60 are encapsulated by the encapsulating material 50 in a state in which they are spaced apart from each other. For this reason, the encapsulating material 50 is interposed between the conductive portions 80 and 90 and the reflection film 60. As a result, the conductive portions 80 and 90 and the reflection film 60 are not electrically connected. That is, the encapsulating material 50 functions to insulate the conductive portions 80 and 90 from the reflection film 60.

The reflection film 60 is not in contact with both the conductive portions 80 and 90 and the terahertz element 20 which are encapsulated by the encapsulating material 50. That is, the reflection film 60 is in an electrically floating state. It can be said that the encapsulating material 50 covers the reflection film 60 in order to bring the reflection film 60 into an electrically floating state.

As shown in FIG. 7, the conductive portions 80 and 90 extend in the x direction as a whole when viewed in the z direction. The first conductive portion 80 extends in the x direction so as to overlap with both the terahertz element 20 and the first electrode 71 when viewed in the z direction, and the second conductive portion 90 extends in the x direction so as to overlap with both the terahertz element 20 and the second electrode 72 when viewed in the z direction. In the present embodiment, the x direction corresponds to a "first direction," and the y direction corresponds to a "second direction."

In the present embodiment, the conductive portions 80 and 90 are arranged side by side so as to be spaced apart in the y direction. More specifically, as already described, the pads 33a and 34a are arranged to face each other in they direction with the oscillation point P1 interposed therebetween, and the electrodes 71 and 72 are arranged side by side in the y direction. Thus, the conductive portions 80 and 90 are arranged so as to be spaced apart in the y direction so that they face the pads 33a and 34a and the electrodes 71 and 72. Since the encapsulating material 50 is interposed between the conductive portions 80 and 90, the conductive portions 80 and 90 are insulated from each other. The terahertz element 20 is flip-chip mounted on both conductive portions 80 and 90. It can be said that the conductive portions 80 and 90 extend in the same direction (x direction) from the terahertz element 20 toward the electrodes 71 and 72 when viewed in the z direction.

As shown in FIG. 3, the first conductive portion 80 electrically connects the terahertz element 20 and the first electrode 71. The first conductive portion 80 includes a first element-side conductive portion 81, a first electrode-side conductive portion 83, a first element-side joining portion 84, and a first electrode-side joining portion 85.

The first element-side conductive portion 81 has a thin film shape whose thickness direction is the z direction, and extends in the x direction with the width direction thereof being the y direction. In the present embodiment, the width of the first element-side conductive portion 81 is constant.

A portion of the first element-side conductive portion 81 faces the reflection film 60 in the z direction. That is, when viewed in the z direction, a portion of the first element-side conductive portion 81 overlaps with the reflection film 60. However, in the z direction, the first element-side conductive portion 81 is arranged at a height position between the terahertz element 20 and the reflection film 60. Therefore, the first element-side conductive portion 81 and the reflection film 60 are not in contact with each other.

As shown in FIGS. 3 and 7, the first element-side conductive portion 81 includes a first element facing portion 81a facing the first pad 33a in the z direction, a first protruding portion 81b protruding from the reflection film 60 in the x direction when viewed in the z direction, and a first connection portion 81c for connecting the first element facing portion 81a and the first protruding portion 81b.

The first element facing portion 81a is provided between the terahertz element 20 and the reflection film 60, and is formed so that at least a portion thereof overlaps with the first pad 33a when viewed in the z direction. The first element facing portion 81a faces the reflection film 60 in the z direction. As the first pad 33a extends in the x direction, the first element facing portion 81a extends in the x direction. For example, the first element facing portion 81a is formed in a rectangular shape whose longitudinal direction is the x direction and whose lateral direction is the y direction.

As shown in FIG. 3, the first conductive portion 80 includes a first bump 82 provided between the first element facing portion 81a and the first pad 33a. The terahertz element 20 is flip-chip mounted on the first element facing portion 81a via the first bump 82. The first pad 33a and the first element facing portion 81a are electrically connected by the first bump 82.

In this embodiment, a plurality of first bumps 82 is provided. For example, as the first pad 33a and the first element facing portions 81a extend in the x direction, a plurality of (two, in the present embodiment) first bumps 82 is arranged in the x direction. That is, it can be said that the first bumps 82 are arranged in the longitudinal direction of the first pad 33a and the first element facing portion 81a.

The first element facing portion 81a and the first bump 82 are arranged at positions that do not overlap with the oscillation point P1 when viewed in the z direction. The shape of the first bump 82 is, for example, a quadrangular prism shape. However, the shape of the first bump 82 is not limited thereto and may be arbitrarily changed.

The first bump 82 may have a single-layer structure or a multiple-layer structure. As an example, the first bump 82 may have a stacked structure of a metal layer containing Cu, a metal layer containing Ti, and an alloy layer containing Sn. The alloy layer containing Sn is, for example, a Sn—Sb alloy layer or a Sn—Ag alloy layer.

A first insulating layer that surrounds the first bump 82 may be formed on the first element facing portion 81a. The first insulating layer may be formed in a frame shape having an upper opening, and the first bump 82 may be accommodated in the first insulating layer. As a result, it is possible to prevent the first bump 82 from sagging laterally. However, the first insulating layer is not essential.

As shown in FIG. 7, in the present embodiment, the first element-side conductive portion 81 has a constant width. Therefore, the width of the first element facing portion 81a, the width of the first protruding portion 81b, and the width of the first connection portion 81c are constant.

As shown in FIG. 3, the first electrode-side conductive portion 83 is arranged inside the encapsulating material 50 at a position where the first electrode-side conductive portion 83 does not overlap with the terahertz element 20 and the reflection film 60 when viewed in the z direction. The first electrode-side conductive portion 83 has a thin film shape whose thickness direction is the z direction, and extends in the x direction with the width direction thereof being the y direction when viewed in the z direction.

The first electrode-side conductive portion 83 has a crank shape bent in the z direction. Specifically, the first electrode-side conductive portion 83 includes a first flat portion 83a facing the first protruding portion 81b in the z direction, a second flat portion 83b arranged closer to the device back surface 12 and the second device side surface 14 than to the first flat portion 83a and configured to face the first electrode 71, and an inclined portion 83c for connecting the flat portions 83a and 83b. The first flat portion 83a and the second flat portion 83b are arranged so as to be deviated in both the x direction and the z direction. The second flat portion 83b is provided at a position farther from the reflection film 60 than the first flat portion 83a. The inclined portion 83c is inclined so as to gradually approach the device back surface 12 from the first flat portion 83a toward the second flat portion 83b.

The first element-side joining portion 84 is provided between the first protruding portion 81b and the first flat portion 83a to join the first protruding portion 81b and the first flat portion 83a. The first element-side conductive portion 81 and the first electrode-side conductive portion 83 are electrically connected by the first element-side joining portion 84. The specific shape of the first element-side joining portion 84 may be arbitrarily changed. For example, the first element-side joining portion 84 may have a columnar shape whose height direction is the z direction.

The first electrode-side joining portion 85 is provided between the second flat portion 83b and the first electrode 71 to join the second flat portion 83b and the first electrode 71. The first electrode-side conductive portion 83 and the first electrode 71 are electrically connected by the first electrode-side joining portion 85. The specific shape of the first electrode-side joining portion 85 may be arbitrarily changed. For example, the first electrode-side joining portion 85 may have a columnar shape whose height direction is the z direction.

According to this configuration, the first pad 33a of the terahertz element 20 is electrically connected to the first electrode 71 via the first bump 82, the first element-side conductive portion 81, the first element-side joining portion 84, the first electrode-side conductive portion 83, and the first electrode-side joining portion 85.

As shown in FIG. 7, the second conductive portion 90 electrically connects the terahertz element 20 and the second electrode 72. The second conductive portion 90 includes a second element-side conductive portion 91, a second electrode-side conductive portion 93, a second element-side joining portion 94, and a second electrode-side joining portion 95.

In the present embodiment, the first element-side conductive portion 81 and the second element-side conductive portion 91 are arranged side by side in the y direction, and the first electrode-side conductive portion 83 and the second electrode-side conductive portion 93 are arranged side by side in they direction. The first element-side joining portion 84 and the second element-side joining portion 94 are arranged side by side in they direction, and the first electrode-side joining portion 85 and the second electrode-side joining portion 95 are arranged side by side in the y direction.

The second element-side conductive portion 91 has a thin film shape whose thickness direction is the z direction, and extends in the x direction with the width direction thereof being they direction. In the present embodiment, the width of the second element-side conductive portion 91 is constant.

A portion of the second element-side conductive portion 91 faces the reflection film 60 in the z direction. That is, when viewed in the z direction, a portion of the second element-side conductive portion 91 overlaps with the reflection film 60. However, in the z direction, the second element-side conductive portion 91 is arranged at a height position between the terahertz element 20 and the reflection film 60. Therefore, the second element-side conductive portion 91 and the reflection film 60 are not in contact with each other.

The second element-side conductive portion 91 includes a second element facing portion 91a facing the second pad 34a in the z direction, a second protruding portion 91b protruding from the reflection film 60 in the x direction when viewed in the z direction, and a second connection portion 91c for connecting the second element facing portion 91a and the second protruding portion 91b.

The second element facing portion 91a is provided between the terahertz element 20 and the reflection film 60, and is formed so that at least a portion thereof overlaps with the second pad 34a when viewed in the z direction. The second element facing portion 91a faces the reflection film 60 in the z direction. As the second pad 34a extends in the x direction, the second element facing portion 91a extends in the x direction. For example, the second element facing portion 91a is formed in a rectangular shape whose longitudinal direction is the x direction and whose lateral direction is the y direction.

In the present embodiment, as the pads 33a and 34a are spaced apart from each other in they direction, the element facing portions 81a and 91a are arranged to face each other in the y direction. In other words, the element facing portions 81a and 91a are arranged on both sides of the oscillation point P1 in the y direction so as not to overlap with the oscillation point P1 when viewed in the z direction.

As shown in FIGS. 7 and 8, the second conductive portion 90 includes a second bump 92 provided between the second element facing portion 91a and the second pad 34a. The terahertz element 20 is flip-chip mounted on the second element facing portion 91a via the second bump 92. The second pad 34a and the second element facing portion 91a are electrically connected by the second bump 92.

In this embodiment, a plurality of second bumps 92 is provided. For example, as the second pad 34a and the second element facing portion 91a extend in the x direction, a plurality of (two, in the present embodiment) second bumps 92 are arranged in the x direction. The second element facing portion 91a and the second bump 92 are arranged at positions that do not overlap with the oscillation point P1 when viewed in the z direction. The shape of the second bump 92 is, for example, a quadrangular prism shape. However, the shape of the second bump 92 is not limited thereto and may be arbitrarily changed.

The second bump 92 may have a single-layer structure or a multiple-layer structure. As an example, the second bump 92 may have a stacked structure of a metal layer containing Cu, a metal layer containing Ti, and an alloy layer containing Sn. The alloy layer containing Sn is, for example, a Sn—Sb alloy layer or a Sn—Ag alloy layer.

A second insulating layer that surrounds the second bump 92 may be formed on the second element facing portion 91a. The second insulating layer may be formed in a frame shape that opens toward the upper side, and the second bump 92 may be accommodated in the second insulating layer. As a result, it is possible to prevent the second bump 92 from sagging laterally. However, the second insulating layer is not essential.

As shown in FIG. 7, in the present embodiment, the second element-side conductive portion 91 has a constant width. Thus, the width of the second element facing portion 91a, the width of the second protruding portion 91b, and the width of the second connection portion 91c are constant.

The second electrode-side conductive portion 93 is electrically connected to the second element-side conductive portion 91 via the second element-side joining portion 94, and is electrically connected to the second electrode 72 via the second electrode-side joining portion 95.

According to this configuration, the second pad 34a of the terahertz element 20 is electrically connected to the second electrode 72 via the second bump 92, the second element-side conductive portion 91, the second element-side joining portion 94, the second electrode-side conductive portion 93, and the second electrode-side joining portion 95.

Similar to the first electrode-side conductive portion 83, the second electrode-side conductive portion 93 includes a first flat portion 93a, a second flat portion 93b, and an inclined portion 93c. The specific configurations of the second electrode-side conductive portion 93, the second element-side joining portion 94, and the second electrode-side joining portion 95 are the same as the configurations of the first electrode-side conductive portion 83, the first element-side joining portion 84, and the first electrode-side joining portion 85. Therefore, the detailed description thereof will be omitted.

As shown in FIGS. 8 and 9, a heat dissipation electrode 73 is provided on the device back surface 12 in addition to the electrodes 71 and 72. The heat dissipation electrode 73 is arranged, for example, at a position where the heat dissipation electrode 73 overlaps with the reflection film 60 when viewed in the z direction. In the present embodiment, the heat dissipation electrode 73 is formed in such a size that the heat dissipation electrode 73 overlaps with the entire reflection film 60. The heat dissipation electrode 73 is spaced apart from the electrodes 71 and 72 and is insulated from the electrodes 71 and 72.

According to this configuration, the heat generated in the reflection film 60 is transferred to the heat dissipation electrode 73 via the encapsulating material 50 and is emitted to the outside of the terahertz device 10 via the heat dissipation electrode 73. Thus, the heat of the reflection film 60 existing inside the encapsulating material 50 can be dissipated to the outside of the terahertz device 10.

Next, a method of manufacturing the terahertz device 10 according to the present embodiment will be described with reference to FIGS. 10 to 24. In the present embodiment, a method of manufacturing a plurality of (for example, two) terahertz devices 10 will be described.

Figure 10:
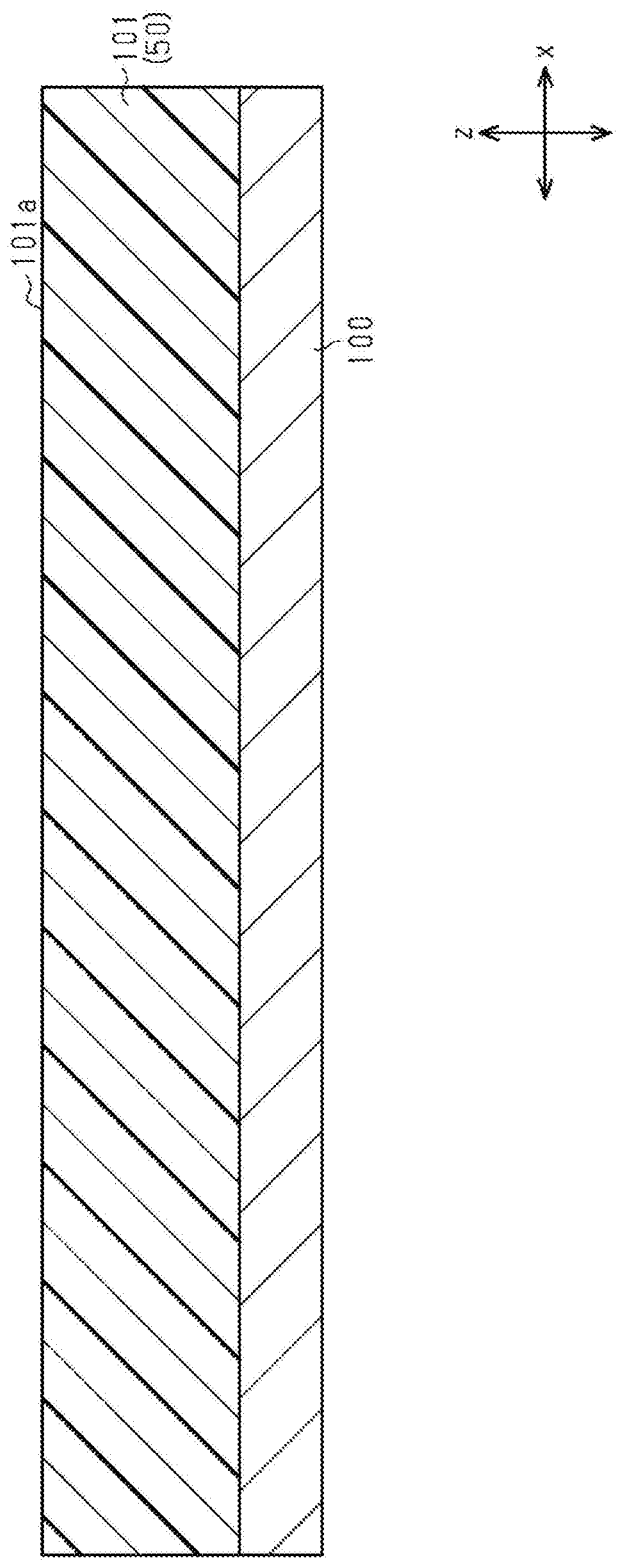
FIG. 10 is an end view showing one step of a method of manufacturing the terahertz device according to the first embodiment.

As shown in FIG. 10, the method of manufacturing the terahertz device 10 includes a first encapsulating step of forming a first encapsulating layer 101 on a support substrate 100. The support substrate 100 is made of, for example, a semiconductor material which is a monocrystalline material. In the present embodiment, the support substrate 100 is a Si monocrystalline material. The thickness of the support substrate 100 in the present embodiment is, for example, about 725 to 775 µm. The support substrate 100 is not limited to the Si wafer and may be, for example, a glass substrate.

In the first encapsulating step, the first encapsulating layer 101 is formed by, for example, molding. In the present embodiment, the first encapsulating layer 101 is a dielectric material having electrical insulation and heat conductivity, and is, for example, a synthetic resin containing an epoxy resin as a main component. The first encapsulating layer 101 constitutes a portion of the encapsulating material 50. The thickness of the first encapsulating layer 101 is set to be equal to the length from the device back surface 12 to the height position where the element-side conductive portions 81 and 91 are formed.

Figure 11:
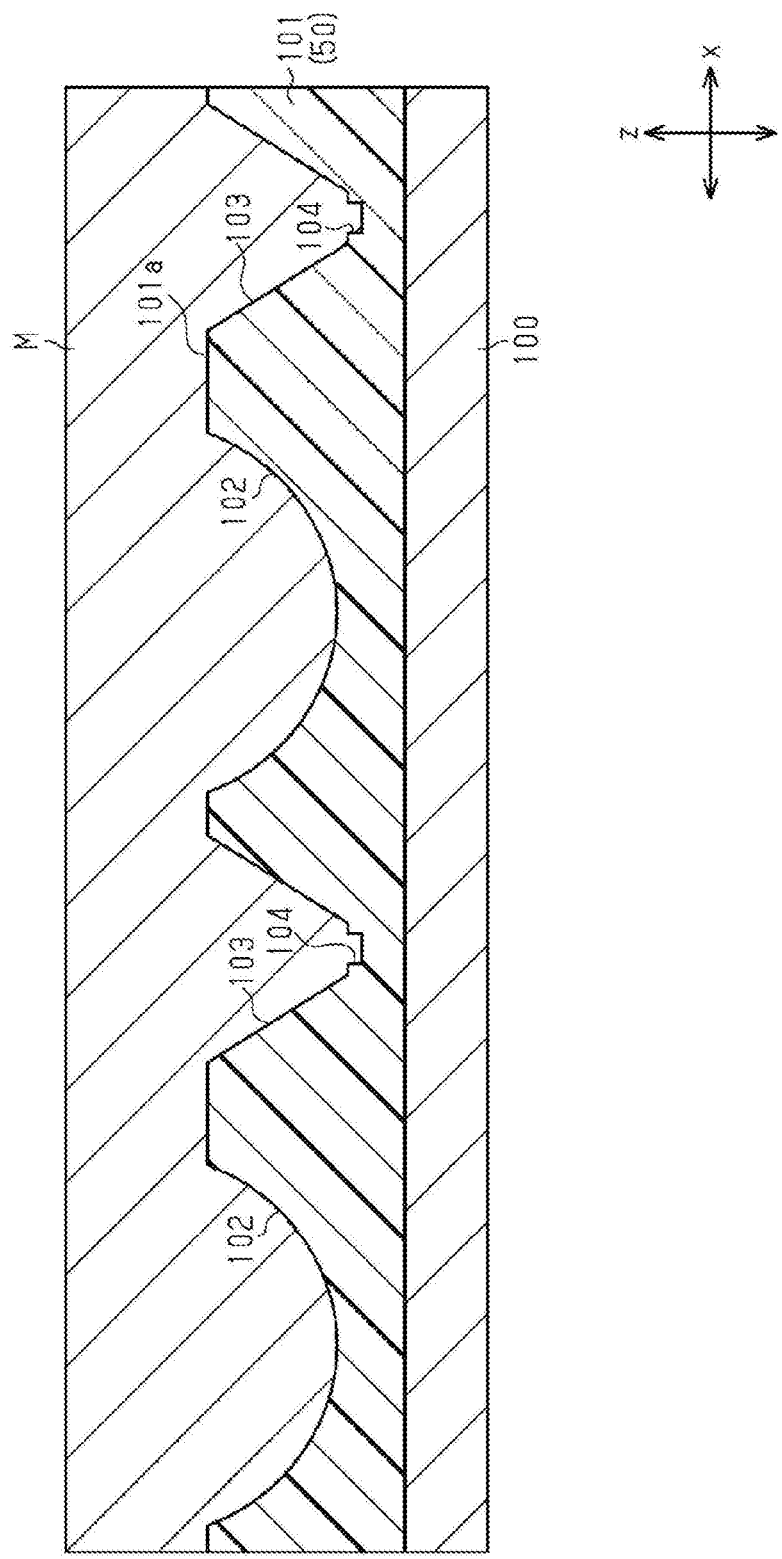
FIG. 11 is an end view showing one step of the method of manufacturing the terahertz device.
Figure 12:
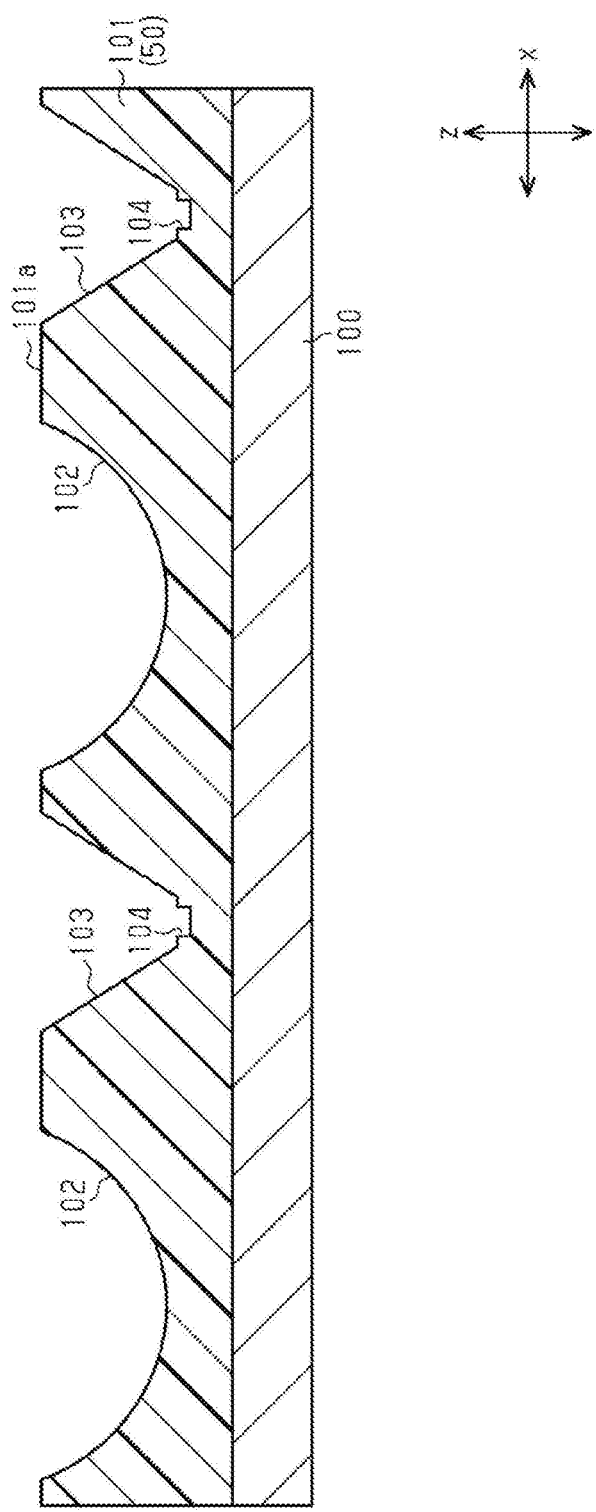
FIG. 12 is an end view showing one step of the method of manufacturing the terahertz device.

As shown in FIGS. 11 and 12, the method of manufacturing the terahertz device 10 includes a step of forming an antenna surface 102 on which a reflection film 60 is formed and a conductive base surface 103 on which conductive portions 80 and 90 are formed. In this step, the antenna surface 102 and the conductive base surface 103 are formed by using, for example, a pressing device M. In the present embodiment, the antenna surface 102 and the conductive base surface 103 are regarded as one unit. A plurality of (for example, two) units is formed side by side in the x direction. By forming the antenna surface 102 and the conductive base surface 103, the first encapsulating surface 101a, which is the surface of the first encapsulating layer 101, has an uneven shape.

The antenna surface 102 is formed so as to correspond to the shape of the reflection film 60. Specifically, the antenna surface 102 is curved so as to have an antenna shape (for example, a parabolic antenna shape).

The conductive base surface 103 has a strip shape with the width direction thereof being the y direction when viewed in the z direction. In the present embodiment, the conductive base surface 103 has a width in they direction so that the electrode-side conductive portions 83 and 93 spaced apart in the y direction can be arranged on the conductive base surface 103.

The conductive base surface 103 is inclined in conformity with the inclined portions 83c and 93c. For example, the conductive base surface 103 is inclined so as to gradually narrow toward the support substrate 100. Further, on the bottom surface of the conductive base surface 103, recesses 104 corresponding to the electrode-side joining portions 85 and 95 are formed.

Figure 13:
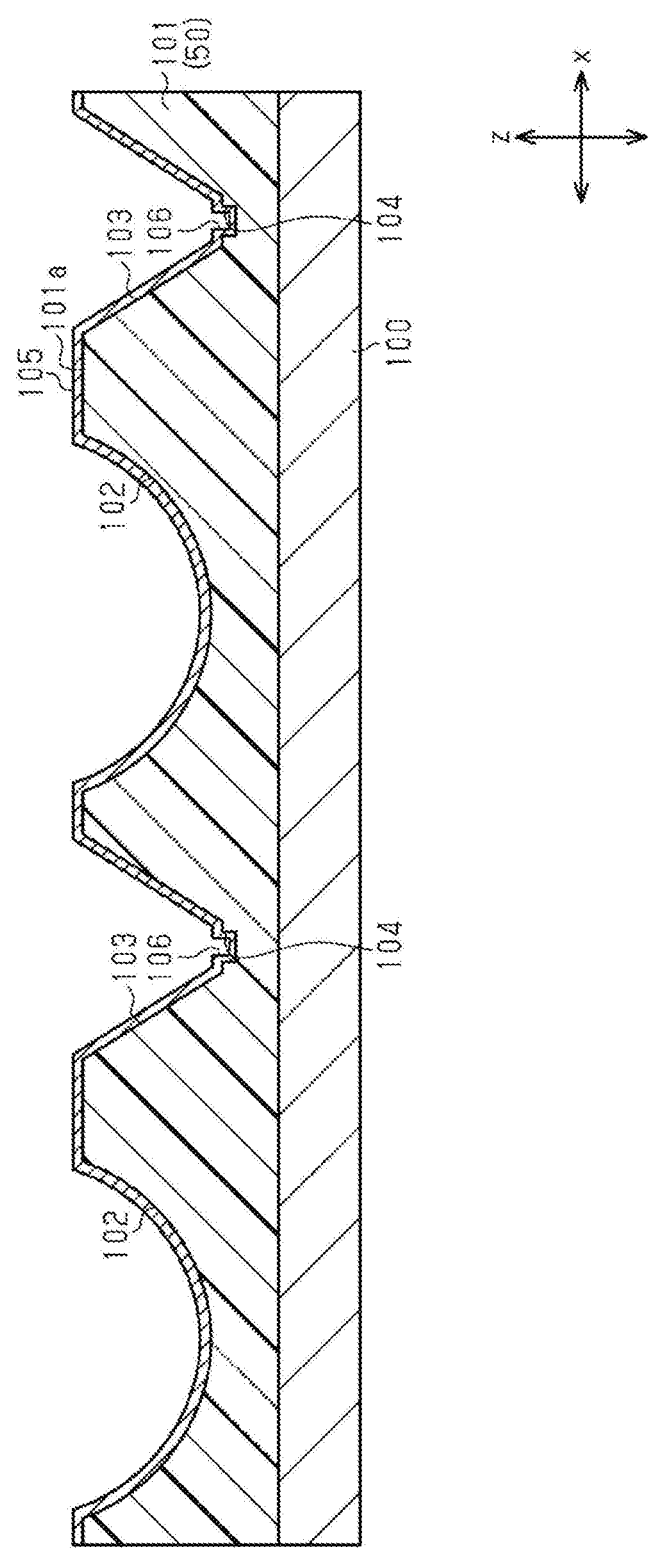
FIG. 13 is an end view showing one step of the method of manufacturing the terahertz device.

As shown in FIG. 13, the method of manufacturing the terahertz device 10 includes a step of forming a metal film 105 on the first encapsulating surface 101a. In this step, the metal film 105 is formed on the entire first encapsulating surface 101a. The specific configuration of the metal film 105 is arbitrary, and may be composed of, for example, a base layer and a plating layer.

Here, the metal film 105 is formed on the bottom surface and both side surfaces of the recess 104. As a result, the metal film 105 formed in the recess 104 has a concave shape. That is, a concave portion 106 is formed in the portion of the metal film 105 corresponding to the recess 104.

Figure 14:
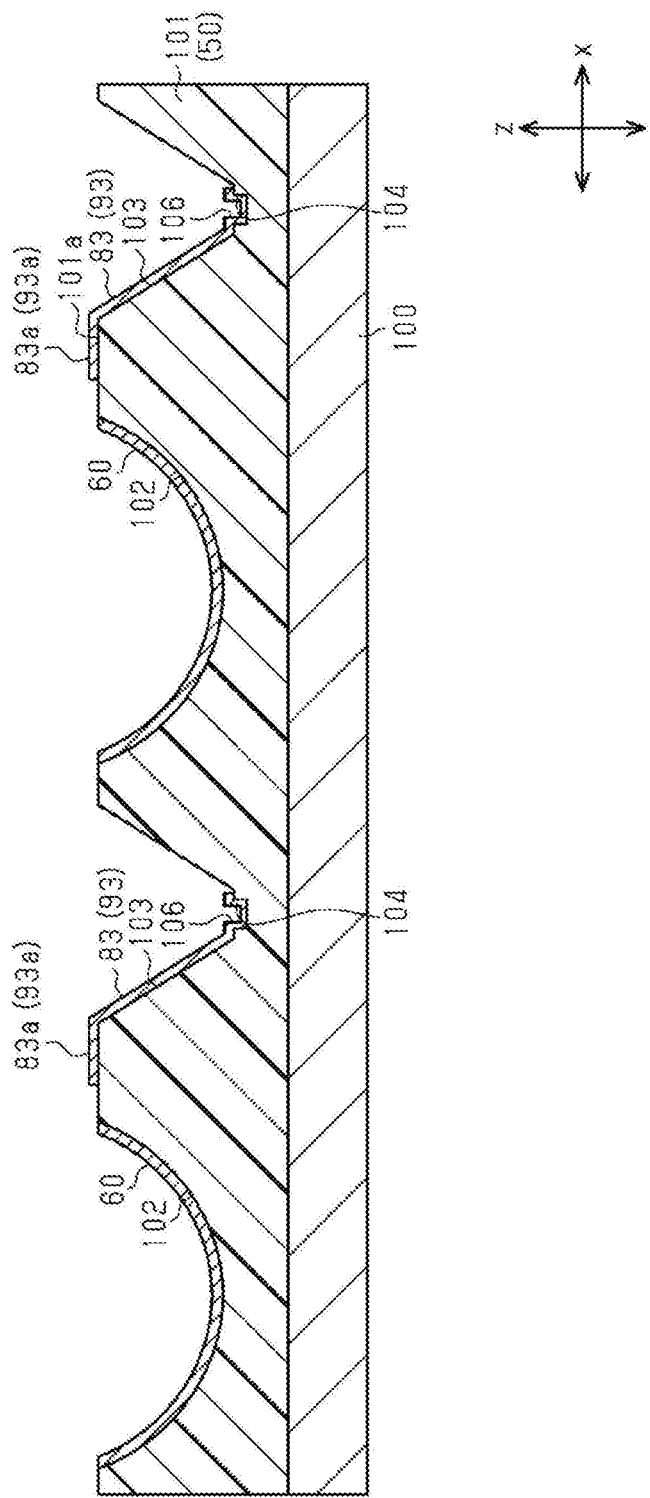
FIG. 14 is an end view showing one step of the method of manufacturing the terahertz device.

As shown in FIG. 14, the method of manufacturing the terahertz device 10 includes a step of removing an unnecessary portion of the metal film 105. In this step, for example, pattern etching is performed to remove other portions than a portion of the metal film 105 corresponding to the reflection film 60 and a portion of the metal film 105 corresponding to both electrode-side conductive portions 83 and 93. In particular, the metal film 105 formed on the conductive base surface 103 is divided into two portions to form the electrode-side conductive portions 83 and 93. As a result, the reflection film 60 and the electrode-side conductive portions 83 and 93 are formed.

Figure 15:
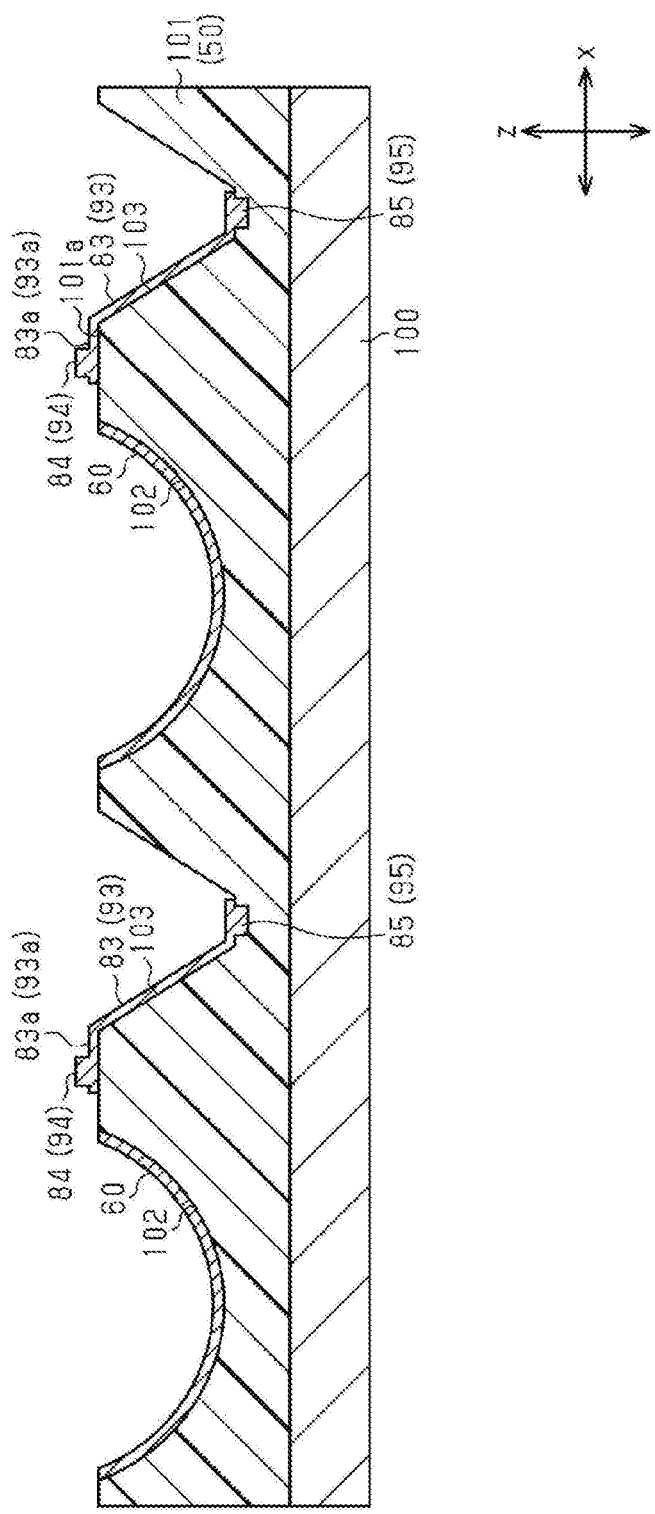
FIG. 15 is an end view showing one step of the method of manufacturing the terahertz device.

As shown in FIG. 15, the method of manufacturing the terahertz device 10 includes a step of forming element-side joining portions 84 and 94 and electrode-side joining portions 85 and 95. In this step, the element-side joining portions 84 and 94 are formed on the first flat portions 83a and 93a, and the concave portion 106 is filled with metal so as to become flat.

Figure 16:
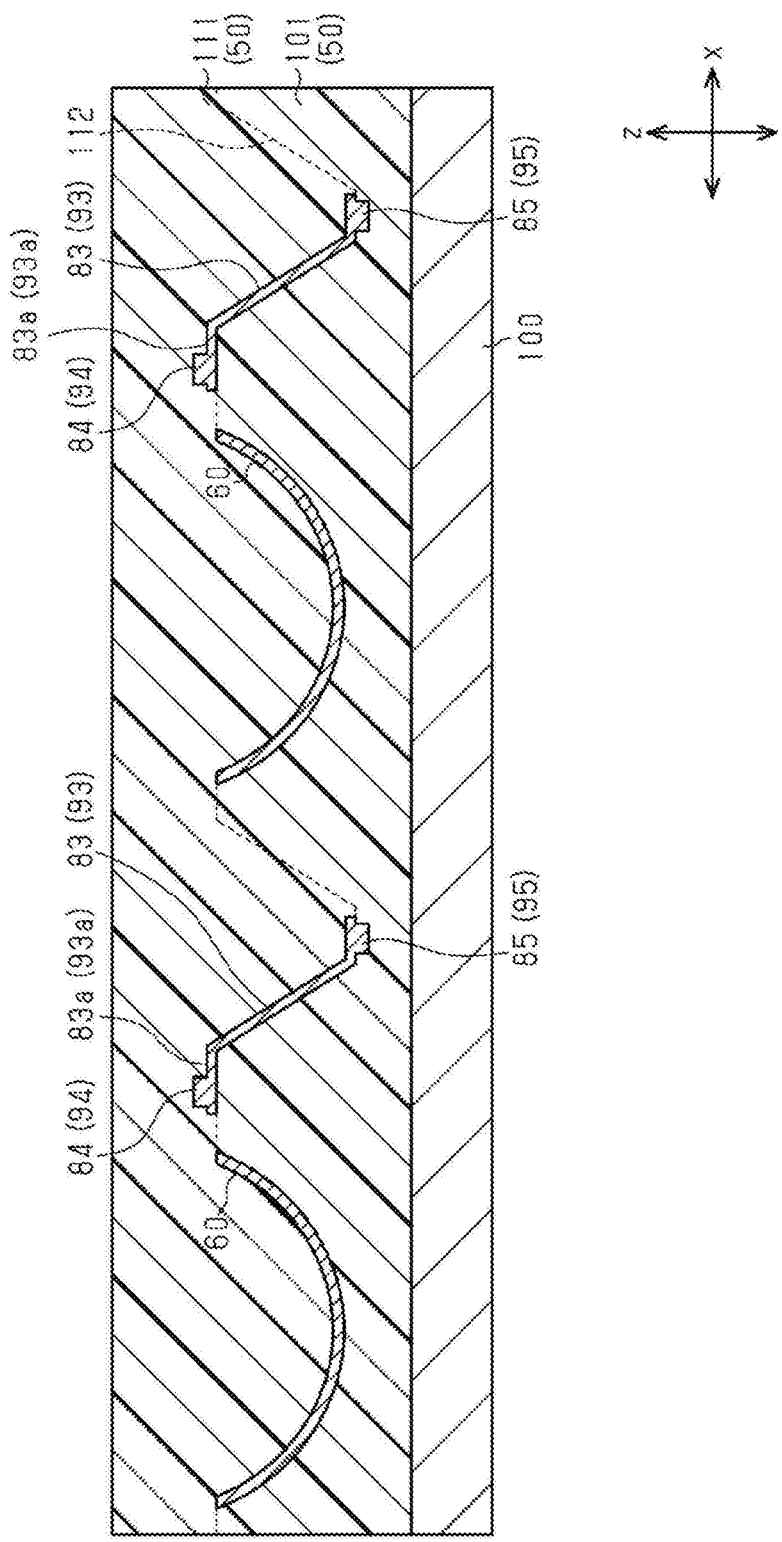
FIG. 16 is an end view showing one step of the method of manufacturing the terahertz device.

Next, as shown in FIG. 16, the method of manufacturing the terahertz device 10 includes a second encapsulating step of forming a second encapsulating layer 111 on the first encapsulating layer 101 (specifically, the first encapsulating surface 101a). In the second encapsulating step, the second encapsulating layer 111 is formed by, for example, molding. In the present embodiment, the second encapsulating layer 111 is made of the same material as the first encapsulating layer 101. That is, the second encapsulating layer 111 is a dielectric material having electrical insulation and heat conductivity, and is, for example, a synthetic resin containing an epoxy resin as a main component. As a result, the reflection film 60 and some portions of the conductive portions 80 and 90 (specifically, the portions other than the element-side conductive portions 81 and 91) are encapsulated by the encapsulating layers 101 and 111. The second encapsulating layer 111 constitutes a portion of the encapsulating material 50. The second encapsulating layer 111 is formed in excess of the required film thickness.

When the second encapsulating layer 111 is formed on the first encapsulating layer 101, a first interface 112 may be formed between the first encapsulating layer 101 and the second encapsulating layer 111. However, the first interface 112 may not be formed.

Figure 17:
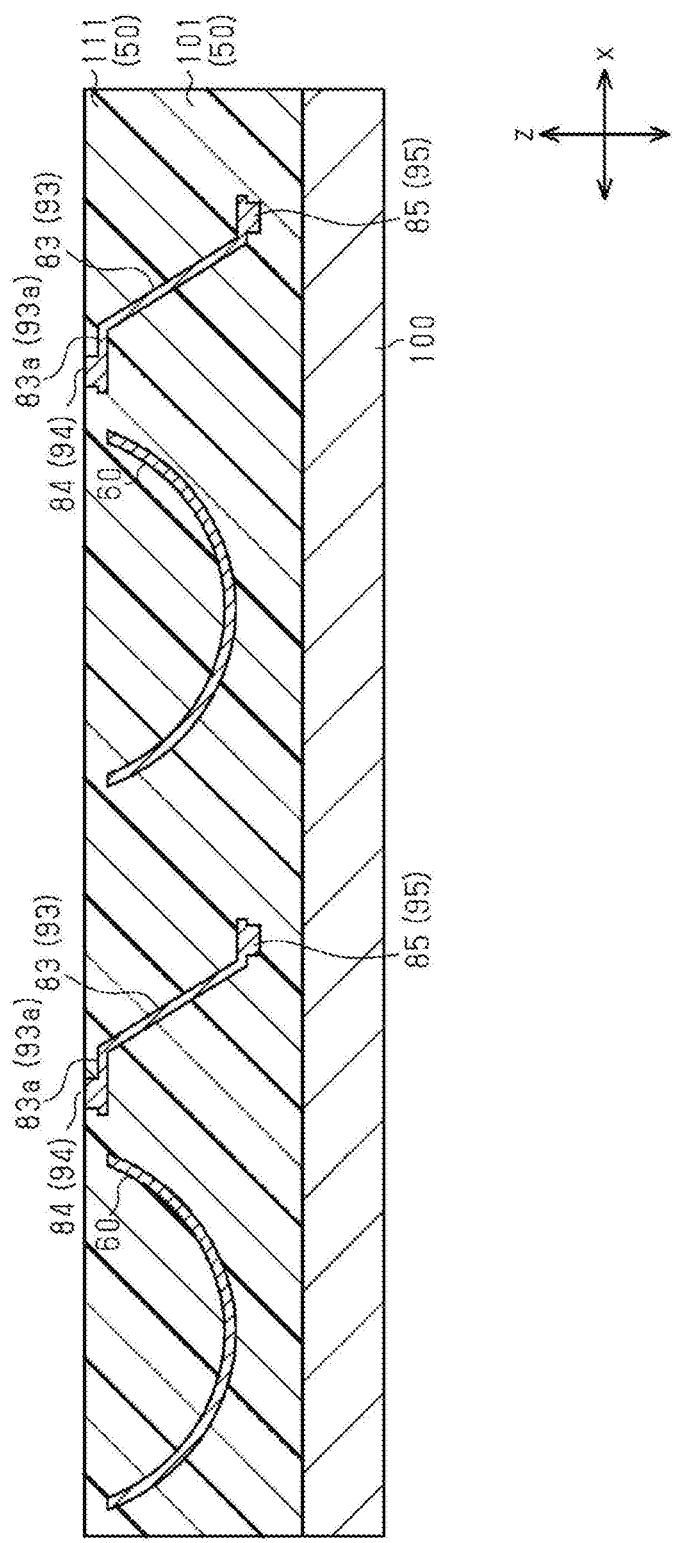
FIG. 17 is an end view showing one step of the method of manufacturing the terahertz device.

As shown in FIG. 17, the method of manufacturing the terahertz device 10 includes a step of polishing the second encapsulating layer 111. This step is a step of polishing the second encapsulating layer 111 so that the element-side joining portions 84 and 94 are exposed.

Figure 18:
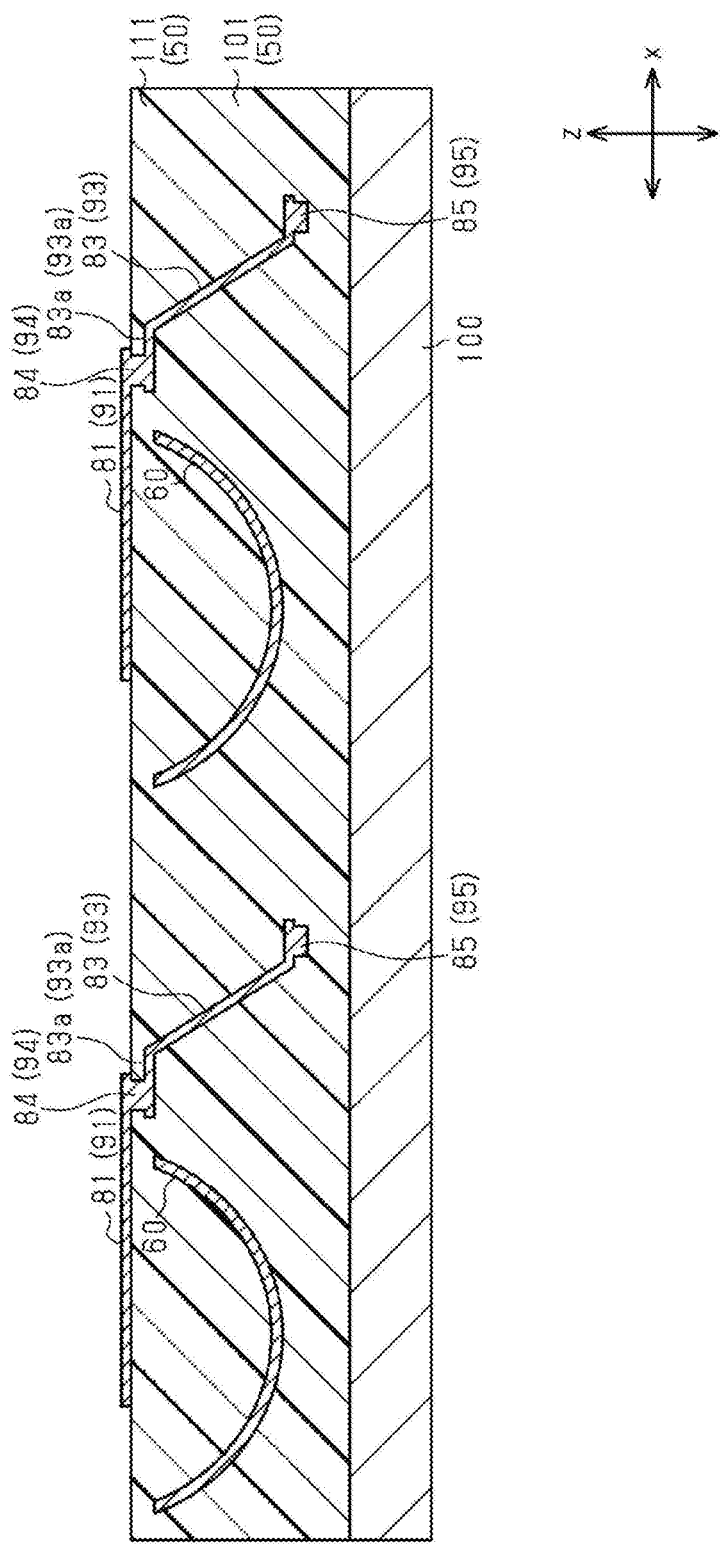
FIG. 18 is an end view showing one step of the method of manufacturing the terahertz device.

As shown in FIG. 18, the method of manufacturing the terahertz device 10 includes a step of forming the element-side conductive portions 81 and 91. This step is a step of forming element-side conductive portions 81 and 91 by, for example, patterning. In this case, by forming a portion of the element-side conductive portions 81 and 91 on the element-side joining portions 84 and 94, the element-side conductive portions 81 and 91 and the element-side joining portions 84 and 94 are electrically connected to each other.

Figure 19:
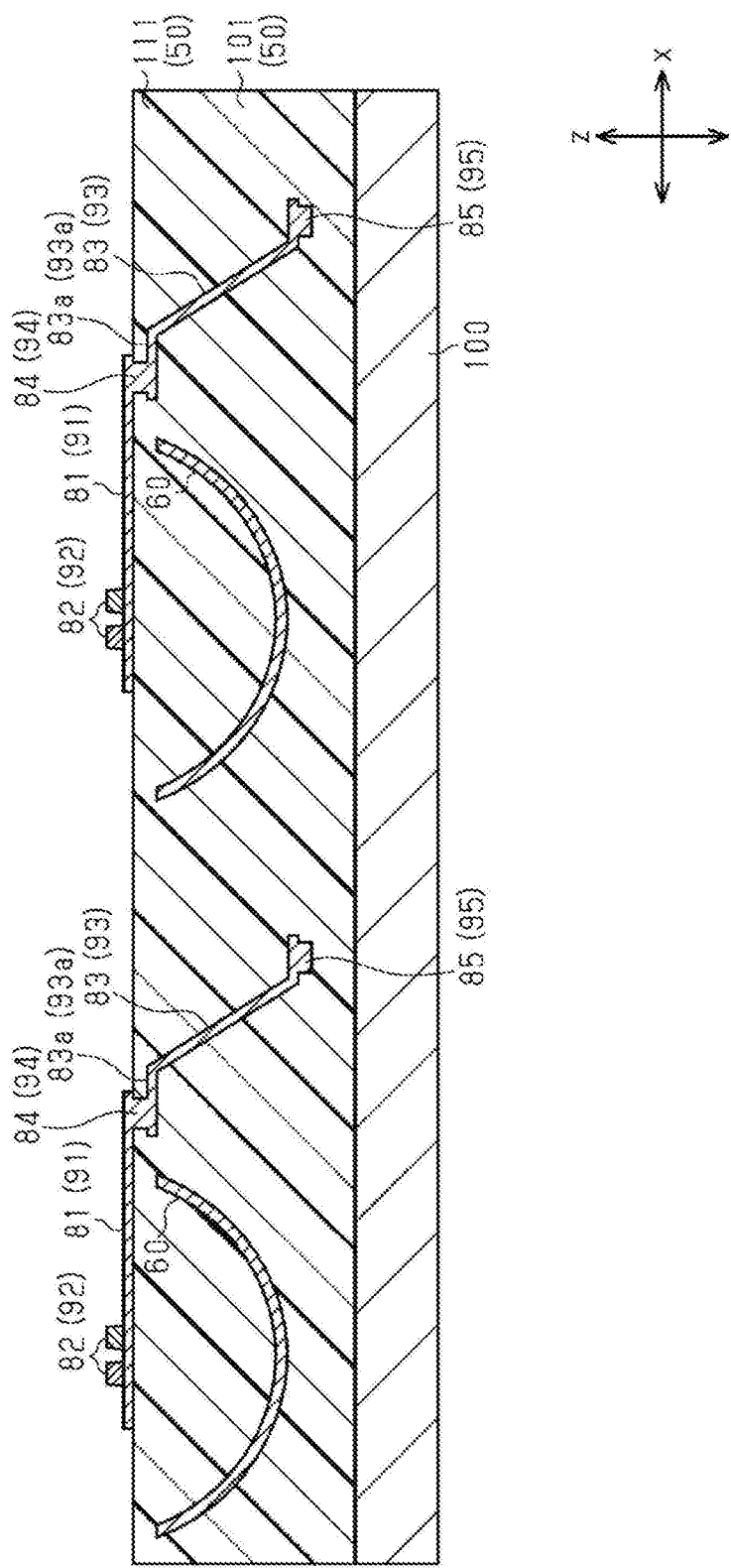
FIG. 19 is an end view showing one step of the method of manufacturing the terahertz device.
Figure 20:
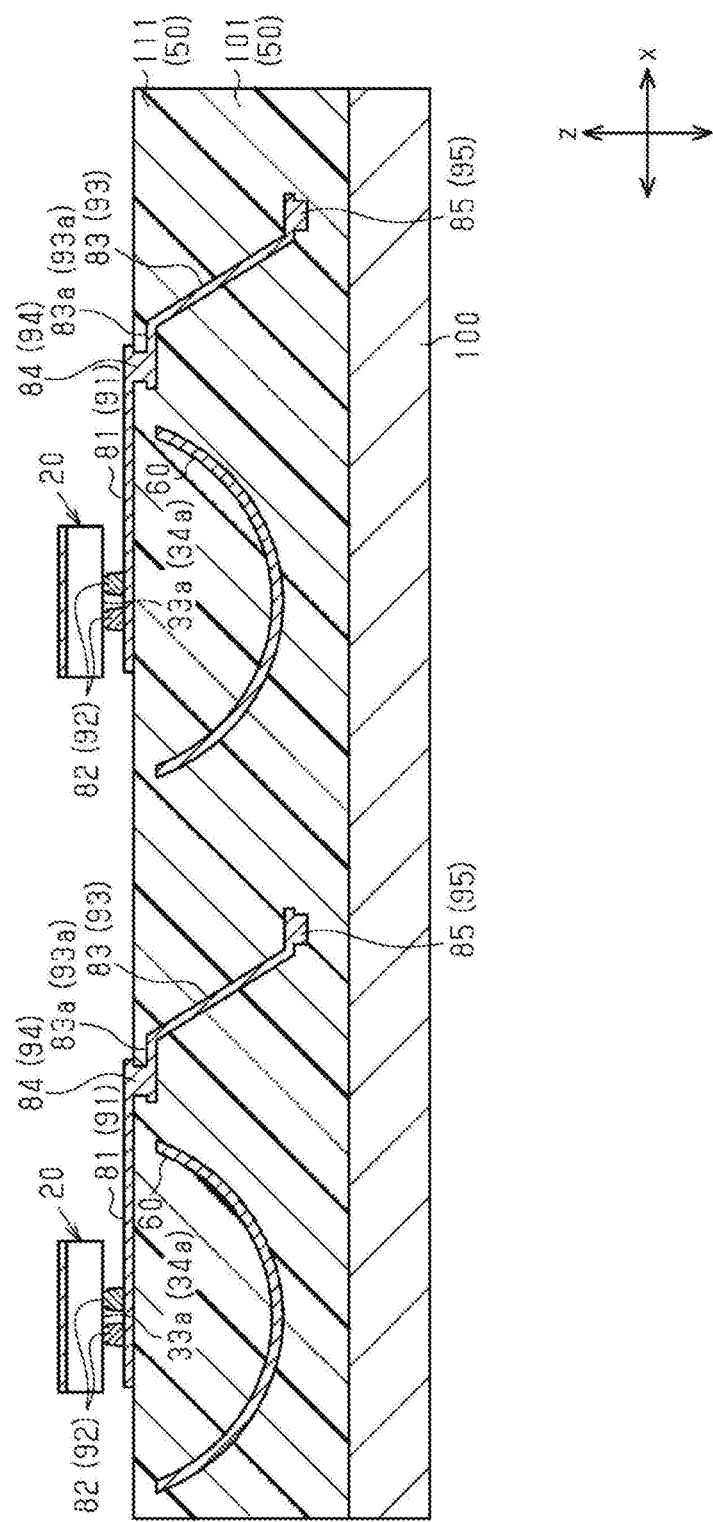
FIG. 20 is an end view showing one step of the method of manufacturing the terahertz device.

As shown in FIGS. 19 and 20, the method of manufacturing the terahertz device 10 includes an element mounting step of mounting a terahertz element 20. The element mounting step is performed by flip chip bonding.

For example, as shown in FIG. 19, the element mounting step includes a step of forming bumps 82 and 92. The step of forming the bumps 82 and 92 includes, for example, a step of forming a resist layer in a region other than a bump forming region where the bumps 82 and 92 are formed, a step of stacking a conductive layer constituting the bumps 82 and 92 in the bump forming region, and a step of removing the resist layer. The resist layer is formed of, for example, a photosensitive resist, and is patterned by exposure and development.

As shown in FIG. 20, the element mounting step includes a step of joining the terahertz element 20 to the conductive portions 80 and 90 using the bumps 82 and 92. As a result, the terahertz element 20 is flip-chip mounted on the conductive portions 80 and 90, and the terahertz element 20 and the conductive portions 80 and 90 are electrically connected to each other.

Figure 21:
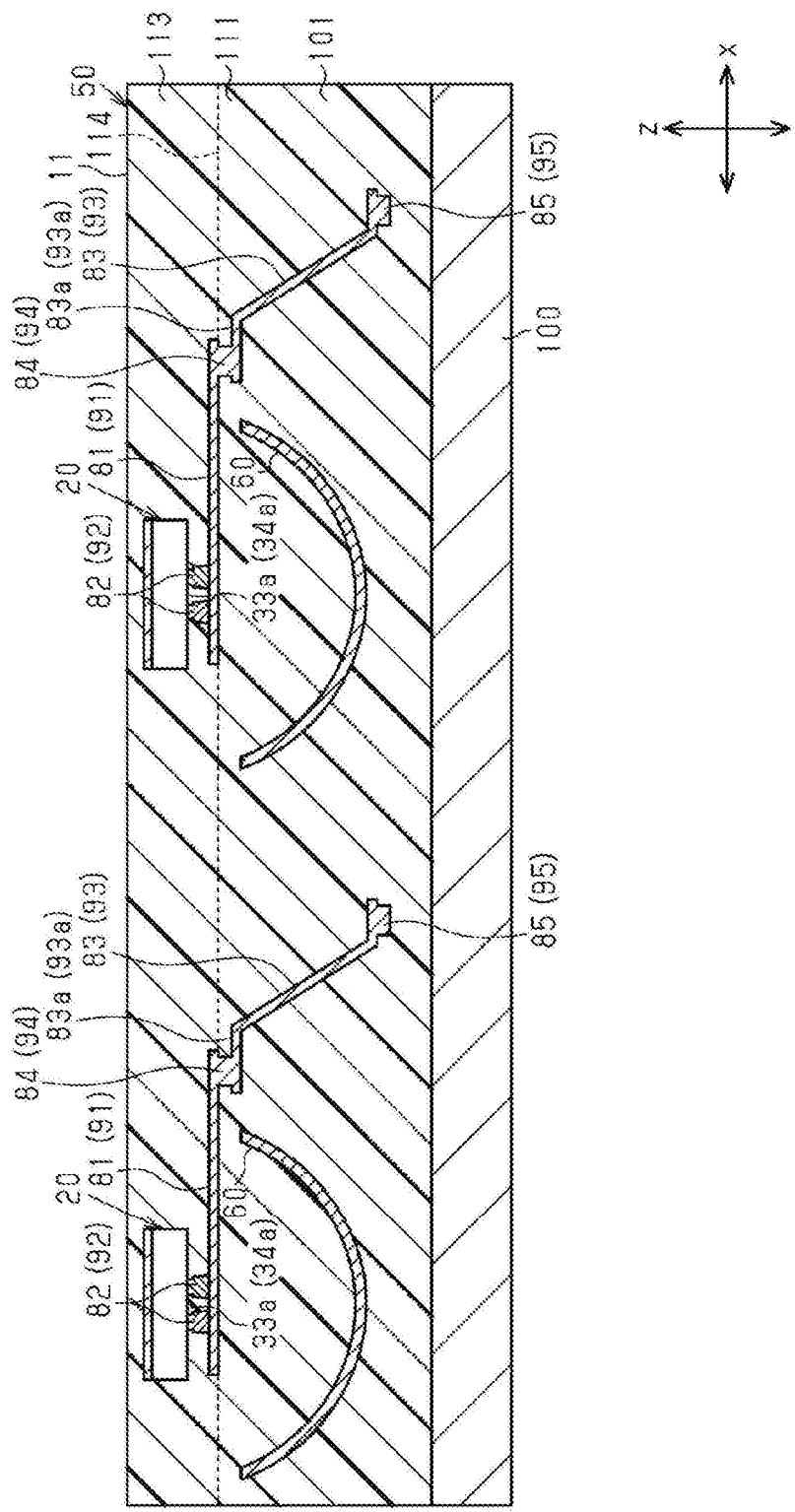
FIG. 21 is an end view showing one step of the method of manufacturing the terahertz device.

As shown in FIG. 21, the method of manufacturing the terahertz device 10 includes a third encapsulating step of stacking a third encapsulating layer 113 on the second encapsulating layer 111. In the third encapsulating step, the third encapsulating layer 113 is formed by, for example, molding. In the present embodiment, the third encapsulating layer 113 is made of the same material as the first encapsulating layer 101 and the second encapsulating layer 111. That is, the third encapsulating layer 113 is a dielectric material having electrical insulation and heat conductivity, and is, for example, a synthetic resin containing an epoxy resin as a main component.

The encapsulating material 50 is composed of the first encapsulating layer 101, the second encapsulating layer 111, and the third encapsulating layer 113. The lower surface of the first encapsulating layer 101 constitutes the device back surface 12, and the upper surface of the third encapsulating layer 113 constitutes the device main surface 11. The terahertz element 20, the reflection film 60, and the conductive portions 80 and 90 are encapsulated by the encapsulating material 50.

When the third encapsulating layer 113 is formed on the second encapsulating layer 111, a second interface 114 may be formed between the second encapsulating layer 111 and the third encapsulating layer 113. That is, the encapsulating material 50 may have a stacked structure having a first interface 112 and a second interface 114. However, the second interface 114 may not be formed.

The third encapsulating step may include a step of forming a third encapsulating layer 113 so as to be thicker than a desired thickness, and a step of subsequently polishing the third encapsulating layer 113 to a desired thickness. In addition, before forming the third encapsulating layer 113, for example, an under-fill containing an epoxy resin as a main agent may be filled under the terahertz element 20 (between the terahertz element 20 and the second encapsulating layer 111 or the conductive portions 80 and 90).

Figure 22:
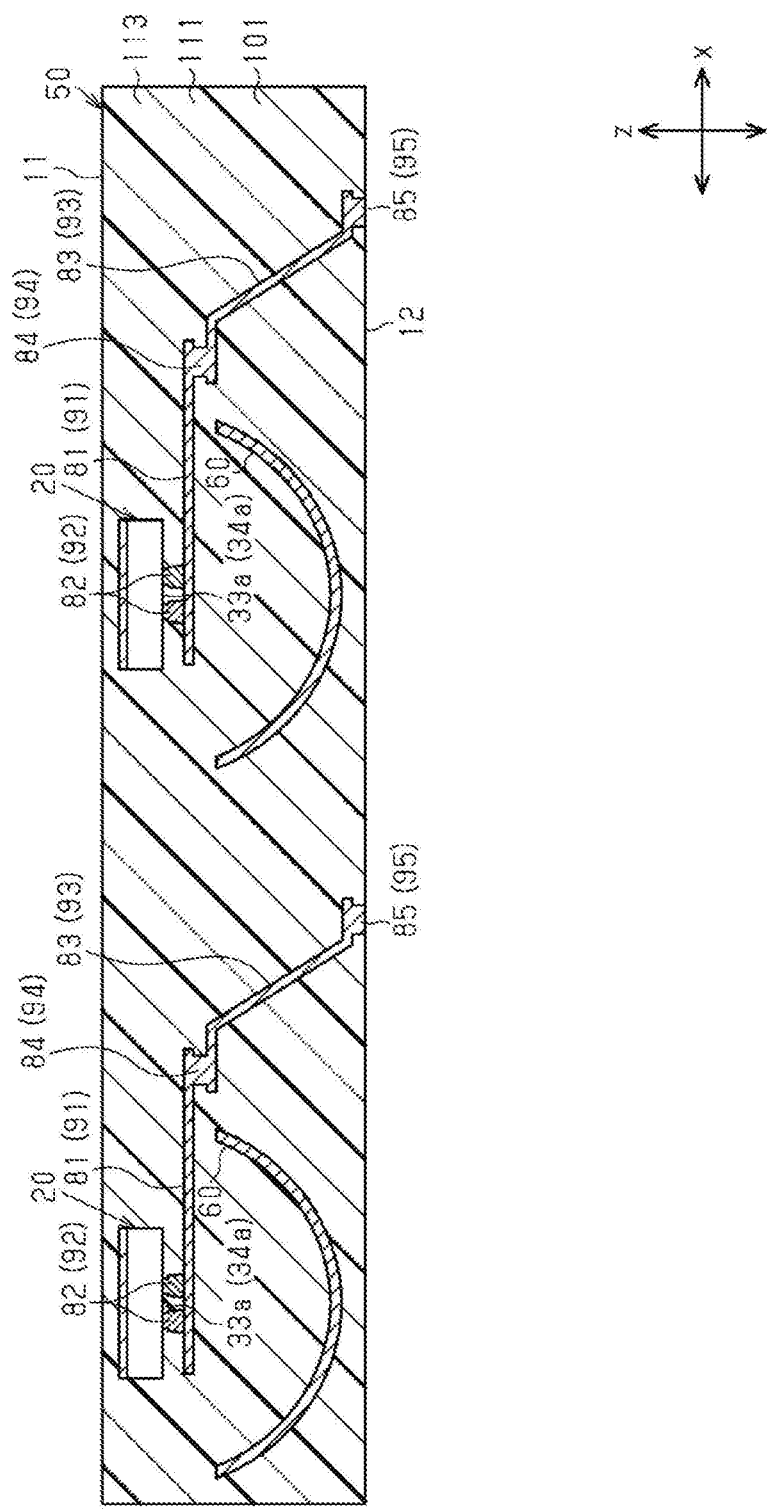
FIG. 22 is an end view showing one step of the method of manufacturing the terahertz device.

As shown in FIG. 22, the method of manufacturing the terahertz device 10 includes an exposure step of exposing the device back surface 12 and the electrode-side joining portions 85 and 95 by removing the support substrate 100 and a portion of the first encapsulating layer 101. In the exposure step, for example, a mechanical grinder is used. The method of removing a portion of the support substrate 100 and the first encapsulating layer 101 is not limited to the configuration using the mechanical grinder.

Figure 23:
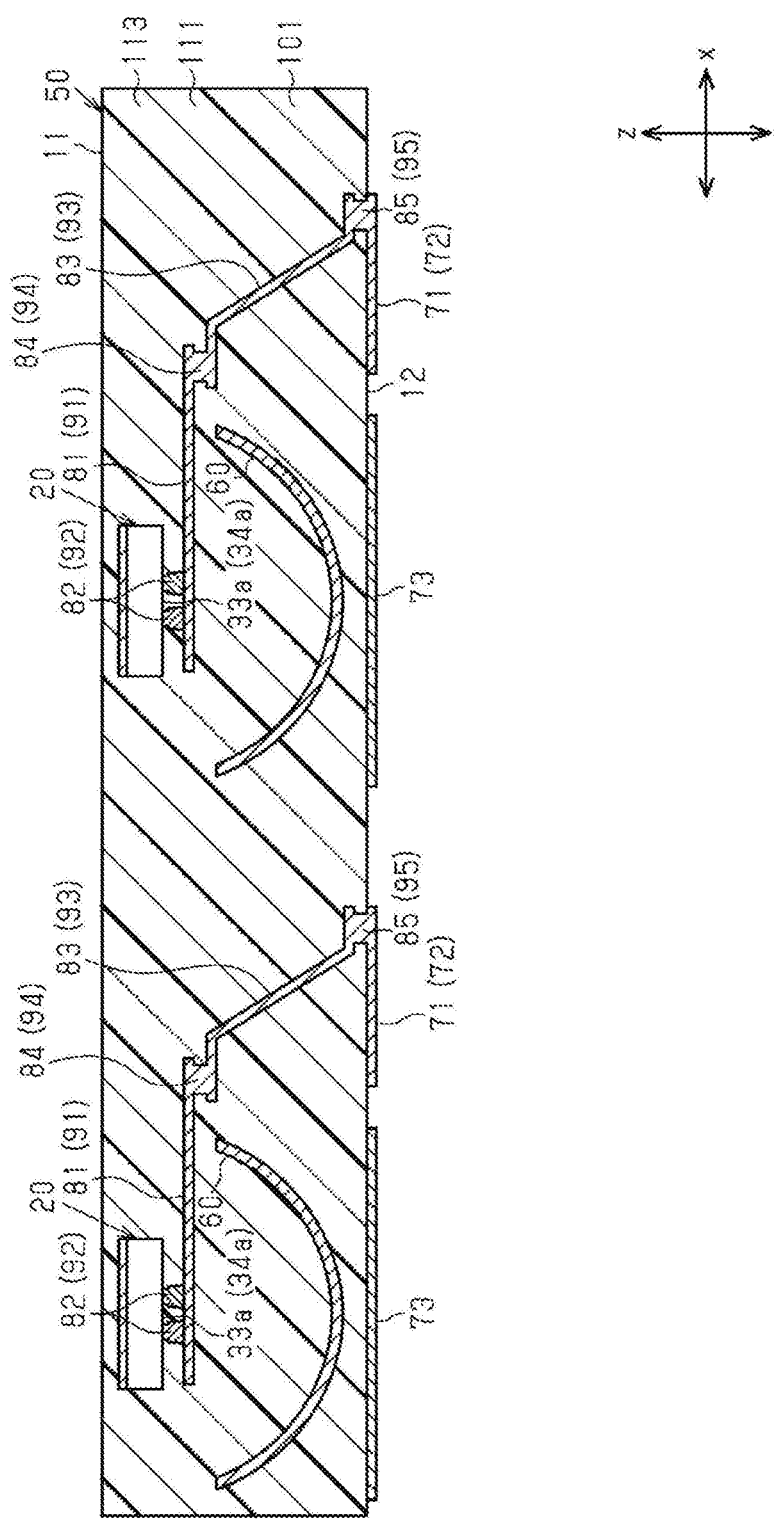
FIG. 23 is an end view showing one step of the method of manufacturing the terahertz device.

As shown in FIG. 23, the method of manufacturing the terahertz device 10 includes a step of forming electrodes 71 and 72 and a heat dissipation electrode 73. The step of forming the electrodes 71 and 72 and the heat dissipation electrode 73 is performed by, for example, electroless plating. In the present embodiment, the electrodes 71 and 72 and the heat dissipation electrode 73 are formed by sequentially stacking a Ni layer, a Pd layer, and an Au layer by electroless plating.

The method of forming the electrodes 71 and 72 and the heat dissipation electrode 73 is not limited thereto. The Ni layer and the Au layer may be sequentially stacked. Only the Au layer may be stacked. Only Sn may be formed. Sn may be formed on the Ni layer.

Figure 24:
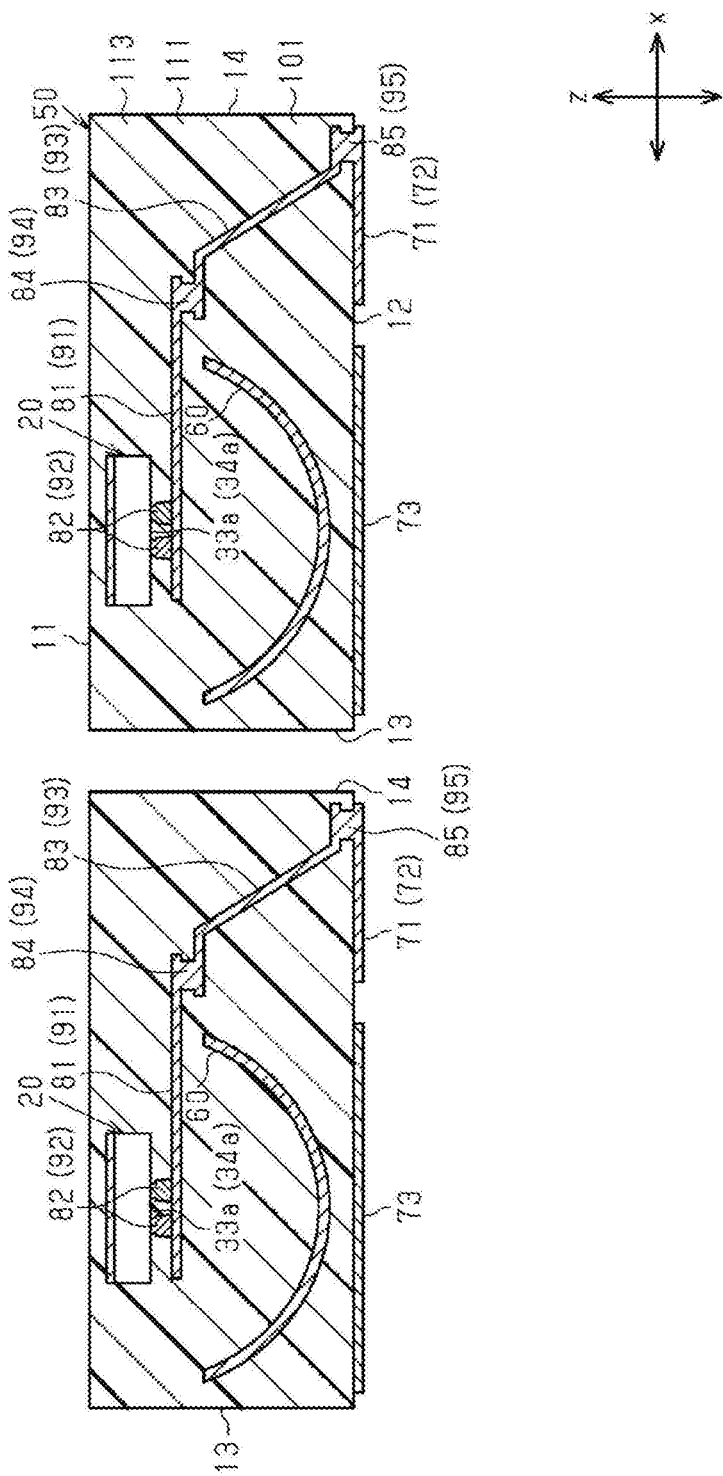
FIG. 24 is an end view showing one step of the method of manufacturing the terahertz device.

As shown in FIG. 24, the method of manufacturing the terahertz device 10 includes a dicing step of dicing a plurality of terahertz devices 10. Thus, it is possible to manufacture a plurality of terahertz devices 10 at the same time.

For the sake of convenience of description, the method of manufacturing two terahertz devices 10 has been described. However, the number of the terahertz devices 10 may be three or more, or may be one.

Next, the operation of the present embodiment will be described.

In the present embodiment, the electromagnetic wave generated from the terahertz element 20 propagates to the reflection film 60 through the encapsulating material 50 and is reflected by the reflection film 60 in one direction (to the upper side in the present embodiment). As a result, the electromagnetic wave is outputted from the terahertz device 10 (specifically, the device main surface 11). It can be said that the device main surface 11 of the present embodiment is an output surface from which the electromagnetic wave reflected by the reflection film 60 is outputted.

Since the terahertz element 20 and the reflection film 60 are encapsulated by the encapsulating material 50, a foreign material is less likely to enter between the terahertz element 20 and the reflection film 60, and deterioration of the reflection film 60 due to exposure to the air is less likely to occur. In addition, since the relative position between the terahertz element 20 and the reflection film 60 is fixed by the encapsulating material 50, a misalignment between the terahertz element 20 and the reflection film 60 is unlikely to occur.

According to the present embodiment described above, the following effects may be obtained.

(1-1) The terahertz device 10 includes: a terahertz element 20 configured to generate an electromagnetic wave; a reflection film 60 provided at a position facing the terahertz element 20 and configured to reflect the electromagnetic wave in one direction (to the upper side in the present embodiment); and an encapsulating material 50 configured to encapsulate the terahertz element 20 and the reflection film 60.

According to this configuration, the electromagnetic wave generated from the terahertz element 20 propagates to the reflection film 60 through the inside of the encapsulating material 50 and is reflected by the reflection film 60 in one direction. As a result, it is possible to increase the output of the electromagnetic wave. That is, it is possible to improve the gain of the electromagnetic wave outputted from the terahertz device 10.

Since the terahertz element 20 and the reflection film 60 are encapsulated by the encapsulating material 50, a foreign material or the like is unlikely to enter between them. As a result, it is possible to prevent the propagation of the electromagnetic wave from being hindered by a foreign material. In addition, since the reflection film 60 is not exposed to the air, it is possible to suppress the deterioration of the reflection film 60 due to the moisture or oxygen contained in the air.

Furthermore, the terahertz element 20 and the reflection film 60 are less likely to be misaligned as compared with, for example, a configuration in which a component on which the terahertz element 20 is mounted and a component on which the reflection film 60 is formed are bonded using an adhesive or the like. As a result, it is possible to suppress the misalignment between the terahertz element 20 and the reflection film 60.

(1-2) Conductive portions 80 and 90 are provided inside the encapsulating material 50. The terahertz element 20 is flip-chip mounted on the conductive portions 80 and 90. According to this configuration, it is possible to increase the speed of signal transmission as compared with the mounting performed by wire bonding.

That is, in the mounting performed by wire bonding in a high frequency band of an electromagnetic wave falling in a terahertz band, there is a concern that the transmission speed of signals is limited by a wire. In this respect, the aforementioned problem does not occur in the flip-chip mounting that does not use a wire. As a result, it is possible to increase the speed of signal transmission.

(1-3) The encapsulating material 50 includes a device main surface 11 and a device back surface 12 as both end surfaces of the terahertz device 10 in the z direction which is the height direction. The electromagnetic wave reflected by the reflection film 60 is outputted from the device main surface 11. The device back surface 12 is a surface opposite to the device main surface 11. The electrodes 71 and 72 are formed on the device back surface 12. The conductive portions 80 and 90 electrically connect the terahertz element 20 and the electrodes 71 and 72. According to this configuration, the terahertz element 20 encapsulated by the encapsulating material 50 and the electrodes 71 and 72 formed on the device back surface 12 outside the encapsulating material are electrically connected via the conductive portions 80 and 90. In this case, the terahertz device 10 can be easily mounted on a circuit board or the like.

That is, since the electrodes 71 and 72 are formed on the device back surface 12, when the terahertz device 10 is mounted on a circuit board, the terahertz device 10 may be arranged so that the device back surface 12 and the circuit board face each other, and the electrodes 71 and 72 and the circuit board may be joined using a conductive joining material such as solder or the like. Accordingly, it is not necessary to electrically connect the terahertz device 10 and the circuit board using a wire or the like, and it is possible to relatively easily mount the terahertz device 10.

Furthermore, since the electrodes 71 and 72 are formed on the device back surface 12 opposite to the device main surface 11 from which the electromagnetic wave is outputted, it is possible to prevent the electromagnetic wave outputted from the terahertz device 10 from being blocked by the electrodes 71 and 72.

(1-4) The terahertz element 20 is arranged so as to be biased closer to the device main surface 11 than to the device back surface 12, and the reflection film 60 is arranged closer to the device back surface 12 than to the terahertz element 20. According to this configuration, since the terahertz element 20 is arranged near the device main surface 11, it is possible to secure a wide space for the reflection film 60 in the encapsulating material 50. As a result, for example, even when the reflection film 60 that occupies a space in the z direction, just like a parabolic antenna shape, is installed, it is possible to prevent the terahertz device 10 from increasing in size in the height direction (the z direction in the present embodiment).

(1-5) The terahertz element 20 includes pads 33a and 34a facing the reflection film 60. The conductive portions 80 and 90 include element facing portions 81a and 91a provided between the terahertz element 20 and the reflection film 60 and face the pads 33a and 34a in the z direction, and bumps 82 and 92 provided between the pads 33a and 34a and the element facing portions 81a and 91a. The terahertz element 20 is flip-chip mounted on the element facing portions 81a and 91a via the bumps 82 and 92. According to this configuration, the effect of (1-2) may be obtained.

Inasmuch as the terahertz element 20 and the reflection film 60 face each other, the electromagnetic wave reflected by the reflection film 60 is blocked by the terahertz element 20. Since the element facing portions 81a and 91a and the bumps 82 and 92 facing the terahertz element 20 are arranged in the region where the electromagnetic wave is blocked by the terahertz element 20, the portions in which the electromagnetic wave is blocked are not newly formed by the element facing portions 81a and 91a and the bumps 82 and 92.

(1-6) In view of the fact that the pads 33a and 34a are formed in the shape having the longitudinal direction and the lateral direction, the element facing portions 81a and 91a extend in the x direction which is the longitudinal direction of the pads 33a and 34a. A plurality of bumps 82 and 92 is arranged in the x direction. According to this configuration, it is possible to increase the contact area of the bumps 82 and 92, which makes it possible to reduce an on-resistance.

(1-7) The electrodes 71 and 72 are formed on a portion of the device back surface 12 that does not overlap with the reflection film 60 when viewed in the z direction. According to this configuration, the heat of the reflection film 60 is less likely to be transferred to the electrodes 71 and 72, as compared with a case where the electrodes 71 and 72 are formed in a portion overlapping with the reflection film 60. Accordingly, it is possible to suppress an adverse effect on the electrical connection between the electrodes 71 and 72 and the mounting target of the terahertz device 10 (e.g., the circuit board) due to the heat of the reflection film 60.

(1-8) A heat dissipation electrode 73, to which the heat of the reflection film 60 is transferred, is formed in a portion of the device back surface 12 that overlaps with the reflection film 60 when viewed in the z direction. According to this configuration, the heat of the reflection film 60 can be dissipated via the heat dissipation electrode 73. Thus, it is possible to suppress the heat generation in the terahertz device 10 due to the reflection film 60. In addition, when mounting the terahertz device 10 on the circuit board, it is possible to suppress the rattling of the terahertz device 10 due to the thickness of the electrodes 71 and 72.

(1-9) The first conductive portion 80 includes a first element-side conductive portion 81 and a first electrode-side conductive portion 83. The first element-side conductive portion 81 includes a first element facing portion 81a, a first protruding portion 81b protruding from the reflection film 60 when viewed in the z direction, and a first connection portion 81c configured to connect the first element facing portion 81a and the first protruding portion 81b. The first electrode-side conductive portion 83 is provided at a position that does not overlap with the terahertz element 20 and the reflection film 60 when viewed in the height direction of the terahertz device 10, and is electrically connected to the first protruding portion 81b and the first electrode 71. According to this configuration, the terahertz element 20 provided at the position facing the reflection film 60 and the first electrode 71 provided at the position not overlapping with the reflection film 60 can be electrically connected to each other. This also applies to the second conductive portion 90.

(1-10) The first electrode-side conductive portion 83 has a crank shape bent in the z direction. According to this configuration, it is possible to electrically connect the first element-side conductive portion 81 and the first electrode 71, which have different heights. This also applies to the second electrode-side conductive portion 93.

(1-11) The first element-side conductive portion 81 is arranged inside the encapsulating material 50 at a position closer to the device main surface 11 than to the device back surface 12. The first electrode-side conductive portion 83 includes a first flat portion 83a facing the first protruding portion 81b in the z direction, a second flat portion 83b facing the first electrode 71 in the z direction, and an inclined portion 83c configured to connect the first and second flat portions 83a, 83b and inclined so as to approach the device back surface 12 as the inclined portion 83c extends from the first flat portion 83a toward the second flat portion 83b.

Thus, the effect of (1-10) may be obtained. This also applies to the second element-side conductive portion 91.

(1-12) The first conductive portion 80 includes a first element-side joining portion 84 provided between the first protruding portion 81b and the first flat portion 83a to join the first protruding portion 81b and the first flat portion 83a, and a first electrode-side joining portion 85 provided between the second flat portion 83b and the first electrode 71 to join the second flat portion 83b and the first electrode 71. According to this configuration, by using the first element-side joining portion 84 and the first electrode-side joining portion 85, even when the height positions of the first protruding portion 81b and the first flat portion 83a are different and even when the height positions of the second flat portion 83b and the first electrode 71 are different, it is possible to electrically connect the first element-side conductive portion 81 and the first electrode 71.

(1-13) The electrodes 71 and 72 are arranged side by side in a y direction as a second direction at a position on the device back surface 12 deviated from the reflection film 60 in an x direction as a first direction when viewed in the z direction. The conductive portions 80 and 90 extend in the x direction while being arranged side by side in the y direction when viewed in the z direction. According to this configuration, since the conductive portions 80 and 90 are arranged side by side, the conductive portions 80 and 90 are close to each other. As a result, it is possible to increase the speed of the signals transmitted through the conductive portions 80 and 90. Therefore, it is possible to transmit and receive modulated signals at a high speed.

(1-14) The terahertz element 20 has an oscillation point P1 that oscillates an electromagnetic wave. The pads 33a and 34a are arranged to face each other and spaced apart in the y direction with the oscillation point P1 interposed therebetween. The pads 33a and 34a extend in the x direction orthogonal to the facing direction of the pads 33a and 34a. As a result, it is possible to increase the areas of the pads 33a and 34a while suppressing the interference between the pads 33a and 34a and the electromagnetic wave generated from the oscillation point P1.

In view of the fact that the pads 33a and 34a extend in the x direction, the element facing portions 81a and 91a extend in the x direction, and the bumps 82 and 92 are arranged in the x direction. This makes it possible to reduce an on-resistance.

(1-15) If the refractive index of the terahertz element 20 is defined as an element refractive index n1 and the refractive index of the encapsulating material 50 is defined as an encapsulating refractive index n2, then n1>n2>1. That is, the encapsulating refractive index n2 is higher than the refractive index of air. According to this configuration, the change in the refractive index at the boundary between the inside and outside of the terahertz element 20 can be reduced as compared with a case where the terahertz element 20 is surrounded by air. As a result, it is possible to suppress the excessive reflection of the electromagnetic wave at the boundary between the inside and outside of the terahertz element 20, thereby suppressing the generation of many resonance modes inside the terahertz element 20.

(1-16) The reflection film 60 is in an electrically floating state. According to this configuration, it is possible to suppress the problem that the electromagnetic wave is absorbed by the reflection film 60.

(1-17) The terahertz element 20 includes the element main surface 21 having an oscillation point P1 and the element back surface 22 which is a surface opposite to the element main surface 21. The terahertz element 20 is encapsulated by the encapsulating material 50 with the element main surface 21 facing the reflection film 60. According to this configuration, the electromagnetic wave generated from the oscillation point P1 propagates toward the reflection film 60 without passing through the terahertz element 20. Thus, the electromagnetic wave easily reaches the reflection film 60, whereby the electromagnetic wave can be suitably reflected by the reflection film 60. This makes it possible to further improve the gain.

(1-18) The reflection film 60 has a parabolic antenna shape. According to this configuration, the electromagnetic wave can be reflected in one direction. This makes it possible to improve the gain.

(1-19) The reflection film 60 is arranged so that the focal point of the reflection film 60 is located at the oscillation point P1. According to this configuration, the electromagnetic wave generated from the oscillation point P1 is guided in one direction by the reflection film 60. As a result, it is possible to reduce the electromagnetic wave which is not reflected in one direction by the reflection film 60. This makes it possible to improve the gain.

(1-20) The specified distance z1 which is the distance between the center point P2 of the reflection film 60 and the oscillation point P1 is set so as to satisfy the resonance condition of electromagnetic wave. Specifically, the specified distance z1 may be $(\lambda'_A/4)+((\lambda'_A/2)\times N)$ (where N is an integer of 0 or more: N=0, 1, 2, ... ). $\lambda'_A$ is, for example, $(1/n2)(c/fc)$ (where c is the speed of light, and fc is a central frequency of oscillation). This makes it possible to further improve the gain.

(1-21) An element reflection layer 35 configured to reflect the electromagnetic wave is formed on the element back surface 22 of the terahertz element 20. According to this configuration, it is possible to reduce the electromagnetic wave leaking to the upper side from the terahertz element 20 and to increase the output of the electromagnetic wave traveling from the terahertz element 20 to the reflection film 60. This makes it possible to further improve the gain.

Modifications of the First Embodiment

Modifications of the terahertz device 10 of the first embodiment will be described below. The following modifications may be applied to other embodiments, or may be combined with each other, as long as there is no technical contradiction.

Figure 25:
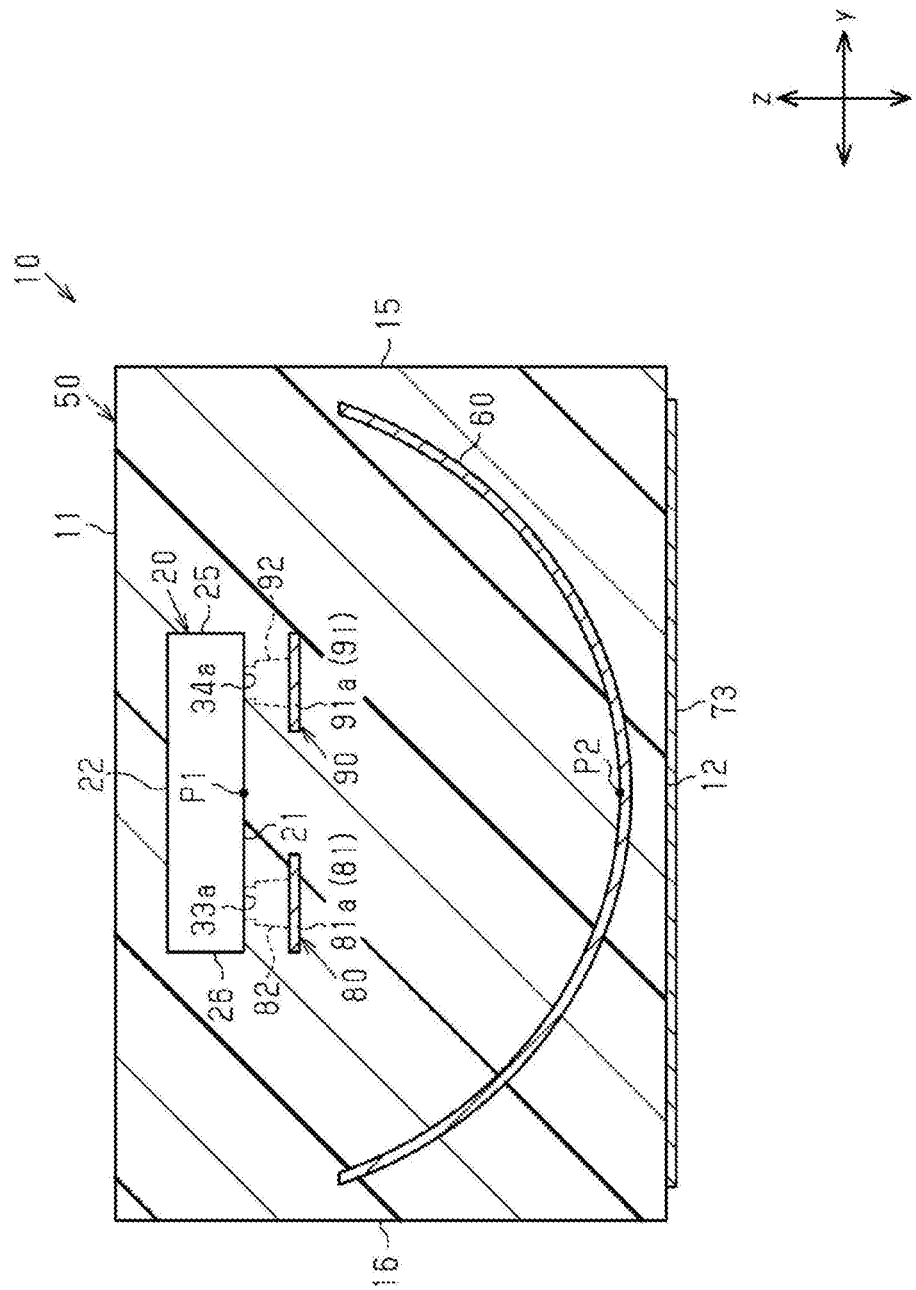
FIG. 25 is a cross-sectional view showing a modification of the terahertz device according to the first embodiment.

As shown in FIG. 25, the element reflection layer 35 may be omitted. In this case, the terahertz element 20 outputs electromagnetic waves to the upper and lower sides. That is, the terahertz element 20 may have a configuration having directivity with respect to the output of electromagnetic waves, or may have a configuration having no directivity.

Figure 26:
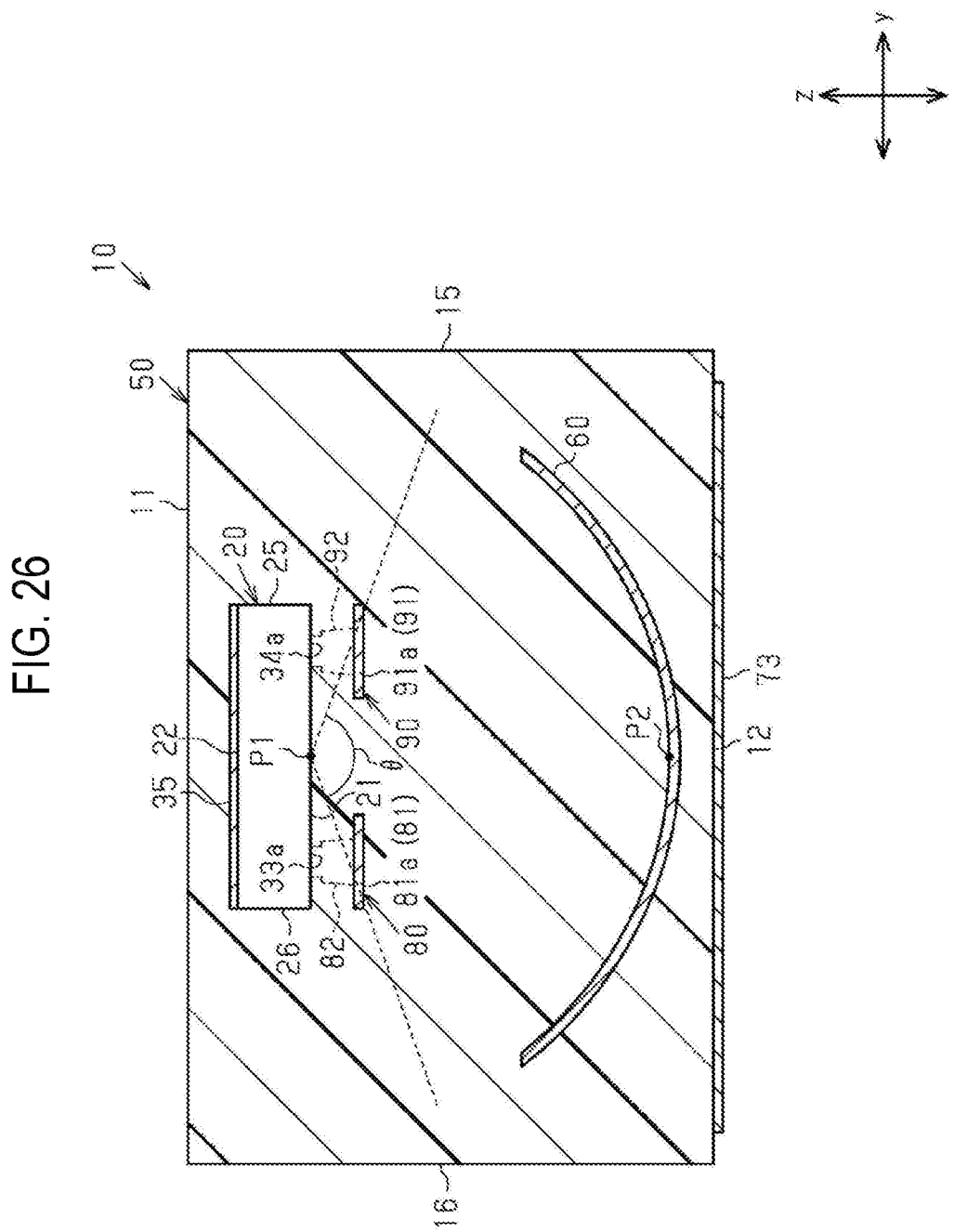
FIG. 26 is a cross-sectional view showing a modification of the terahertz device according to the first embodiment.

As shown in FIG. 26, in the configuration in which the terahertz element 20 radiates electromagnetic waves radially from the oscillation point P1 over the range of the opening angle θ, the reflection film 60 may be formed over an angular range of less than the opening angle θ with respect to the oscillation point P1. That is, the reflection film 60 may be configured to reflect a part of the electromagnetic wave generated from the terahertz element 20.

Figure 27:
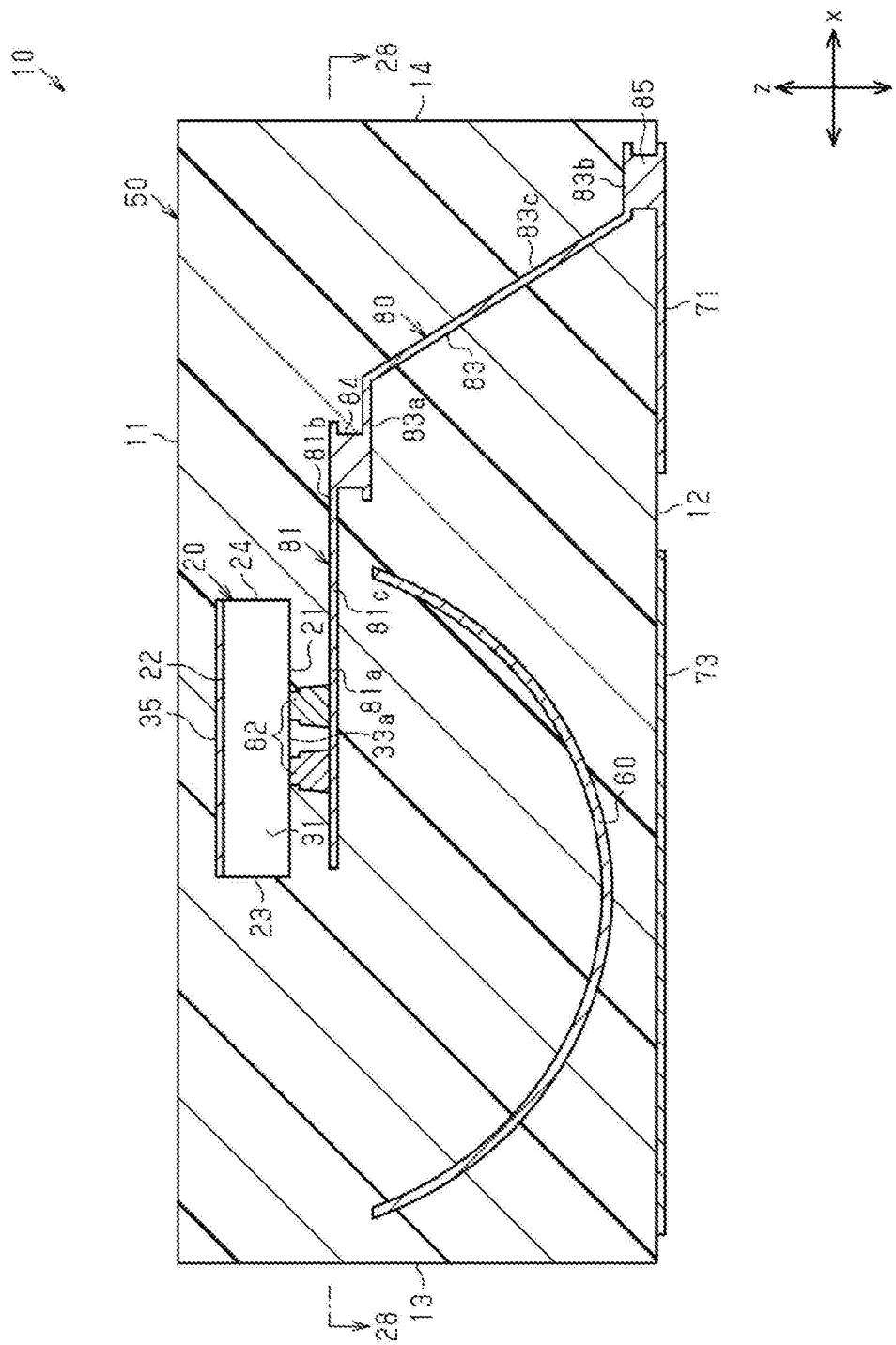
FIG. 27 is an end view showing a modification of the terahertz device according to the first embodiment.
Figure 28:
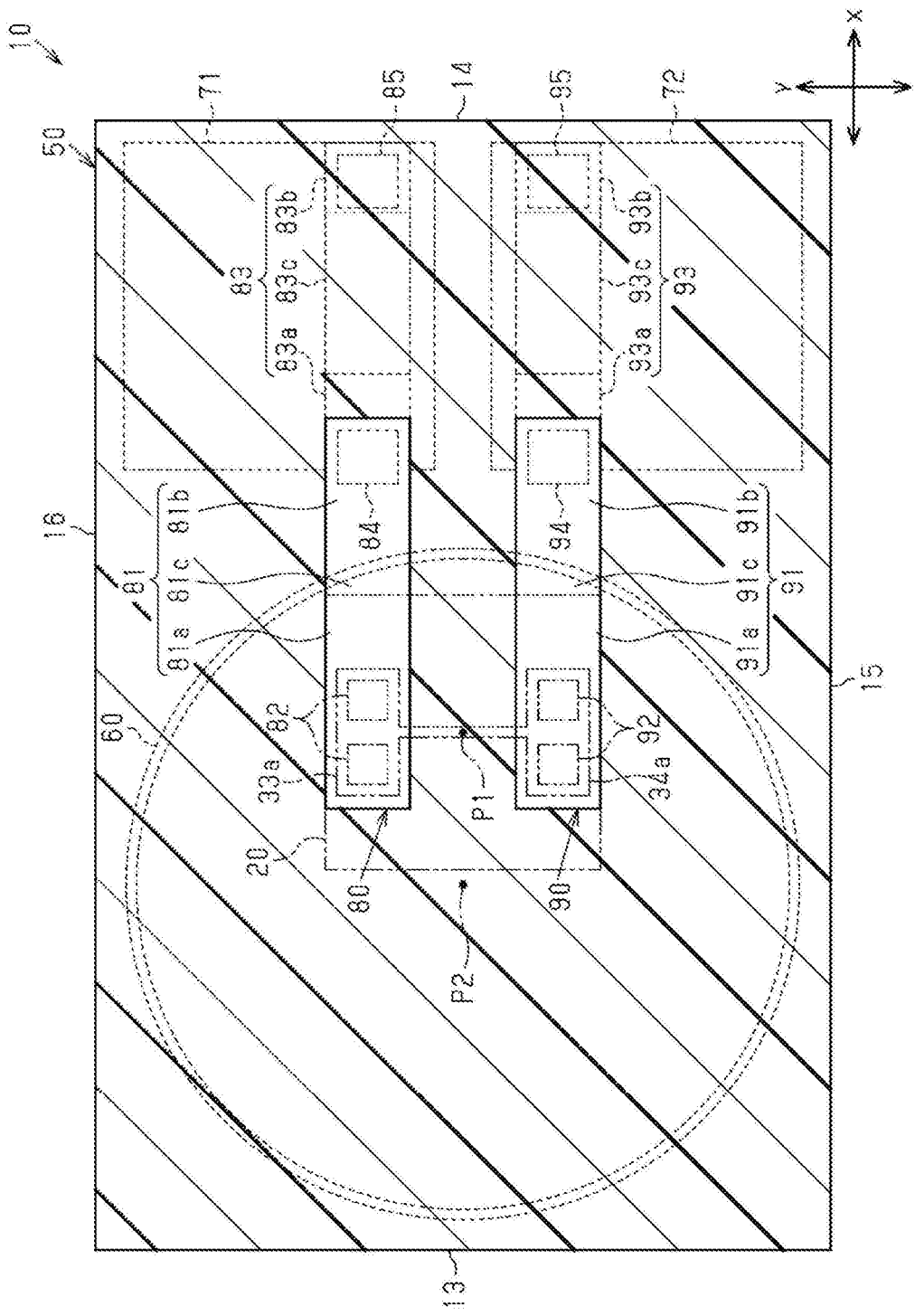
FIG. 28 is a cross-sectional view taken along line 28-28 in FIG. 27.

As shown in FIGS. 27 and 28, the terahertz element 20 may be arranged at a position where the oscillation point P1 is deviated from the center point P2 of the reflection film 60 when viewed in the z direction. That is, the focal point of the reflection film 60 may not coincide with the oscillation point P1.

In this case, the terahertz element 20 may be arranged so as to be biased toward, for example, the electrodes 71 and 72 (in other words, the protruding portions 81b and 91b). As a result, it is possible to shorten the lengths of the connection portions 81c and 91c. This makes it possible to suppress the blocking of the electromagnetic wave by the connection portions 81c and 91c.

Figure 29:
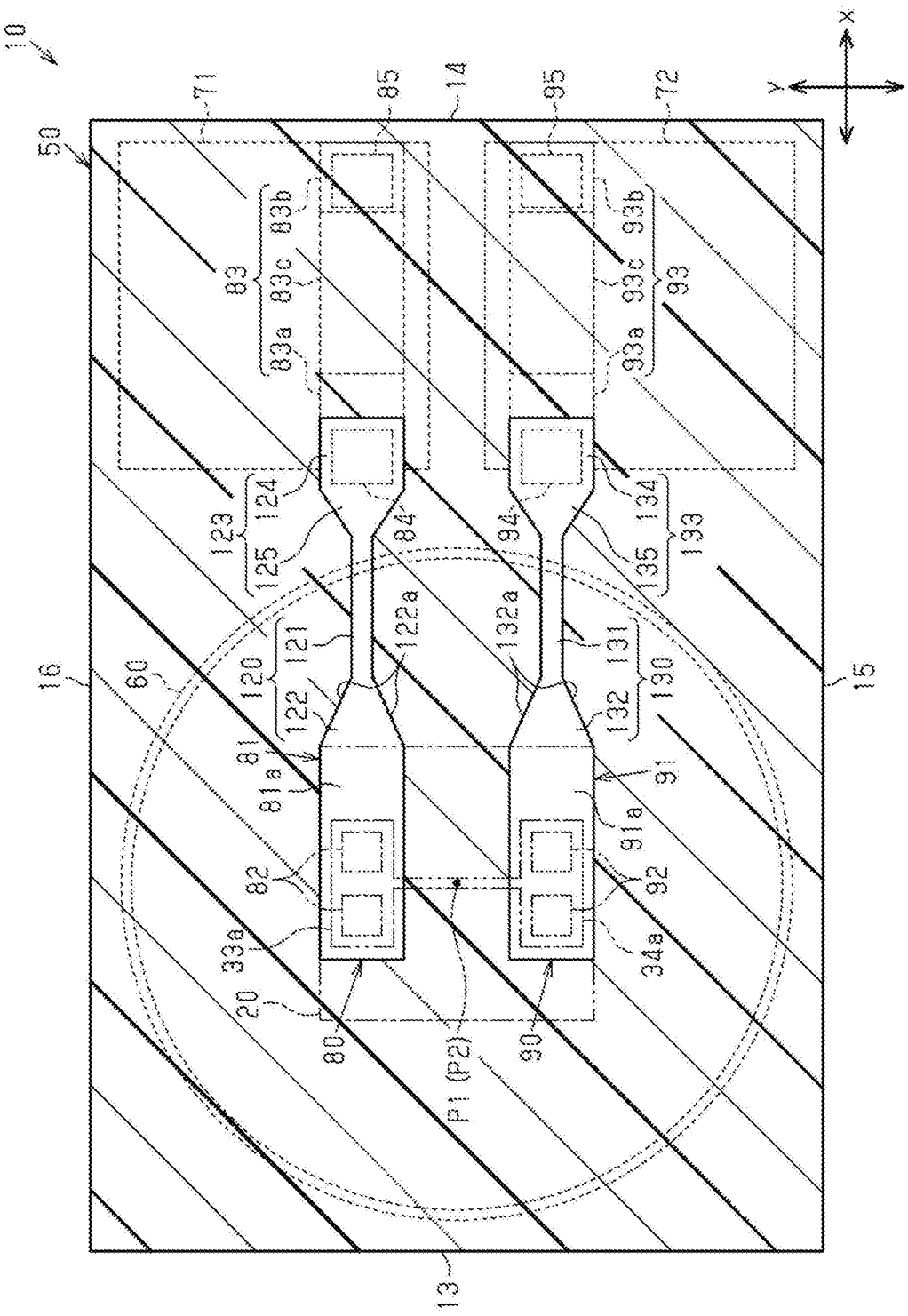
FIG. 29 is a cross-sectional view showing a modification of the terahertz device according to the first embodiment.
Figure 30:
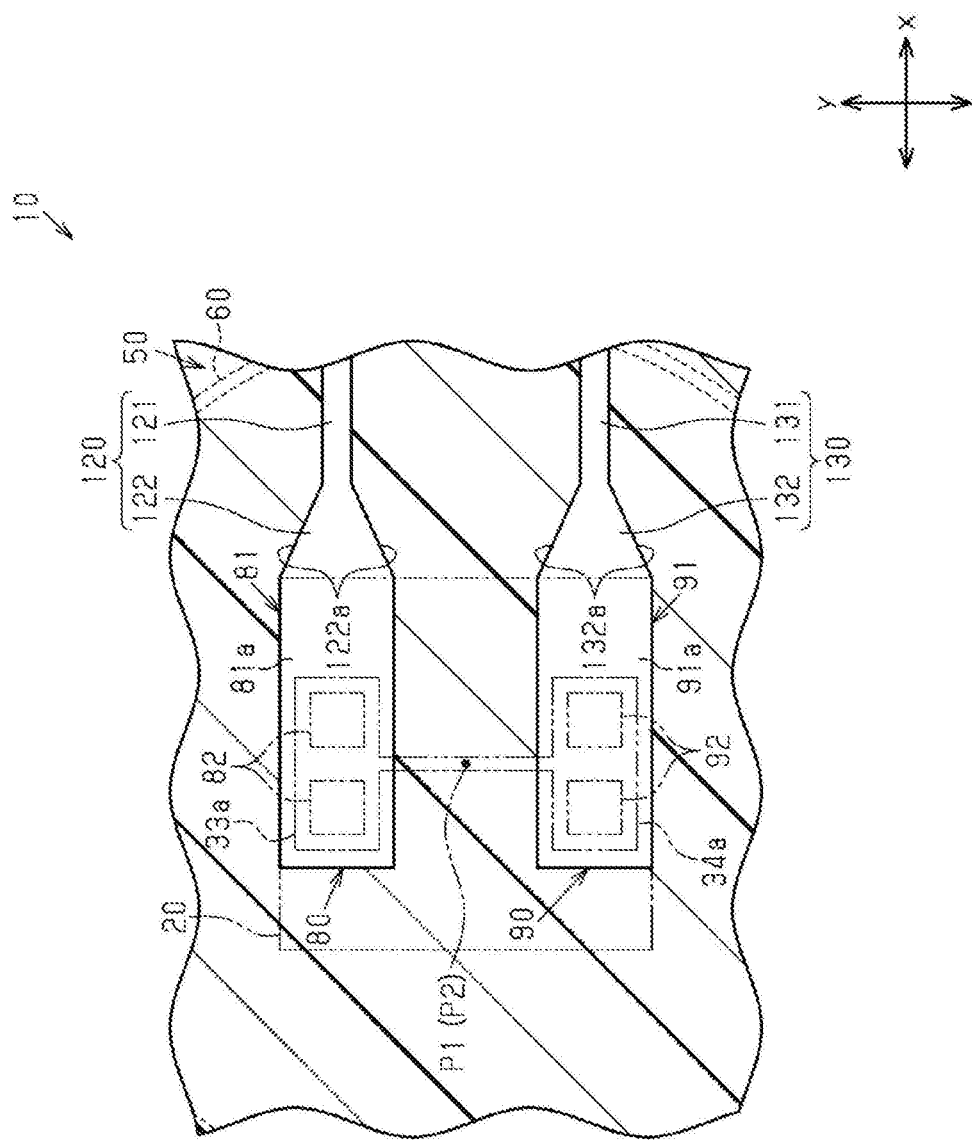
FIG. 30 is a partial enlarged view of FIG. 29.

As shown in FIGS. 29 and 30, the connection portions 120 and 130 extending in the x direction may be formed to be narrower in the y direction than the element facing portions 81a and 91a. That is, the lengths of the connection portions 120 and 130 in the y direction may be shorter than the lengths of the element facing portions 81a and 91a in the y direction. As a result, the propagation of the electromagnetic wave is less likely to be hindered by the connection portions 120 and 130. Therefore, it is possible to alleviate the blocking of the electromagnetic wave by the connection portions 120 and 130.

In addition, a portion of the connection portions 120 and 130 may have the same width as the element facing portions 81a and 91a. That is, at least a part of the connection portions 120 and 130 may be narrower than the element facing portions 81a and 91a.

Furthermore, the connection portions 120 and 130 may include connection body portions 121 and 131 formed to be narrower than the element facing portions 81a and 91a, and element-side tapered portions 122 and 132 configured to connect the connection body portions 121 and 131 and the element facing portions 81a and 91a. The element-side tapered portions 122 and 132 are formed so as to be gradually wider as they extend from the connection body portions 121 and 131 toward the element facing portions 81a and 91a. The element-side tapered portions 122 and 132 include a pair of element-side inclined surfaces 122a and 132a inclined so as to gradually become distant from each other as they extend from the connection body portions 121 and 131 toward the element facing portions 81a and 91a. According to this configuration, it is possible to reduce the reflected wave generated in the conductive portions 80 and 90.

In addition, the first protruding portion 123 of this modification may include a first overlapping portion 124 which is wider than the first connection portion 120 (first connection body portion 121) and which overlaps with the first element-side joining portion 84, and a first electrode-side tapered portion 125 formed so as to gradually widen from the first connection portion 120 toward the first overlapping portion 124. Thus, it is possible to reduce the reflected wave inside the first conductive portion 80 while securing the contact area with the first element-side joining portion 84.

Similarly, the second protruding portion 133 of this modification may include a second overlapping portion 134 which is wider than the second connection portion 130 (second connection body portion 131) and configured to overlap with the second element-side joining portion 94, and a second electrode-side tapered portion 135 formed so as to gradually widen from the second connection portion 130 toward the second overlapping portion 134.

At least one selected from the group of the first element-side tapered portion 122 and the first electrode-side tapered portion 125 may be omitted. Similarly, at least one of the second element-side tapered portion 132 and the second electrode-side tapered portion 135 may be omitted.

Figure 31:
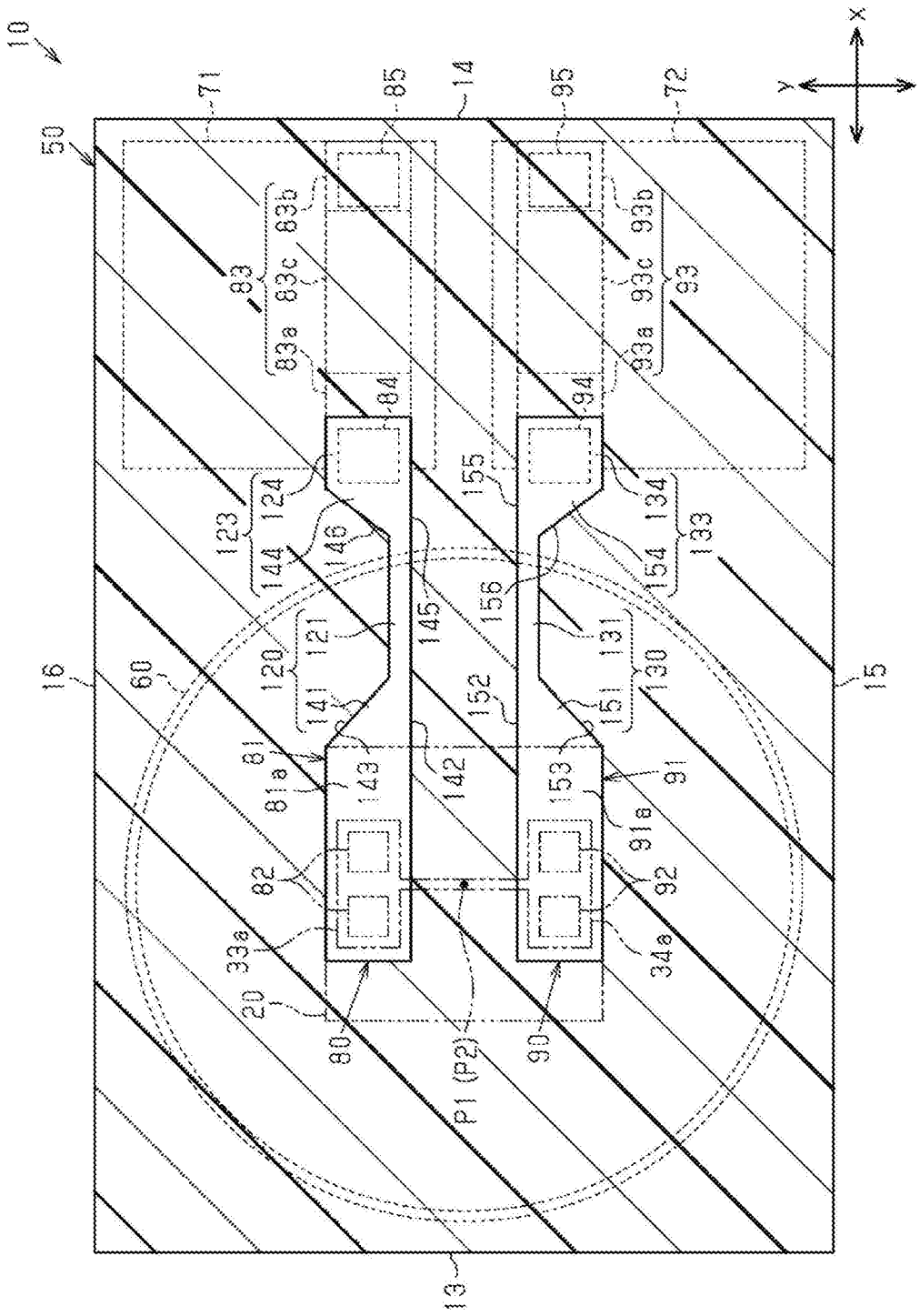
FIG. 31 is a cross-sectional view showing a modification of the terahertz device according to the first embodiment.
Figure 32:
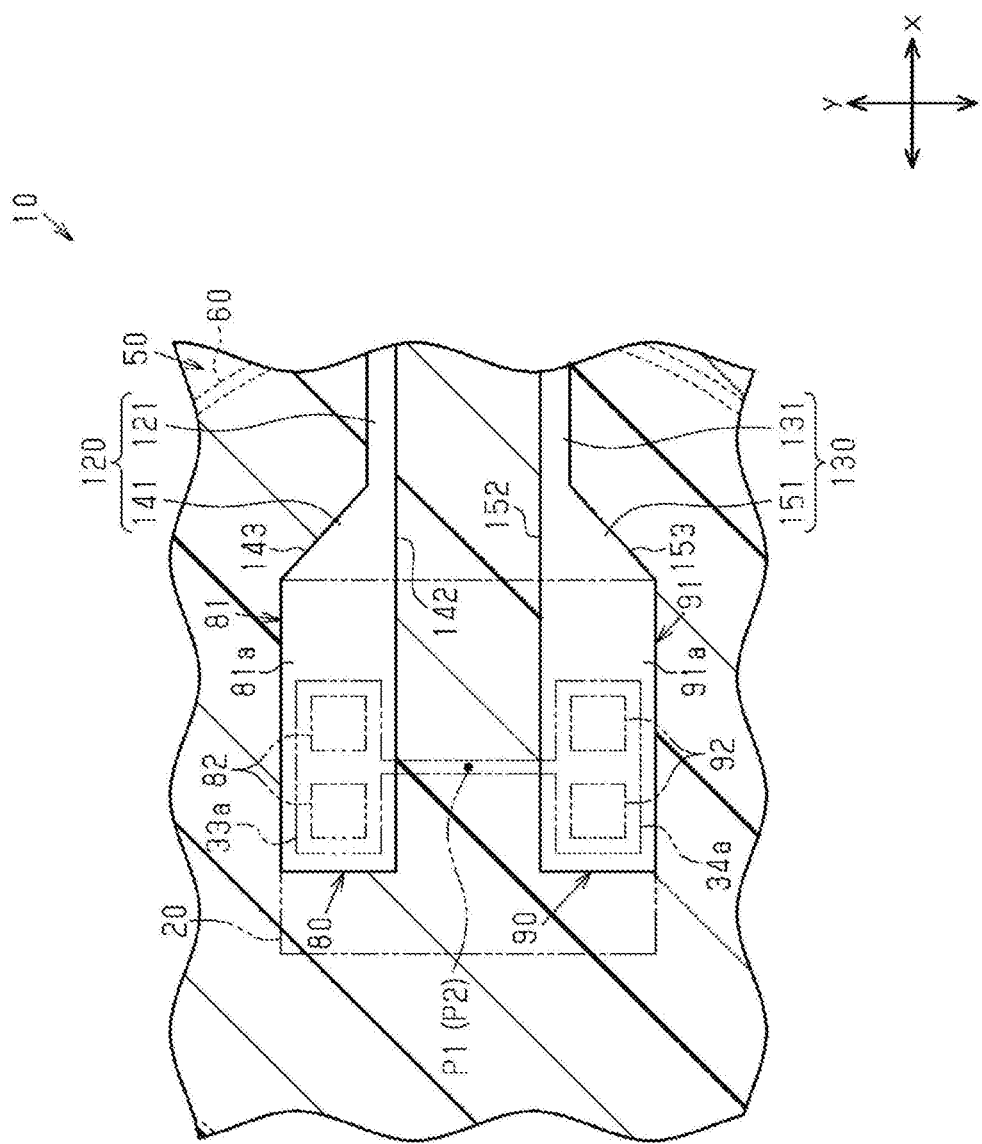
FIG. 32 is a partial enlarged view of FIG. 31.

Specific shapes of the element-side tapered portion and the electrode-side tapered portion may be arbitrarily changed. For example, as shown in FIGS. 31 and 32, the first element-side tapered portion 141 may have a one-sidetapered shape. Specifically, the first element-side tapered portion 141 may be configured to include a first element-side flat surface 142 orthogonal to the y direction, and a first element-side inclined surface 143 inclined so as to be spaced apart from the first element-side flat surface 142 as it extends from the first connection body portion 121 to the first element facing portion 81*a*.

In addition, the first electrode-side tapered portion 144 may be configured to include a first electrode-side flat surface 145 orthogonal to the y direction, and a first electrode-side inclined surface 146 inclined so as to be spaced apart from the first electrode-side flat surface 145 as it extends from the first connection body portion 121 to the first overlapping portion 124.

Similarly, the second element-side tapered portion 151 may have a one-side-tapered shape. Specifically, the second element-side tapered portion 151 may be configured to include a second element-side flat surface 152 orthogonal to the y direction, and a second element-side inclined surface 153 inclined so as to be spaced apart from the second element-side flat surface 152 as it extends from the second connection body portion 131 to the second element facing portion 91*a*.

Furthermore, the second electrode-side tapered portion 154 may be configured to include a second electrode-side flat surface 155 orthogonal to they direction, and a second electrode-side inclined surface 156 inclined so as to be spaced apart from the second electrode-side flat surface 155 as it extends from the second connection body portion 131 to the second overlapping portion 134.

As shown in FIG. 31, the first element-side flat surface 142 and the second element-side flat surface 152 face each other in they direction, and the first electrode-side flat surface 145 and the second electrode-side flat surface 155 face each other in they direction. As a result, the spaced-apart distance between the element-side conductive portions 81 and 91 in they direction is constant.

Figure 33:
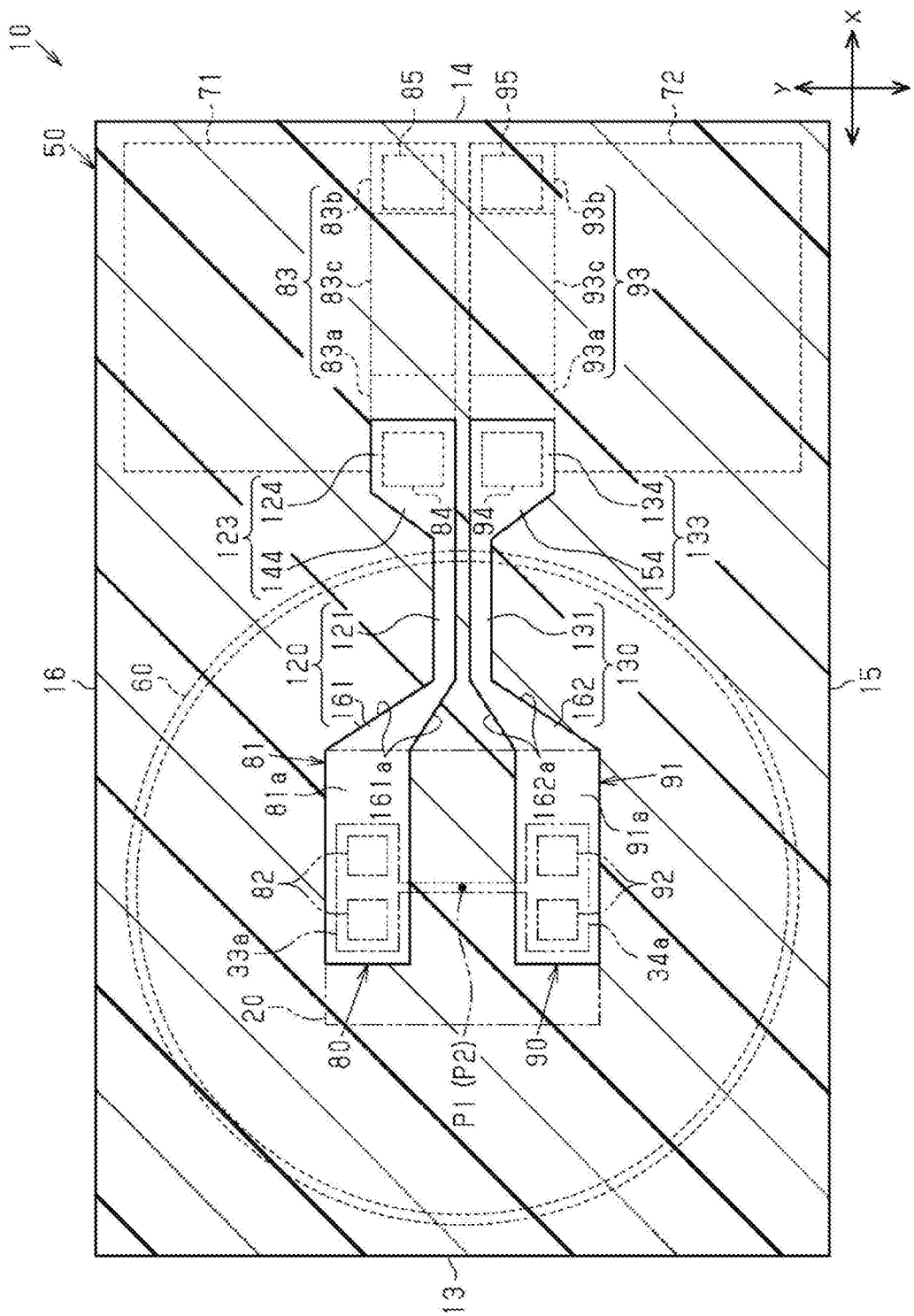
FIG. 33 is a cross-sectional view showing a modification of the terahertz device according to the first embodiment.
Figure 34:
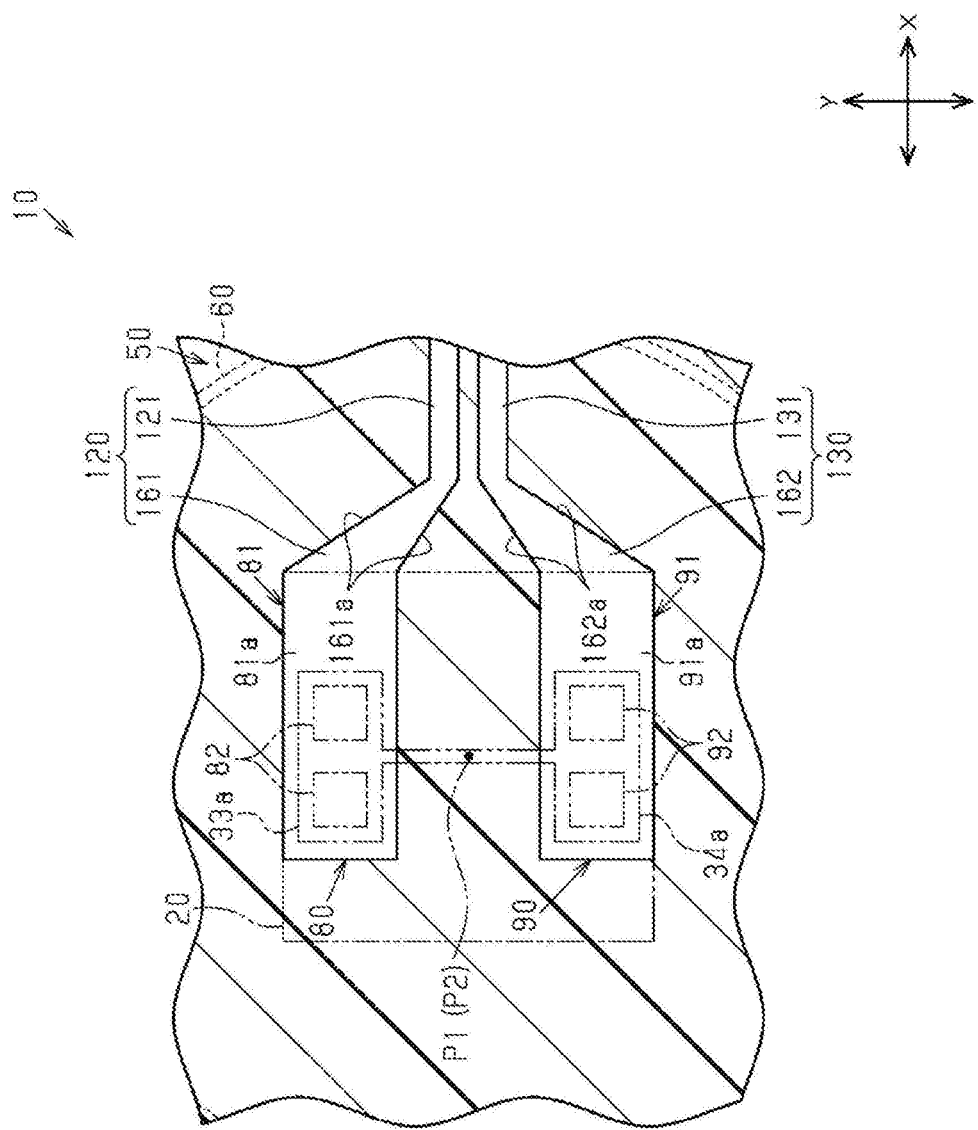
FIG. 34 is a partial enlarged view of FIG. 33.

As shown in FIGS. 33 and 34, the connection body portions 121 and 131 may be arranged closer to each other than the element facing portions 81*a* and 91*a*. That is, the facing distance between the connection body portions 121 and 131 may be shorter than the facing distance between the element facing portions 81*a* and 91*a*. In this case, the element-side tapered portions 161 and 162 may be inclined so as to be gradually spaced apart from each other as they extend from the connection body portions 121 and 131 toward the element facing portions 81*a* and 91*a*. As a result, it is possible to further increase the speed of the signals transmitted through the conductive portions 80 and 90.

In this case, the first element-side inclined surfaces 161*a* of the first element-side tapered portion 161 are inclined in the same direction and have different inclination angles such that they gradually widen toward the first element facing portion 81*a*. Furthermore, the second element-side inclined surfaces 162*a* of the second element-side tapered portion 162 are inclined in the direction opposite to the first element-side inclined surfaces 161*a* and have different inclination angles such that they gradually widen toward the second element facing portion 91*a*.

Figure 35:
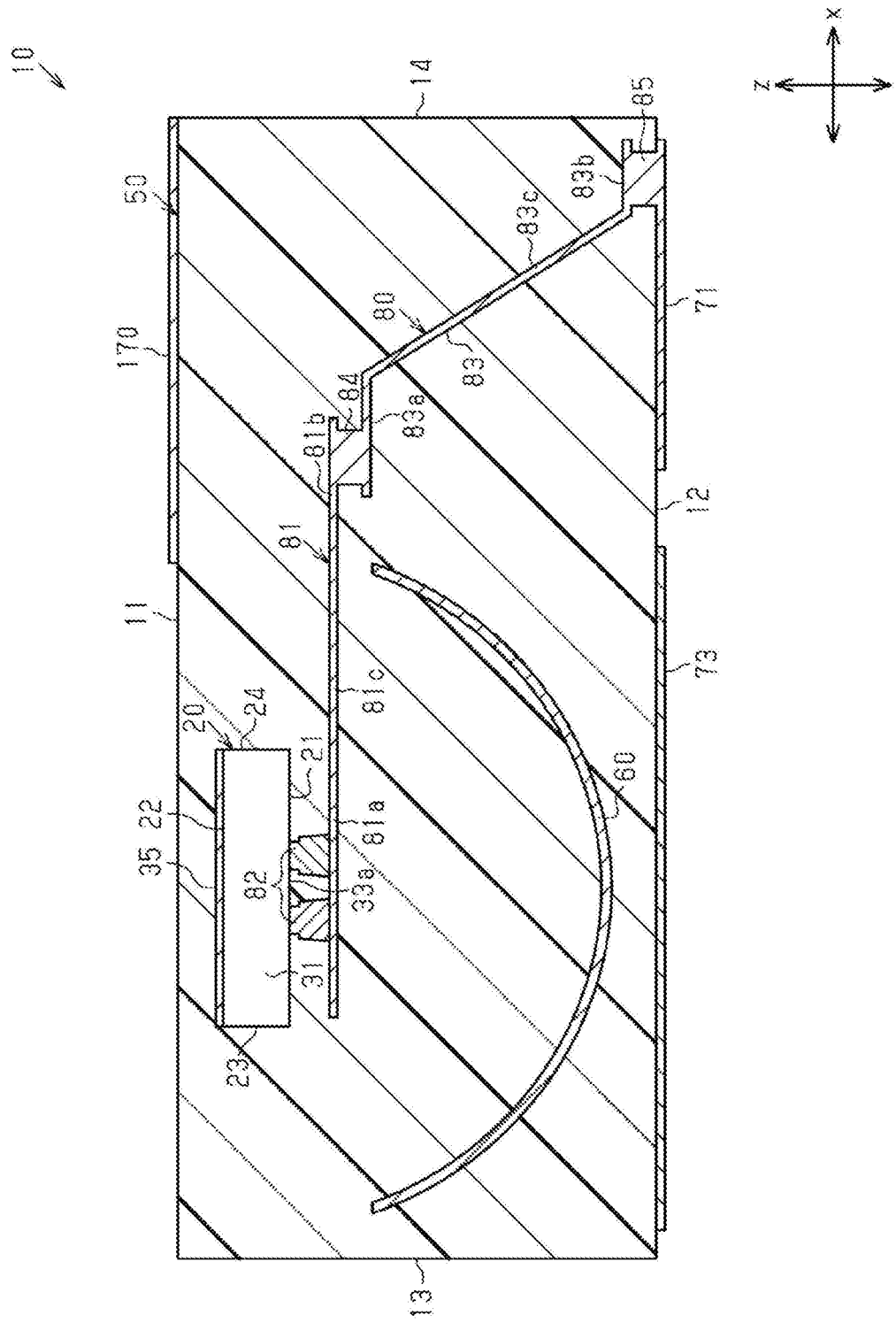
FIG. 35 is an end view showing a modification of the terahertz device according to the first embodiment.

As shown in FIG. 35, the terahertz device 10 may include a reflection reduction film 170 formed on the device main surface 11. The reflection reduction film 170 may be called an antireflection film or an AR coating film.

The reflection reduction film 170 may be formed, for example, in a portion of the device main surface 11 that overlaps with the conductive portions 80 and 90 or the electrodes 71 and 72 but does not overlap with the reflection film 60 when viewed in the z direction. As a result, it is possible to suppress the generation of a standing wave due to the electromagnetic wave being reflected by the conductive portions 80 and 90 or the electrodes 71 and 72. The specific configuration of the reflection reduction film 170 may be arbitrarily changed as long as it can reduce the reflection of at least an electromagnetic wave in a terahertz band.

Second Embodiment

A terahertz device 10 according to a second embodiment will be described with reference to FIGS. 36 to 40. In the following description, the same components as those of the terahertz device 10 of the first embodiment will be designated by like reference numerals, and the description thereof will be omitted in some cases.

Figure 36:
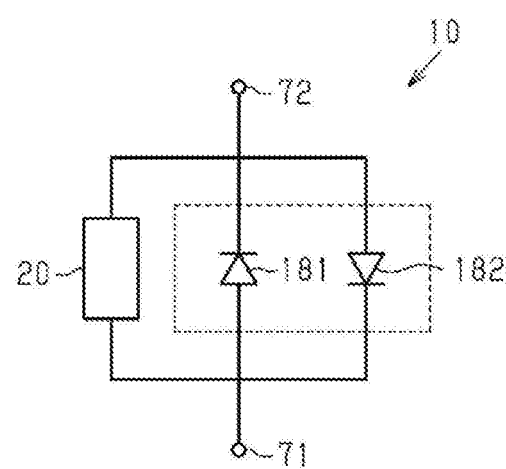
FIG. 36 is a circuit diagram showing an outline of a terahertz device according to a second embodiment.

As shown in FIG. 36, the terahertz device 10 of the present embodiment includes protection diodes 181 and 182 as an example of the specific element electrically connected to the terahertz element 20. The protection diodes 181 and 182 are electrically connected to the terahertz element 20. In the present embodiment, the protection diodes 181 and 182 are connected in parallel to the terahertz element 20. The protection diodes 181 and 182 are connected to the terahertz element 20 in opposite directions. The protection diodes 181 and 182 may be Zener diodes, Schottky diodes, or light-emitting diodes in addition to ordinary diodes.

The specific element is not limited to the protection diodes 181 and 182, but may be a control IC (e.g., an ASIC). The control IC may perform, for example, detection of a current flowing through the terahertz element 20, supply of power to the terahertz element 20 and an amplifier, signal processing, or the like. In addition, the connection between the specific element and the terahertz element 20 may be arbitrarily changed, and may be, for example, serial connection.

Figure 37:
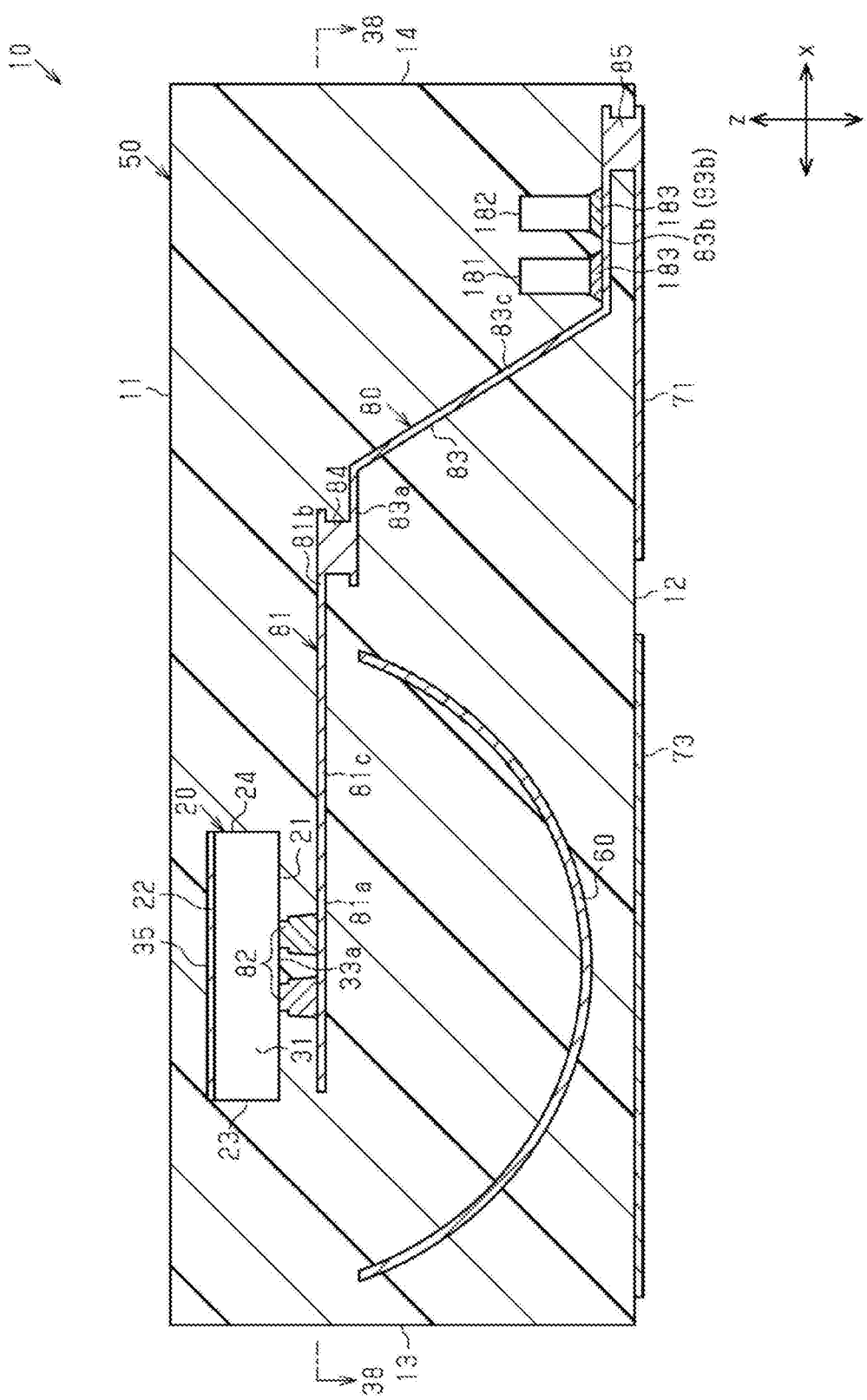
FIG. 37 is an end view for explaining the cross-sectional structure of the terahertz device according to the second embodiment.

As shown in FIG. 37, the protection diodes 181 and 182 are provided inside the encapsulating material 50. That is, the encapsulating material 50 encapsulates both the protection diodes 181 and 182 and the terahertz element 20.

The protection diodes 181 and 182 are arranged at positions where they do not overlap with the reflection film 60 when viewed in the z direction. Specifically, the protection diodes 181 and 182 are provided on the second flat portions 83*b* and 93*b* of the electrode-side conductive portions 83 and 93. Accordingly, it is possible to prevent the propagation (output) of the electromagnetic wave reflected by the reflection film 60 from being obstructed by the protection diodes 181 and 182.

In the present embodiment, the second flat portions 83*b* and 93*b* extend in the x direction by a length larger than the length of the first flat portions 83*a* and 93*a* of the electrode-side conductive portions 83 and 93. Furthermore, the protection diodes 181 and 182 are arranged so as to be displaced in the x direction so that the protection diodes 181 and 182 do not overlap with the electrode-side joining portions 85 and 95 when viewed in the z direction. However, the present disclosure is not limited thereto. At least one selected from the group of the protection diodes 181 and 182 may overlap with the electrode-side joining portions 85 and 95.

Figure 38:
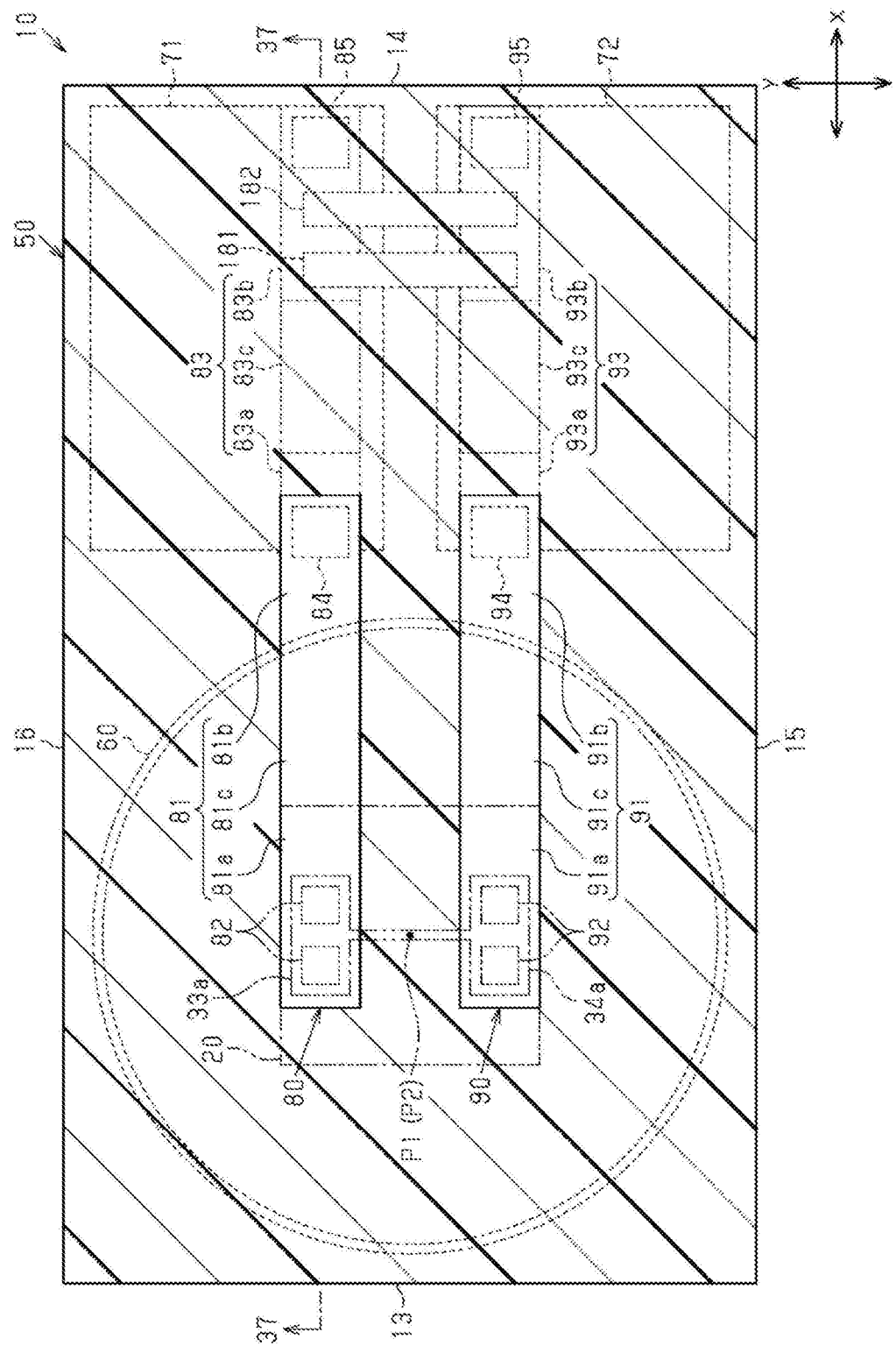
FIG. 38 a cross-sectional view taken along line 38-38 in FIG. 37.

As shown in FIGS. 37 and 38, the protection diodes 181 and 182 according to the present embodiment are arranged to straddle the electrode-side conductive portions 83 and 93, and are electrically connected to the electrode-side conductive portions 83 and 93 by the conductive joining material 183. For example, one of the anode electrode and the cathode electrode of the first protection diode 181 is connected to the first electrode-side conductive portion 83, and the other is connected to the second electrode-side conductive portion 93. The anode electrode and the cathode electrode of the second protection diode 182 are connected to the electrode-side conductive portions 83 and 93 so as to have reverse connection with respect to the first protection diode 181. The specific material of the conductive joining material 183 is arbitrary and may be solder or the like.

Next, a method of manufacturing the terahertz device 10 according to the present embodiment will be described. The method for manufacturing the terahertz device 10 according to the present embodiment includes a step of mounting the protection diodes 181 and 182, which is performed between the step of forming the joining portions 84, 85, 94 and 95 and the second encapsulating step.

Figure 39:
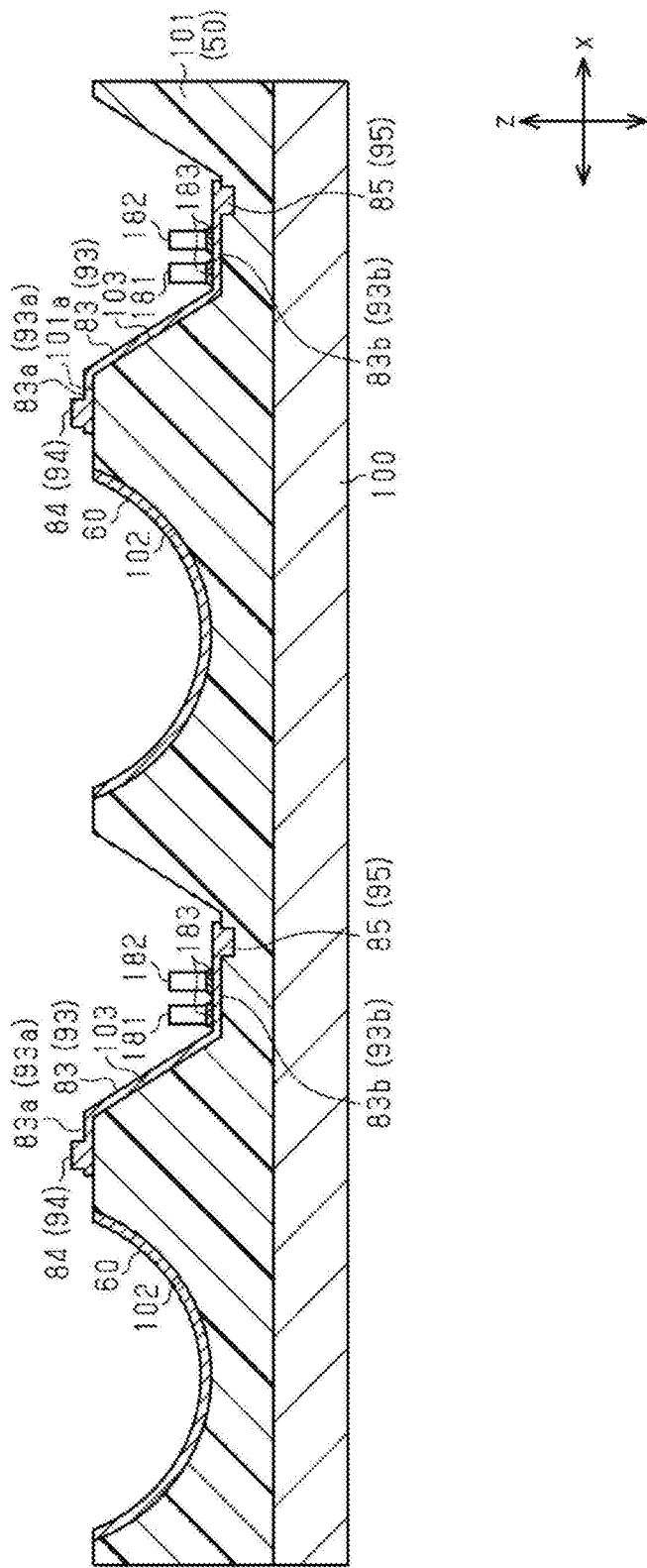
FIG. 39 is an end view showing one step of a method of manufacturing the terahertz device according to the second embodiment.
Figure 40:
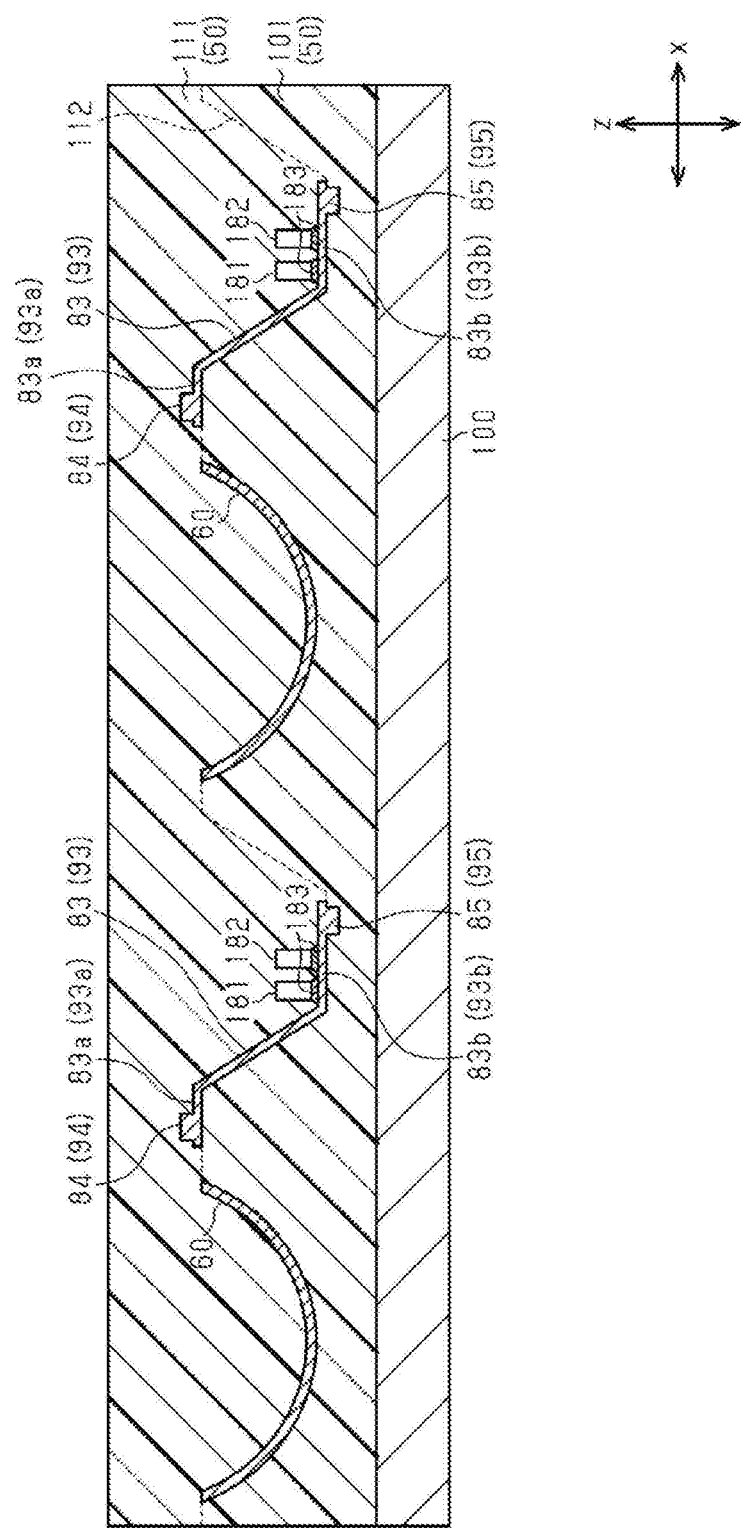
FIG. 40 is an end view showing one step of the method of manufacturing the terahertz device according to the second embodiment.

Specifically, as shown in FIG. 39, the protection diodes 181 and 182 are mounted on the second flat portions 83*b* and 93*b* of the electrode-side conductive portions 83 and 93. As shown in FIG. 40, in the second encapsulating step, the second encapsulating layer 111 is formed for each of the protection diodes 181 and 182. As a result, the protection diodes 181 and 182 are encapsulated by the encapsulating material 50.

According to the present embodiment described above, the following effects may be obtained.

(2-1) The terahertz device 10 includes protection diodes 181 and 182 connected in parallel to the terahertz element 20. According to this configuration, for example, when a high voltage is applied to both ends of the terahertz element 20 due to static electricity or the like, it becomes possible to allow a current to flow through the protection diodes 181 and 182. Thus, it is possible to prevent an excessive current from flowing through the terahertz element 20, which makes it possible to protect the terahertz element 20.

(2-2) The protection diodes 181 and 182 are connected to the terahertz element 20 in directions opposite to each other. According to this configuration, the terahertz element 20 can be protected even when a high voltage is generated in any direction.

(2-3) The protection diodes 181 and 182 are arranged so as not to overlap with the reflection film 60 when viewed in the z direction. According to this configuration, it is possible to prevent the electromagnetic wave reflected by the reflection film 60 from being blocked by the protection diodes 181 and 182.

(2-4) The electrode-side conductive portions 83 and 93 are provided side by side in the y direction, and the protection diodes 181 and 182 are arranged to straddle the second flat portions 83*b* and 93*b* of the electrode-side conductive portions 83 and 93. As a result, the protection diodes 181 and 182 and the electrode-side conductive portions 83 and 93 can be electrically connected with ease.

Third Embodiment

A terahertz device 10 according to a third embodiment will be described with reference to FIGS. 41 and 42. In the following description, the same components as those of the terahertz device 10 of the first embodiment will be designated by like reference numerals, and the description thereof will be omitted in some cases.

Figure 41:
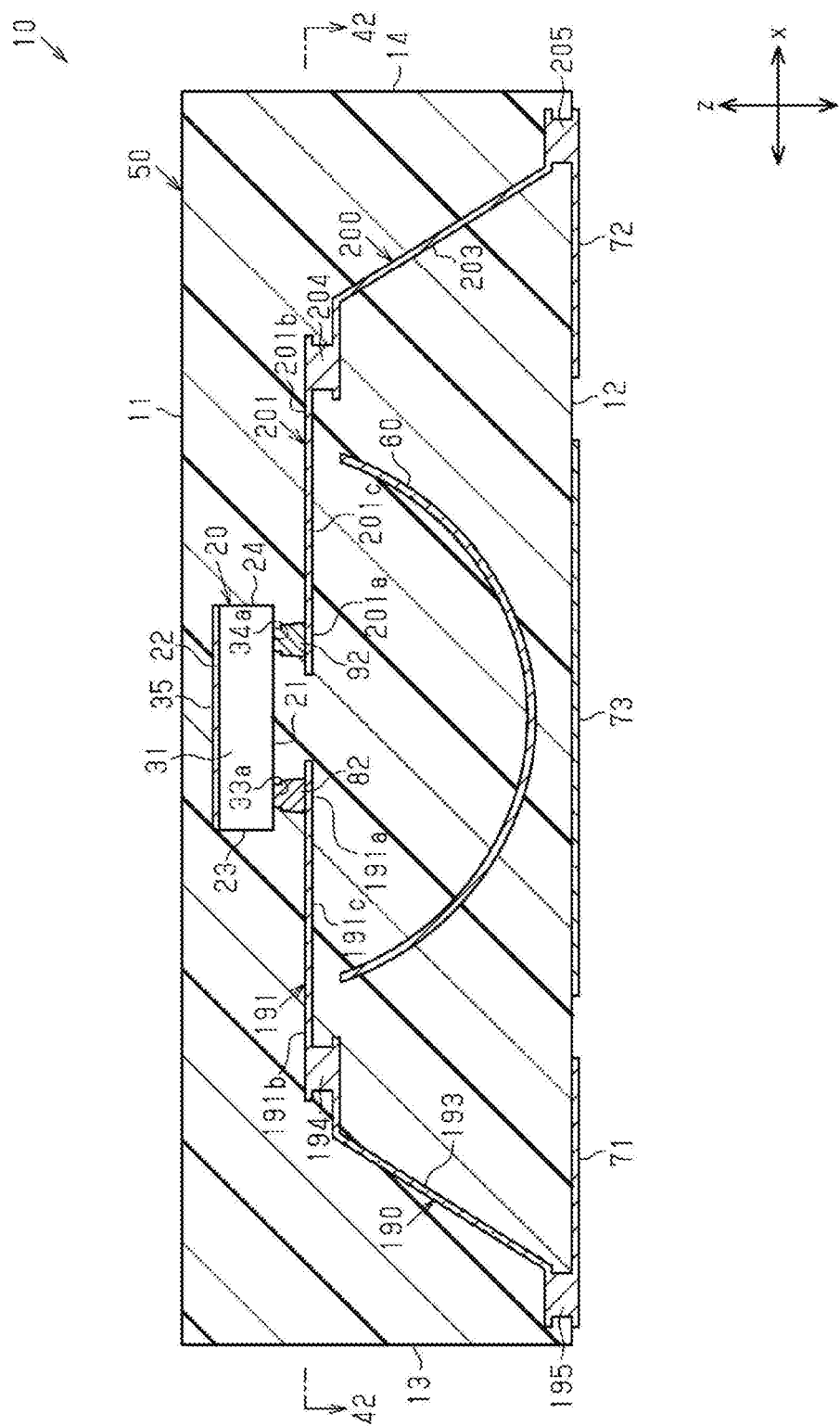
FIG. 41 is an end view for explaining a cross-sectional structure of a terahertz device according to a third embodiment.
Figure 42:
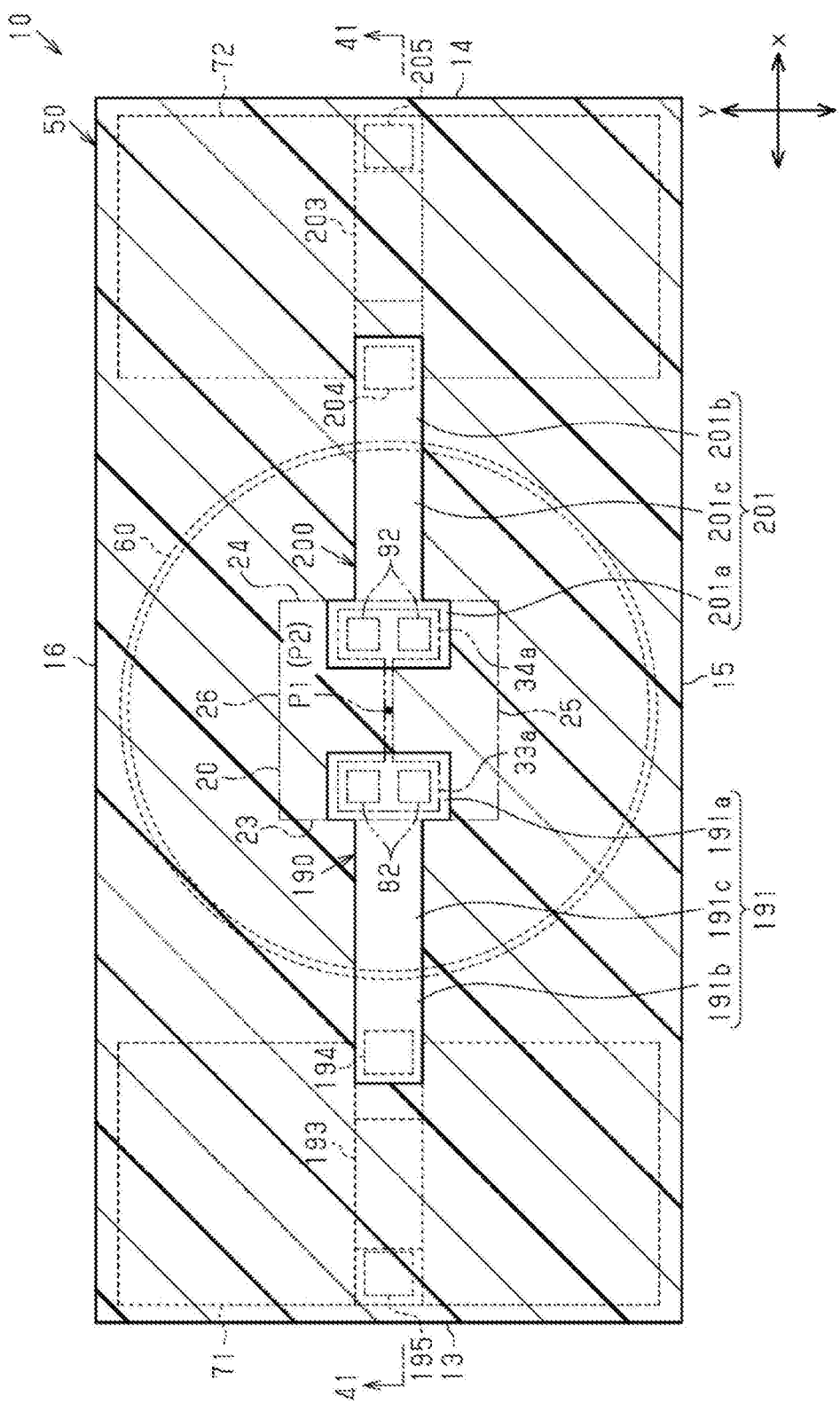
FIG. 42 is a cross-sectional view taken along line 42-42 in FIG. 41.

As shown in FIGS. 41 and 42, the electrodes 71 and 72 of the present embodiment are provided on both sides of the reflection film 60 in the x direction on the device back surface 12 when viewed in the z direction. Specifically, the terahertz element 20 and the reflection film 60 according to the present embodiment are arranged in the central portion of the encapsulating material 50 in the x direction. A heat dissipation electrode 73 is formed on the device back surface 12 at a position overlapping with the reflection film 60 when viewed in the z direction. The electrodes 71 and 72 are arranged on both sides of the heat dissipation electrode 73 in the x direction.

As shown in FIG. 42, the pads 33*a* and 34*a* of the present embodiment are arranged to face each other in the x direction with the oscillation point P1 interposed therebetween. The pads 33*a* and 34*a* are spaced apart in the x direction. The first pad 33*a* is arranged closer to the first element side surface 23 than to the oscillation point P1, and the second pad 34*a* is arranged closer to the second element side surface 24 than to the oscillation point P1. The pads 33*a* and 34*a* have a shape (e.g., a rectangular shape) whose longitudinal direction is they direction and whose lateral direction is the x direction.

The conductive portions 190 and 200 of the present embodiment extend in the x direction from the terahertz element 20 so as to be spaced apart from each other when viewed in the z direction. Specifically, the first conductive portion 190 extends in the x direction from the terahertz element 20 toward the first electrode 71 when viewed in the z direction, and the second conductive portion 200 extends from the terahertz element 20 in the direction opposite to the direction facing the first electrode 71 when viewed in the z direction. The conductive portions 190 and 200 are not arranged side by side in the y direction, but are arranged to be displaced by 180°. The conductive portions 190 and 200 are arranged symmetrically with respect to the oscillation point P1 in the x direction.

As shown in FIGS. 41 and 42, similar to the first embodiment, the conductive portions 190 and 200 of the present embodiment include element-side conductive portions 191 and 201, electrode-side conductive portions 193 and 203, the element-side joining portions 194 and 204, and the electrode-side joining portions 195 and 205. The element-side conductive portions 191 and 201 include element facing portions 191*a* and 201*a*, protruding portions 191*b* and 201*b*, and connection portions 191*c* and 201*c*.

The element facing portions 191*a* and 201*a* of the present embodiment have a shape (e.g., a rectangular shape) whose longitudinal direction is the y direction and whose lateral direction is the x direction. The bumps 82 and 92 are provided between the element facing portions 191*a* and 201*a* and the pads 33*a* and 34*a*, and are arranged in they direction.

At least a portion of the connection portions 191*c* and 201*c* of the present embodiment is formed narrower than the element facing portions 191*a* and 201*a*. That is, the length of the connection portions 191*c* and 201*c* in they direction is shorter than the length of the element facing portions 191*a* and 201*a* in they direction.

The protruding portions 191*b* and 201*b* of the present embodiment are formed to have the same width as the connection portions 191*c* and 201*c*. However, the present disclosure is not limited thereto. The protruding portions 191*b* and 201*b* may be formed wider than the connection portions 191*c* and 201*c* like the element facing portions 191*a* and 201*a*, or at least a portion of the protruding portions 191*b* and 201*b* may be formed narrower than the connection portions 191*c* and 201*c*.

The second electrode-side conductive portion 203, the second element-side joining portion 204, and the second electrode-side joining portion 205 of the present embodiment are arranged symmetrically with respect to the first electrode-side conductive portion 193, the first element-side joining portion 194, and the first electrode-side joining portion 195. The specific configurations of the electrode-side conductive portions 193 and 203, the element-side joining portions 194 and 204, and the electrode-side joining portions 195 and 205 according to the present embodiment are the same as the corresponding configurations in the first embodiment. Therefore, the detailed description thereof is omitted.

According to the present embodiment described above, the following effects may be obtained.

(3-1) The electrodes 71 and 72 are provided on both sides of the reflection film 60 in the x direction on the device back surface 12 when viewed in the z direction. The conductive portions 190 and 200 extend from the terahertz element 20 so as to be spaced apart from each other when viewed in the z direction, and are arranged symmetrically with respect to the oscillation point P1 in the x direction. As a result, it is possible to suppress the adverse effect on the radiation mode of the electromagnetic wave due to the asymmetry of the conductive portions 80 and 90.

(3-2) The first pad 33a and the first element facing portion 81a extend in they direction, and the first bumps 82 are arranged in the y direction. Similarly, the second pad 34a and the second element facing portion 91a extend in the y direction, and the second bumps 92 are arranged in the y direction. As a result, it is possible to increase the contact area and to reduce the on-resistance.

In a configuration in which the pads 33a and 34a are provided so as to be spaced apart from each other in the x direction with the oscillation point P1 interposed therebetween, if the pads 33a and 34a are caused to extend in the x direction, the spaced-apart distance between the pads 33a and 34a is reduced and a short circuit may occur. There is a problem that the propagation of the electromagnetic wave may be hindered due to interference between the oscillation point P1 and the pads 33a and 34a. However, in the present embodiment, the pads 33a and 34a extend in the y direction, which is a direction orthogonal to the facing direction. Therefore, it is possible to suppress the aforementioned problem.

Modifications of the Third Embodiment

Modifications of the terahertz device 10 of the third embodiment will be described below. The following modifications may be applied to other embodiments, or may be combined with each other, as long as there is no technical contradiction.

Figure 43:
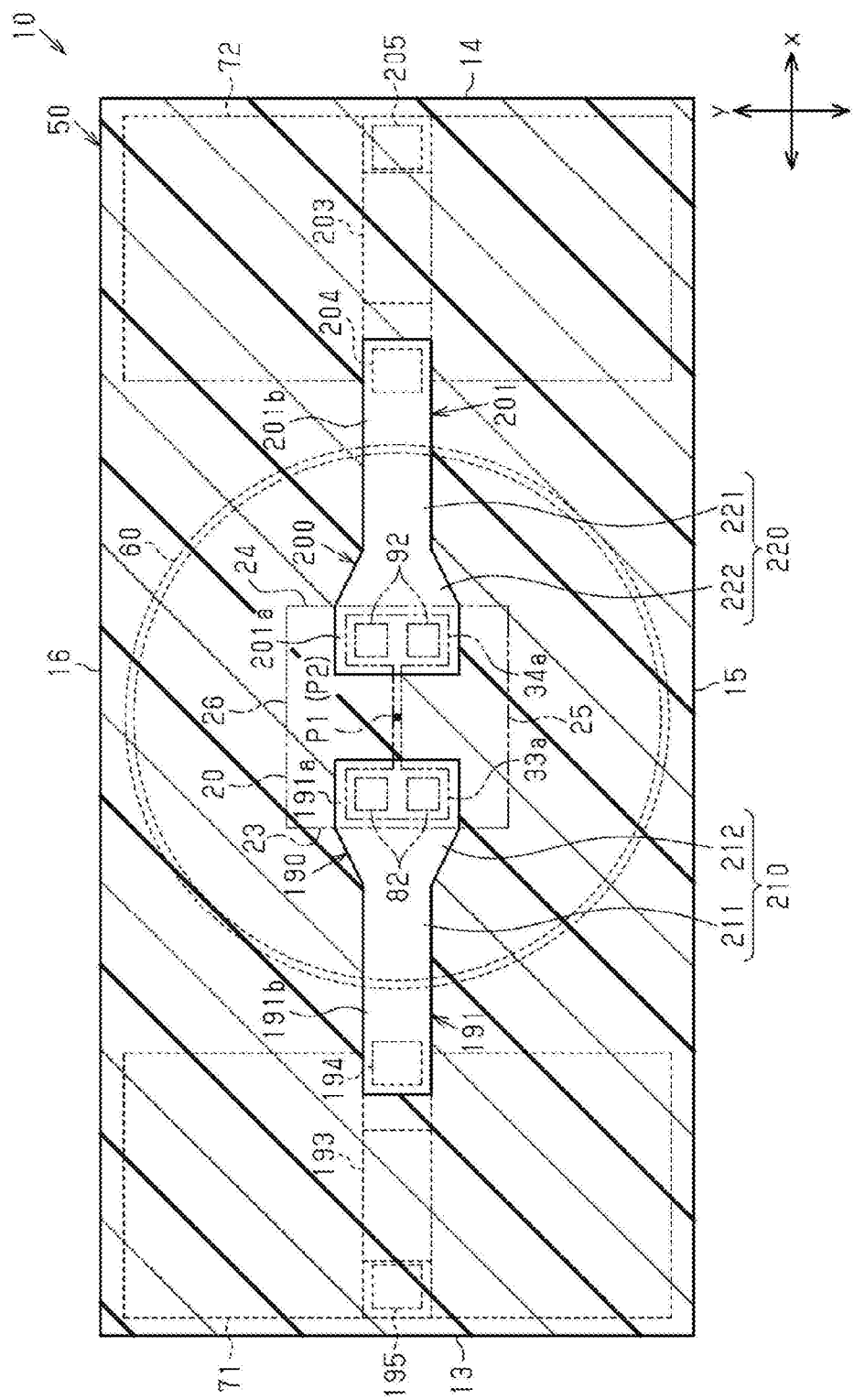
FIG. 43 is a cross-sectional view showing a modification of the terahertz device according to the third embodiment.
Figure 44:
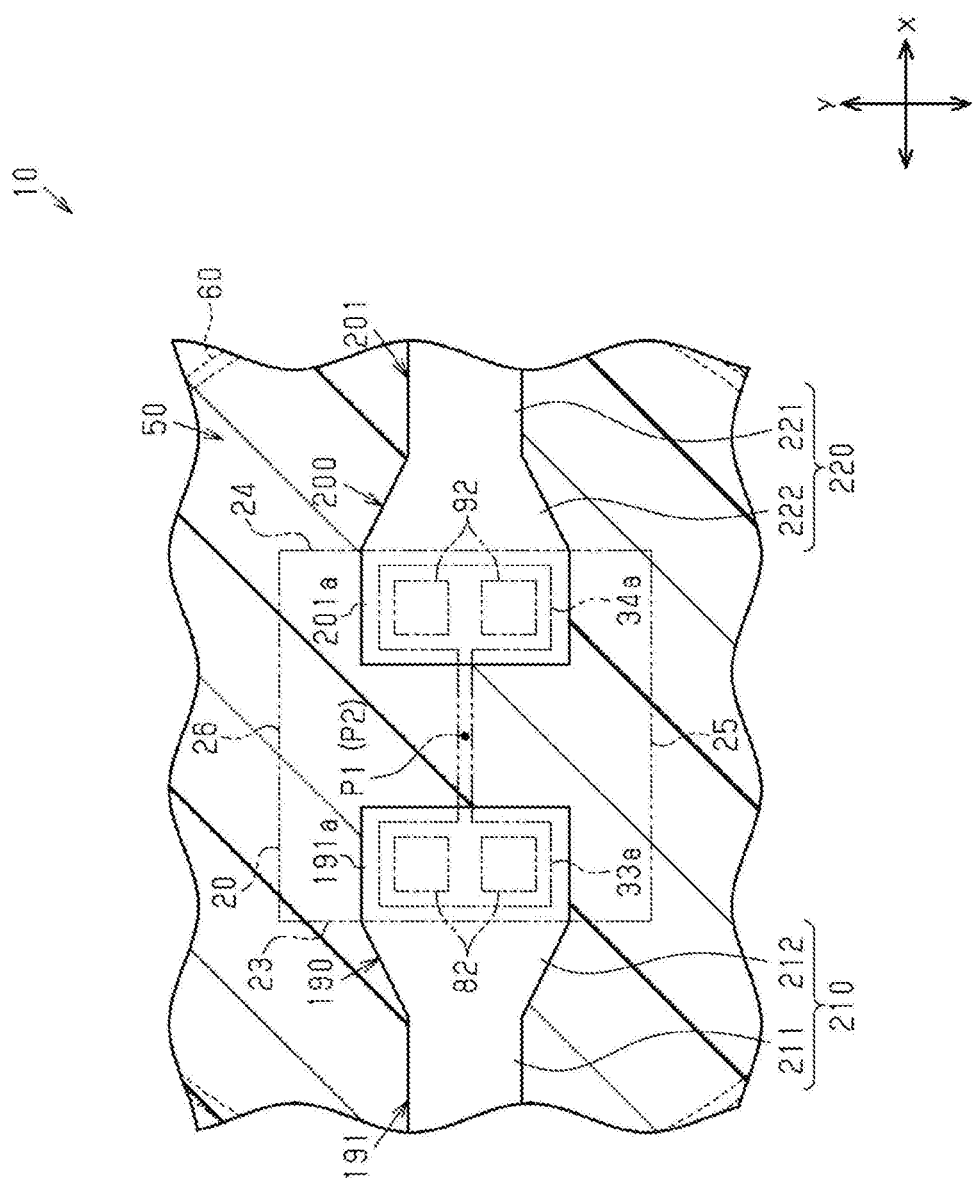
FIG. 44 is a partial enlarged view of FIG. 43.

As shown in FIGS. 43 and 44, the connection portions 210 and 220 may be configured to include connection body portions 211 and 221 which are narrower than the element facing portions 191a and 201a, and element-side tapered portions 212 and 222 formed so as to gradually widen from the connection body portions 211 and 221 toward the element facing portions 191a and 201a. This makes it possible to reduce the reflected wave.

The conductive portion 190 and 200 may be symmetrically arranged with respect to the oscillation point P1 in they direction or may be symmetrically arranged in a direction intersecting both the x direction and the y direction. In this case, the terahertz element 20 may be obliquely arranged so that the facing direction of the pads 33a and 34a coincides with the symmetry direction of the conductive portions 190 and 200.

Figure 45:
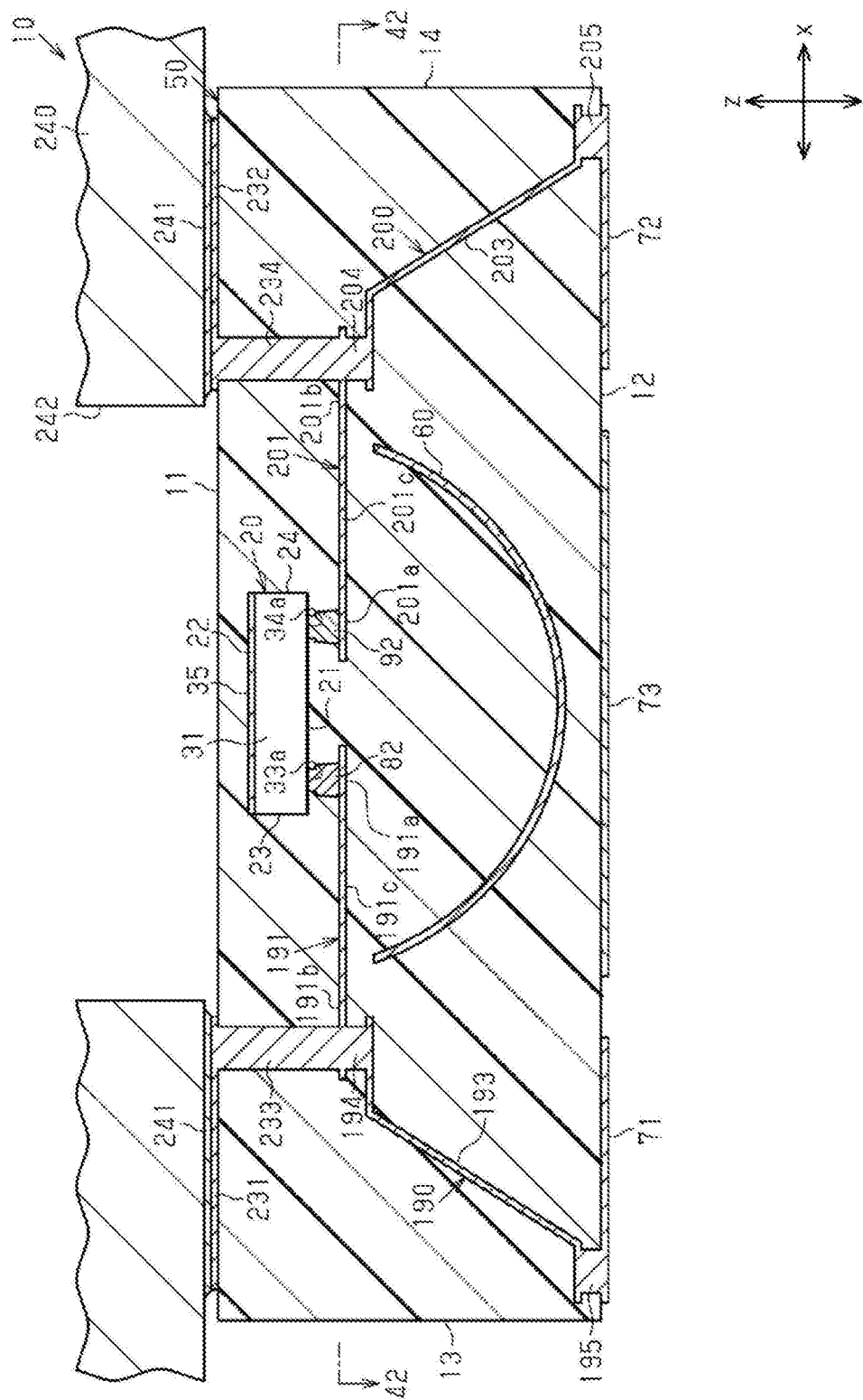
FIG. 45 is an end view showing a modification of the terahertz device according to the third embodiment.

As shown in FIG. 45, the terahertz device 10 may have a double-sided electrode structure in which electrodes are formed on both the device main surface 11 and the device back surface 12. Specifically, the terahertz device 10 may include main surface electrodes 231 and 232 formed on the device main surface 11. For example, the main surface electrodes 231 and 232 are formed so as not to overlap with the reflection film 60 when viewed in the z direction. As an example, the main surface electrodes 231 and 232 are formed in the regions on both sides of the reflection film 60 in the x direction on the device main surface 11.

In addition, the conductive portions 190 and 200 may be configured to electrically connect the terahertz element 20 and the main surface electrodes 231 and 232. For example, the conductive portions 190 and 200 may include pillars 233 and 234 that connect the main surface electrodes 231 and 232 and the protruding portions 191b and 201b. The pillars 233 and 234 have, for example, a columnar shape extending in the z direction.

The terahertz device 10 of this modification may be mounted on a circuit board 240 using the main surface electrodes 231 and 232. Specifically, the main surface electrodes 231 and 232 and the circuit board 240 may be joined by the conductive joining material 241. In this case, as shown in FIG. 45, a substrate hole 242 penetrating the circuit board 240 in the z direction may be formed in a portion of the circuit board 240 facing the reflection film 60. For example, the substrate hole 242 may be formed larger than the reflection film 60 when viewed in the z direction. As a result, the electromagnetic wave reflected by the reflection film 60 is outputted to the upper side in one direction through the substrate hole 242.

In the terahertz device 10 of the above modification, the electrodes 71 and 72 formed on the device back surface 12 may be omitted. In short, the terahertz device 10 may be configured to include at least one selected from the group of the main surface electrodes 231 and 232 formed on the device main surface 11 and the electrodes 71 and 72 formed on the device back surface 12.

Fourth Embodiment

A terahertz device 10 according to a fourth embodiment will be described with reference to FIGS. 46 and 47. In the following description, the same components as those of the terahertz device 10 of the first embodiment will be designated by like reference numerals, and the description thereof will be omitted in some cases.

Figure 46:
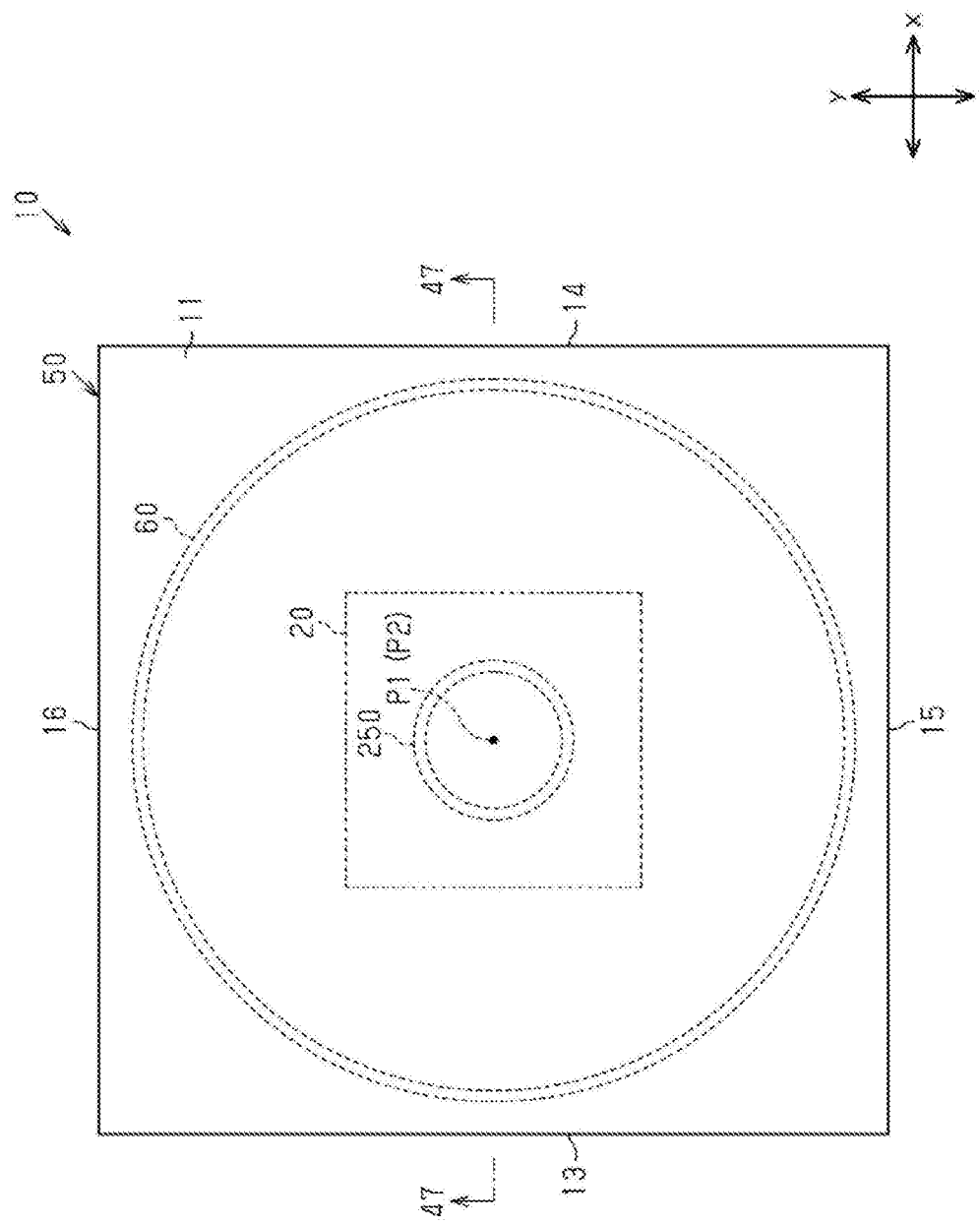
FIG. 46 is a front view of a terahertz device according to a fourth embodiment.
Figure 47:
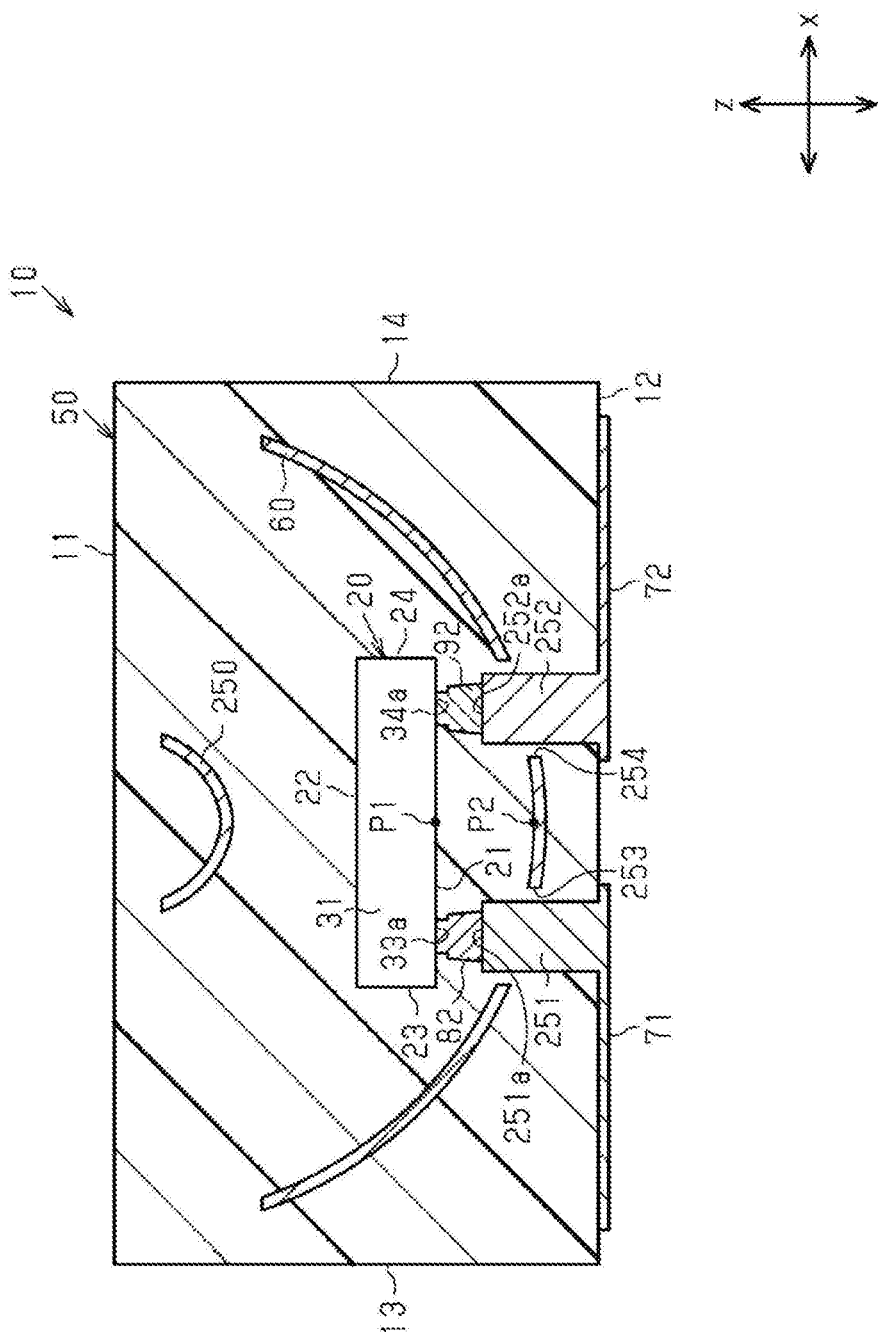
FIG. 47 is a cross-sectional view taken along the line 47-47 in FIG. 46.

As shown in FIGS. 46 and 47, the terahertz device 10 of the present embodiment is of a double reflection mirror type. More specifically, the terahertz element 20 is encapsulated by the encapsulating material 50 in a state in which the terahertz element 20 is arranged inside the reflection film 60 which is curved so as to be convex toward the device back surface 12. In this case, the terahertz element 20 may be arranged at the central portion in the z direction inside the encapsulating material 50, or may be arranged on the side of the device back surface 12 with respect to the central portion. In the present embodiment, the element main surface 21 faces the reflection film 60. In this case, the element back surface 22 faces the upper side (in other words, the device main surface 11).

In the present embodiment in which the terahertz element 20 is arranged inside the reflection film 60, it can be said that the terahertz element 20 and the reflection film 60 face each other in the x direction and the y direction, or face each other in the z direction. The element reflection layer 35 is not formed in the terahertz element 20 of the present embodiment.

The terahertz device 10 includes a sub-reflection film 250 that faces both the terahertz element 20 and the reflection film 60. The sub-reflection film 250 faces the element back surface 22 in the z direction, and also faces the reflection film 60 in an oblique direction inclined with respect to the z direction. The sub-reflection film 250 is encapsulated by the encapsulating material 50. The terahertz element 20 is provided between the sub-reflection film 250 and the reflection film 60.

The sub-reflection film 250 is formed smaller than the reflection film 60 when viewed in the z direction. The sub-reflection film 250 is provided at a position overlapping with the terahertz element 20 when viewed in the z direction. In other words, the sub-reflection film 250 is arranged in the projection region of the terahertz element 20 when viewed in the z direction. For example, the sub-reflection film 250 is curved so as to be convex toward the reflection film 60 (in other words, the terahertz element 20). That is, the sub-reflection film 250 of the present embodiment adopts a Cassegrain antenna shape. In this case, the reflection film 60 corresponds to a main reflector, and the sub-reflection film 250 corresponds to a sub-reflector.

As shown in FIG. 47, the electrodes 71 and 72 of the present embodiment are formed in a portion of the device back surface 12 which overlaps with the reflection film 60 when viewed in the z direction. The electrodes 71 and 72 are spaced apart in the x direction and arranged to face each other. It can also be said that the x direction is the facing direction of the electrodes 71 and 72.

In the terahertz element 20 of the present embodiment, as in the third embodiment, the pads 33a and 34a formed on the element main surface 21 are arranged to face each other in the x direction with the oscillation point P1 interposed therebetween. The conductive portions 251 and 252 of the present embodiment have a shape of a column erected from the electrodes 71 and 72 toward the terahertz element 20. The conductive portions 251 and 252 enter the inside of the reflection film 60 through the through-holes 253 and 254 formed in the reflection film 60. The conductive portions 251 and 252 are arranged so as to be spaced apart from each other in the x direction.

The terahertz element 20 is electrically connected to the conductive portions 251 and 252. Specifically, the tip surfaces 251a and 252a of the conductive portions 251 and 252 face the pads 33a and 34a in the z direction, and the bumps 82 and 92 are provided between them. The terahertz element 20 is flip-chip mounted on the conductive portions 251 and 252 via the bumps 82 and 92. As a result, the terahertz element 20 (the pads 33a and 34a) and the electrodes 71 and 72 are electrically connected to each other.

The conductive portions 251 and 252 and the reflection film 60 are insulated from each other. For example, the through-holes 253 and 254 are formed to be larger than the conductive portions 251 and 252, and the encapsulating material 50 is filled between the inner surfaces of the through-holes 253 and 254 and the conductive portions 251 and 252. Thus, it is possible to suppress contact between the conductive portions 251 and 252 and the reflection film 60. Insulating coatings may be formed on the side surfaces of the conductive portions 251 and 252. In this case, the encapsulating material 50 may not be provided between the inner surfaces of the through-holes 253 and 254 and the conductive portions 251 and 252. That is, the specific configuration for insulating the conductive portions 251 and 252 from the reflection film 60 is arbitrary.

The terahertz device 10 (specifically, the encapsulating material 50) of the present embodiment is smaller in the x direction than that of the first embodiment. More specifically, in the first embodiment, the electrodes 71 and 72 are provided at positions displaced from the reflection film 60, and the electrode-side conductive portions 83 and 93 protruding from the reflection film 60 are provided. Therefore, the terahertz device 10 is enlarged in the x direction. In the present embodiment, the electrodes 71 and 72 are provided at positions overlapping with the reflection film 60, and the electrode-side conductive portions 83 and 93 are not provided. Therefore, the terahertz device 10 becomes smaller in the x direction. Furthermore, the terahertz device 10 of the present embodiment is formed smaller in the z direction than that of the first embodiment by the amount that the terahertz element 20 is arranged inside the reflection film 60.

Next, the operation of the present embodiment will be described. An electromagnetic wave is generated from the terahertz element 20 by applying a voltage from the electrodes 71 and 72 to the terahertz element 20. In the present embodiment in which the oscillation point P1 is arranged on the side opposite to the side of the sub-reflection film 250, the electromagnetic wave generated from the oscillation point P1 propagates through the terahertz element 20 (in other words, the element substrate 31). The electromagnetic wave is outputted toward the reflection film 250. The electromagnetic wave is reflected by the sub-reflection film 250. Then, the electromagnetic wave is further reflected by the reflection film 60, and is outputted (irradiated) to the upper side in one direction. That is, the electromagnetic wave generated in the terahertz element 20 propagates to the reflection film 60 via the sub-reflection film 250 and is reflected by the reflection film 60 in one direction.

According to the present embodiment described above, the following effects may be obtained.

(4-1) The terahertz device 10 includes a sub-reflection film 250 as a sub-reflector which is encapsulated by an encapsulating material 50 separately from the reflection film 60. The reflection film 60 as a main reflector is curved so as to be convex toward the device back surface 12. The terahertz element 20 is arranged inside the reflection film 60, and the sub-reflection film 250 faces the terahertz element 20 and the reflection film 60. The sub-reflection film 250 reflects the electromagnetic waves generated from the terahertz element 20 toward the reflection film 60, and the reflection film 60 reflects the electromagnetic wave propagated from the sub-reflection film 250 in one direction (e.g., to the upper side). According to this configuration, the effect of (1-1) may be obtained. Furthermore, since the terahertz element 20 is arranged inside the reflection film 60, it is possible to downsize the terahertz device 10.

(4-2) The electrodes 71 and 72 are formed on a portion of the device back surface 12 overlapping with the reflection film 60 when viewed in the z direction. The conductive portions 251 and 252 are provided inside the encapsulating material 50 and erected from the electrodes 71 and 72 toward the terahertz element 20. The conductive portions 251 and 252 enter the inside of the reflection film 60 through the through-holes 253 and 254 formed in the reflection film 60. The terahertz element 20 is electrically connected to the conductive portions 251 and 252. According to this configuration, it is not necessary to provide a conductive portion or an electrode on the lateral side of the reflection film 60. This makes it possible to reduce the size of the terahertz device 10 on the lateral side thereof.

(4-3) The conductive portions 251 and 252 and the reflection film 60 are insulated from each other. As a result, it is possible to prevent the conductive portions 251 and 252 from being short-circuited via the reflection film 60.

(4-4) The sub-reflection film 250 is arranged in a projection region of the terahertz element 20 when viewed in the z direction. If the sub-reflection film 250 is arranged outside the projection region, the electromagnetic wave reflected by the reflection film 60 will be blocked by the terahertz element 20 and the sub-reflection film 250. On the other hand, by disposing the sub-reflection film 250 in the projection region, it is possible to prevent the electromagnetic wave reflected by the reflection film 60 from being blocked by the sub-reflection film 250. As a result, it is possible to suppress the blocking of electromagnetic wave due to the sub-reflection film 250.

Modifications of the Fourth Embodiment

Modifications of the terahertz device 10 of the fourth embodiment will be described below. The following modifications may be applied to other embodiments, or may be combined with each other, as long as there is no technical contradiction.

Figure 48:
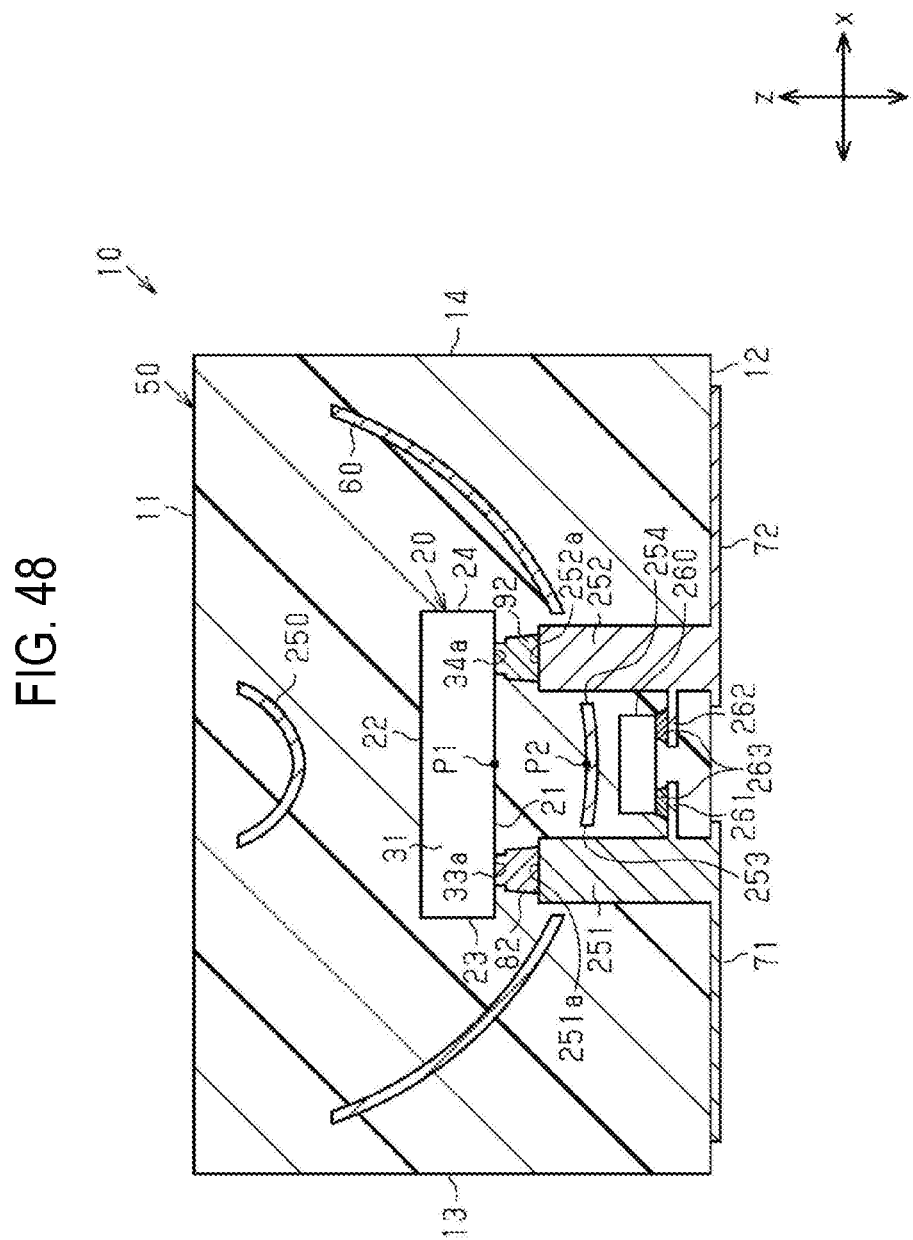
FIG. 48 is a cross-sectional view showing a modification of the terahertz device according to the fourth embodiment.

As shown in FIG. 48, the terahertz device 10 may include a protection diode 260 as a specific element. In this case, the protection diode 260 may be encapsulated by the encapsulating material 50, for example, in a state in which the protection diode 260 is disposed between the reflection film 60 and the device back surface 12 and electrically connected to the conductive portions 251 and 252.

Specifically, the conductive portions 251 and 252 include extension portions 261 and 262 that extend toward each other. The extension portions 261 and 262 extend in the x direction. The protection diode 260 is arranged so as to straddle the extension portions 261 and 262, and is mounted on the extension portions 261 and 262. Specifically, the anode electrode and the cathode electrode of the protection diode 260 are electrically connected to the extension portions 261 and 262 by a conductive joining material 263.

According to this configuration, since the protection diode 260 is arranged on the back side of the reflection film 60, the protective diode 260 and the conductive portions 251 and 252 can be electrically connected to each other while the electromagnetic wave reflected by the reflection film 60 is not blocked by the protection diode 260.

The shape of the sub-reflection film 250 may be arbitrarily changed, and may be, for example, a curved shape so as to be convex toward the device main surface 11. That is, the sub-reflection film 250 may adopt a Gregorian type.

The terahertz element 20 may be encapsulated by the encapsulating material 50 in a state in which the element main surface 21 having the oscillation point P1 faces the sub-reflection film 250. In this case, the pads 33a and 34a may be formed on the element back surface 22. The pads 33a and 34a may be formed on the element main surface 21 or the element back surface 22.

(Other Modifications)

The above-described embodiments are examples of the forms that can be taken by the terahertz device according to the present disclosure, and are not intended to limit the form of the terahertz device according to the present disclosure. The terahertz device according to the present disclosure may take a form different from the form exemplified in each of the above-described embodiments. An example of the form is a form in which a part of the configurations of each of the above-described embodiments is replaced, changed or omitted, or a form in which a new configuration is added to each of the above-described embodiments. For the sake of convenience of description, the following modifications are described basically using the first embodiment. However, the following modifications may be applied to other embodiments as long as there is no technical contradiction.

The specific shape of the conductive portions 80 and 90 may be arbitrarily changed. For example, the element facing portions 81a and 91a and the protruding portions 81b and 91b may be circular or elliptical. Furthermore, the element-side conductive portions 81, 91 may be configured not to include the protruding portions 81b and 91b. In this case, the electrode-side conductive portions 83 and 93 (the first flat portions 83a and 93a) may extend to, and may be joined, at a position where they overlap with the reflection film 60. In this configuration, a height difference may be provided between the first flat portions 83a and 93a and the reflection film 60 so that the electrode-side conductive portions 83 and 93 and the reflection film 60 are not short-circuited.

Furthermore, the electrode-side conductive portions 83 and 93 may not be the thin films formed in the crank shape, but may be columns (i.e., pillars) extending in the z direction to connect the protruding portions 81b and 91b and the electrodes 71 and 72.

The second flat portions 83b and 93b and the electrode-side joining portions 85 and 95 may be omitted, and the inclined portions 83c and 93c may be directly joined to the electrodes 71 and 72.

Figure 49:
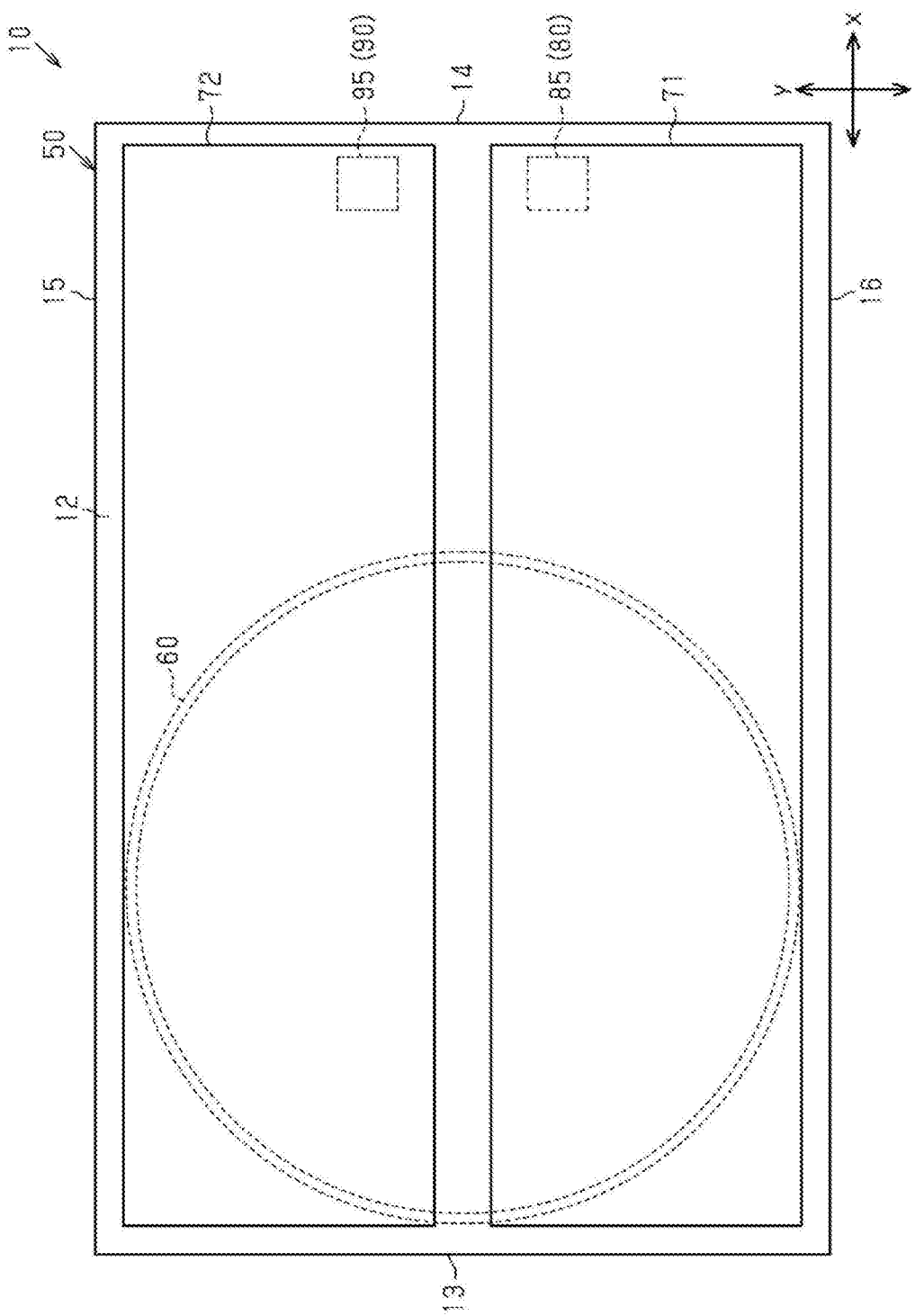
FIG. 49 is a bottom view schematically showing a terahertz device according to a modification.

As shown in FIG. 49, the heat dissipation electrode 73 may be omitted, and the electrodes 71 and 72 may partially overlap with the reflection film 60. For example, the electrodes 71 and 72 may be formed so as to straddle a portion of the device back surface 12 that overlaps with the reflection film 60 when viewed in the z direction and a portion of the device back surface 12 that does not overlap with the reflection film 60 when viewed in the z direction. As a result, it is possible to increase the contact area. In this case, the electrodes 71 and 72 are arranged to face each other in the y direction.

Figure 50:
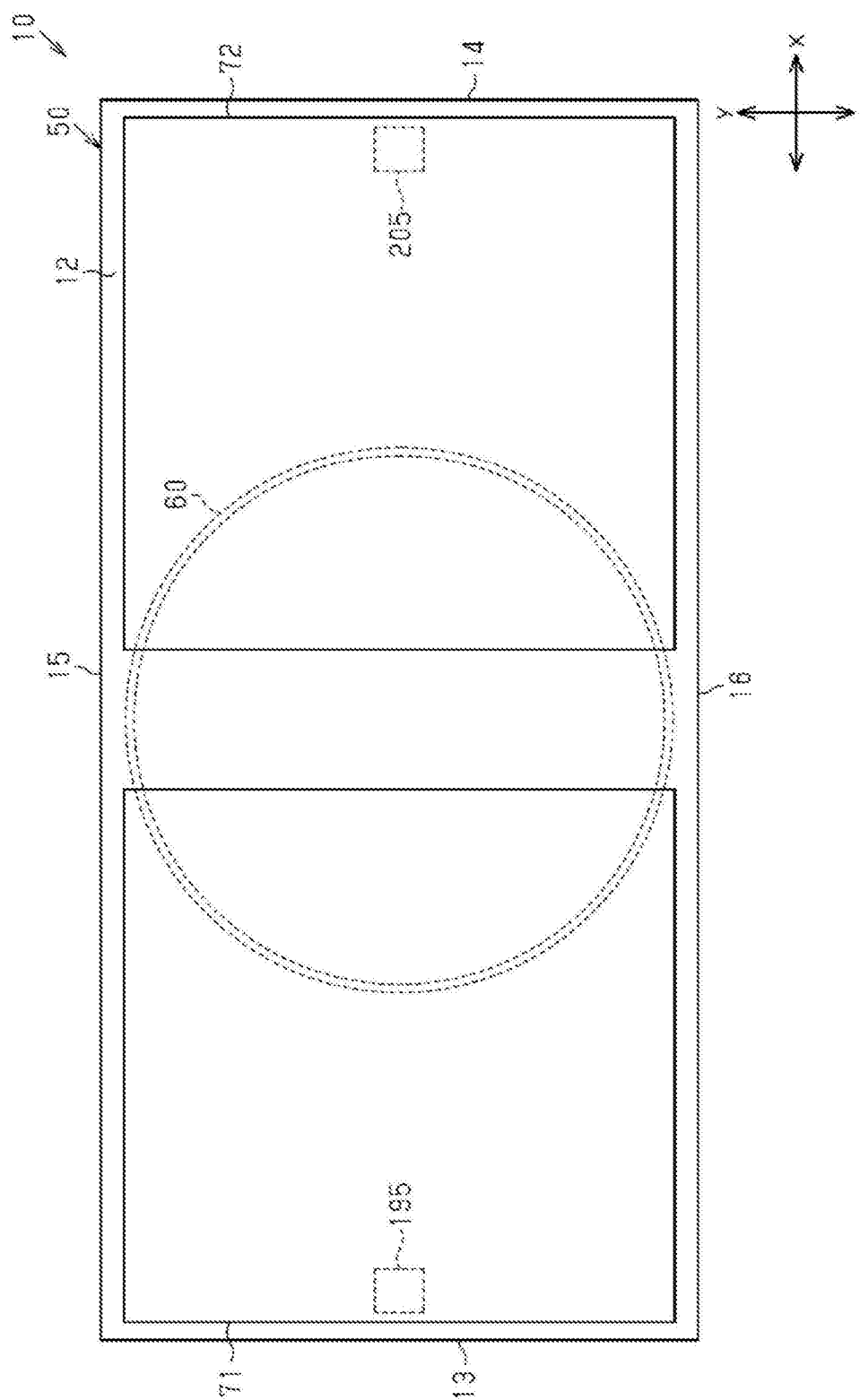
FIG. 50 is a bottom view schematically showing a terahertz device according to a modification.

Furthermore, as shown in FIG. 50, in the configuration of the third embodiment in which the electrodes 71 and 72 are arranged to face each other in the x direction, a portion of the first electrode 71 and a portion of the second electrode 72 may extend toward each other so as to overlap with the reflection film 60.

Further, the electrodes 71 and 72 may be formed only at the positions on the device back surface 12 that overlap with the reflection film 60 when viewed in the z direction. That is, the heat dissipation electrode 73 is not essential, and the specific shape of the electrodes 71 and 72 is arbitrary. In addition, the electrodes 71 and 72 may have different shapes.

Figure 51:
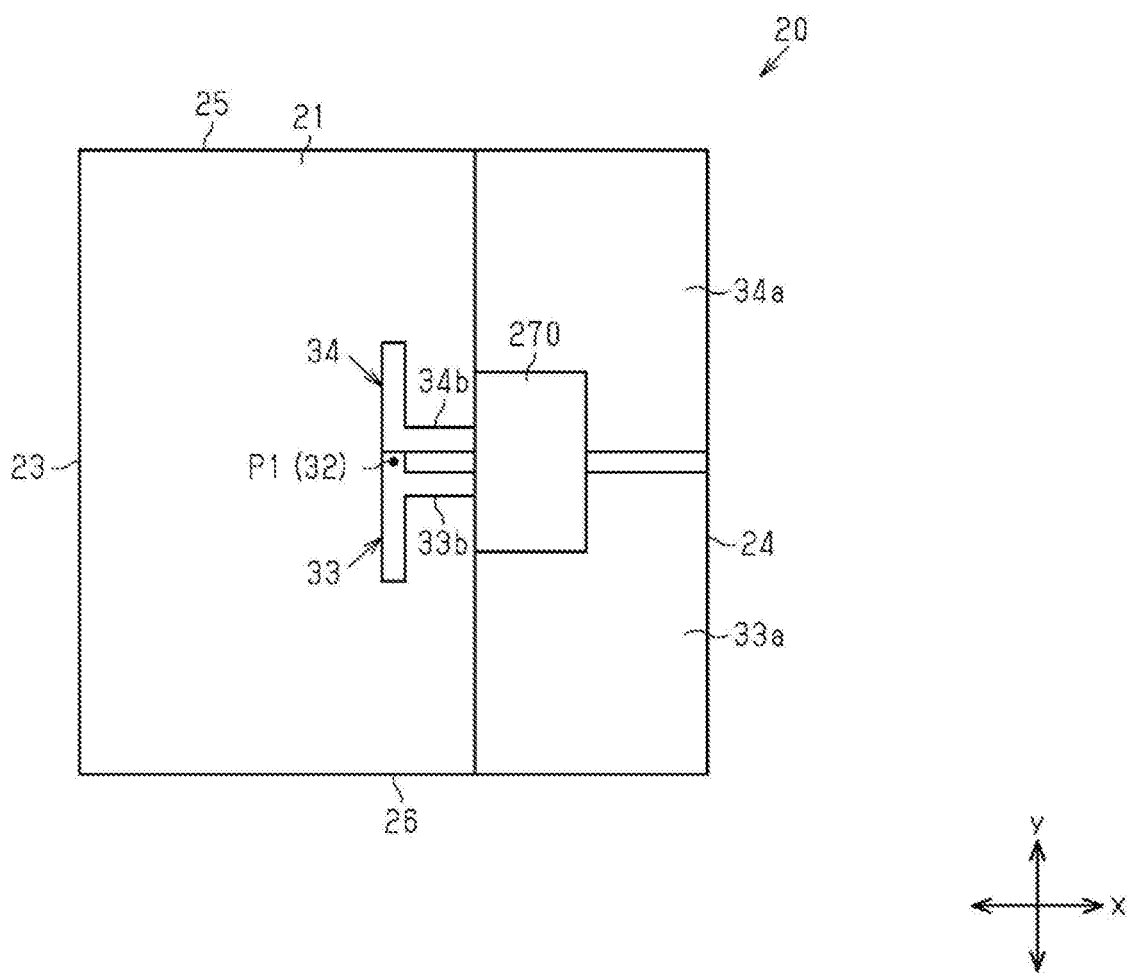
FIG. 51 is a front view schematically showing a terahertz device according to a modification.

The positions and shapes of the pads 33a and 34a of the terahertz element 20 are arbitrary. For example, as shown in FIG. 51, the pads 33a and 34a may not be arranged to face each other in the x direction or the y direction with the oscillation point P1 interposed therebetween, or may be collectively arranged at the ends of the element main surface 21 in the x direction. In this case, the pads 33a and 34a may be insulated from each other.

Furthermore, as shown in FIG. 51, a portion of the element conductive layers 33 and 34 may form a dipole antenna. That is, an antenna may be integrated on the element main surface 21 of the terahertz element 20. The specific configuration of the antenna is not limited to the dipole antenna, and may be arbitrarily changed. The antenna may be other antennas such as a slot antenna, a bowtie antenna, or a ring antenna.

As shown in FIG. 51, the terahertz element 20 may include a MIM (Metal Insulator Metal) reflector 270. The MIM reflector 270 is configured by a portion of the first element conductive layer 33 and a portion of the second element conductive layer 34 that sandwich an insulator in the z direction. The MIM reflector 270 short-circuits a portion of the first element conductive layer 33 and a portion of the second element conductive layer 34 in terms of a high frequency. The MIM reflector 270 can reflect a high-frequency electromagnetic wave.

In this case, the element facing portions 81a and 91a may be formed in conformity with the positions and sizes of the pads 33a and 34a. For example, the element facing portions 81a and 91a may be arranged side by side in they direction so as to face the pads 33a and 34a. The bumps 82 and 92 may be formed between the pads 33a and 34a and the element facing portions 81a and 91a.

Figure 52:
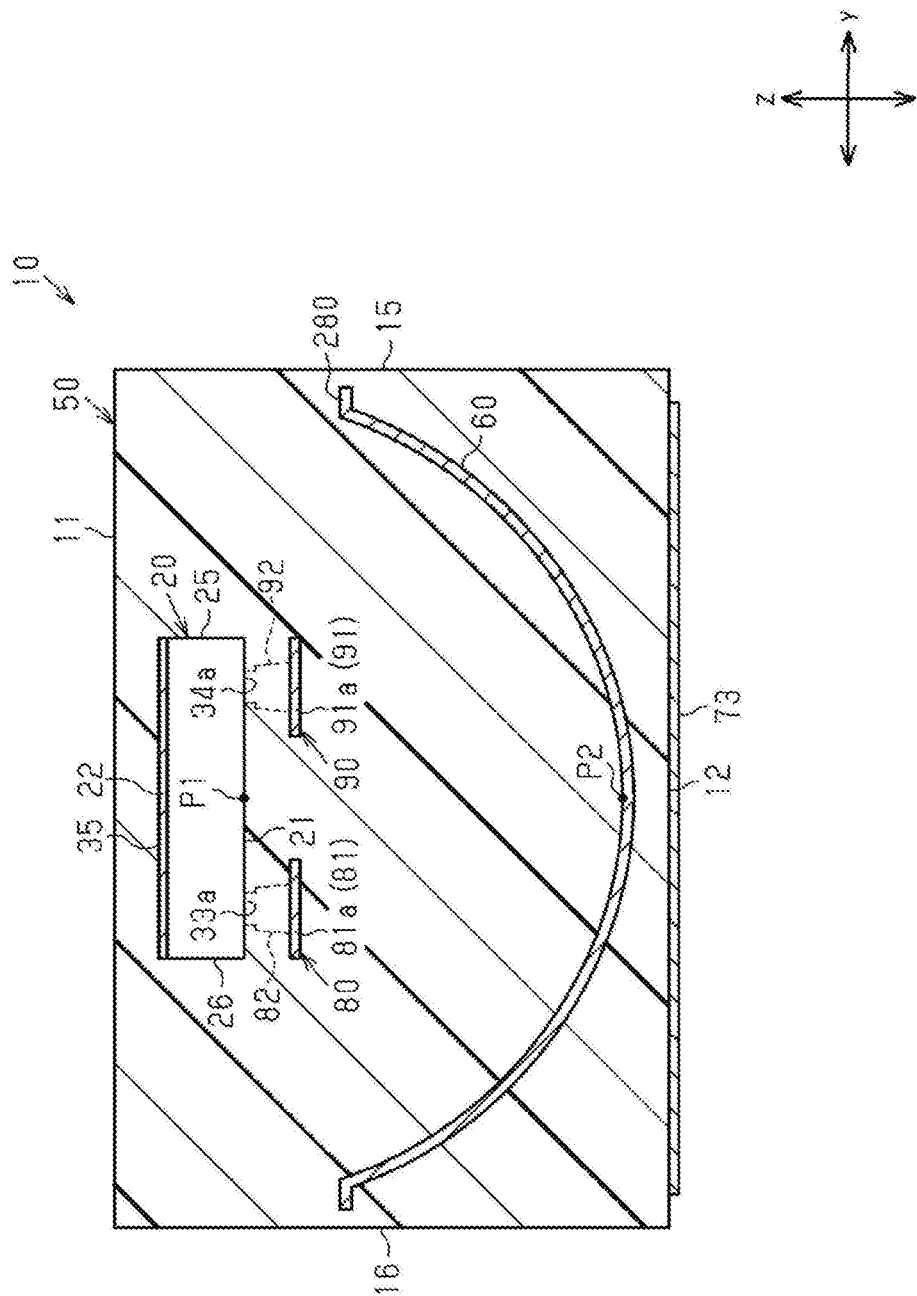
FIG. 52 is a cross-sectional view schematically showing a terahertz device according to a modification.

As shown in FIG. 52, the reflection film 60 may include a flange portion 280 that extends laterally from the end of the reflection film 60. The flange portion 280 may be formed in, for example, an annular shape along the peripheral edge of the reflection film 60.

The specific shape of the reflection film 60 is not limited to the parabolic antenna shape. Various antenna shapes may be adopted. For example, the reflection film 60 may have a planar antenna shape. That is, the reflection film 60 may be a thin film which is provided at a position facing the terahertz element 20 and which is orthogonal to the z direction.

The reflection film is not limited to a single film and may be composed of a plurality of separated parts. For example, a slit may be formed in the reflection film or a hole may be formed in the reflection film. That is, the shape of the reflection film may be changed appropriately.

The terahertz element 20 may be arranged near the central portion of the encapsulating material 50 in the z direction, or may be arranged on the side of the device back surface 12.

The conductive portions 80 and 90 may protrude in the y direction instead of the x direction, or may protrude in both the x direction and the y direction with respect to the reflection film 60. This also applies to the electrodes 71 and 72.

The terahertz element 20 may be arranged so that the element back surface 22 faces the reflection film 60. That is, the reflection film 60 may be provided on the element back surface 22 of the terahertz element 20 instead of the element main surface 21. In this case, the element reflection layer 35 may be omitted.

The reflection film 60 may not be in an electrically floating state. That is, it is not essential that the reflection portion be in an electrically floating state.

The specific material of the encapsulating material 50 may be arbitrarily changed as long as it can transmit an electromagnetic wave. For example, the encapsulating refractive index n2 may be lower than "1" which is the refractive index of air, or may be higher than the element refractive index n1.

The constituent material of the element substrate 31 may be a semiconductor other than InP. Since the element refractive index n1 is the refractive index of the element substrate 31, if the constituent material of the element substrate 31 is changed, the element refractive index n1 is also changed.

Figure 53:
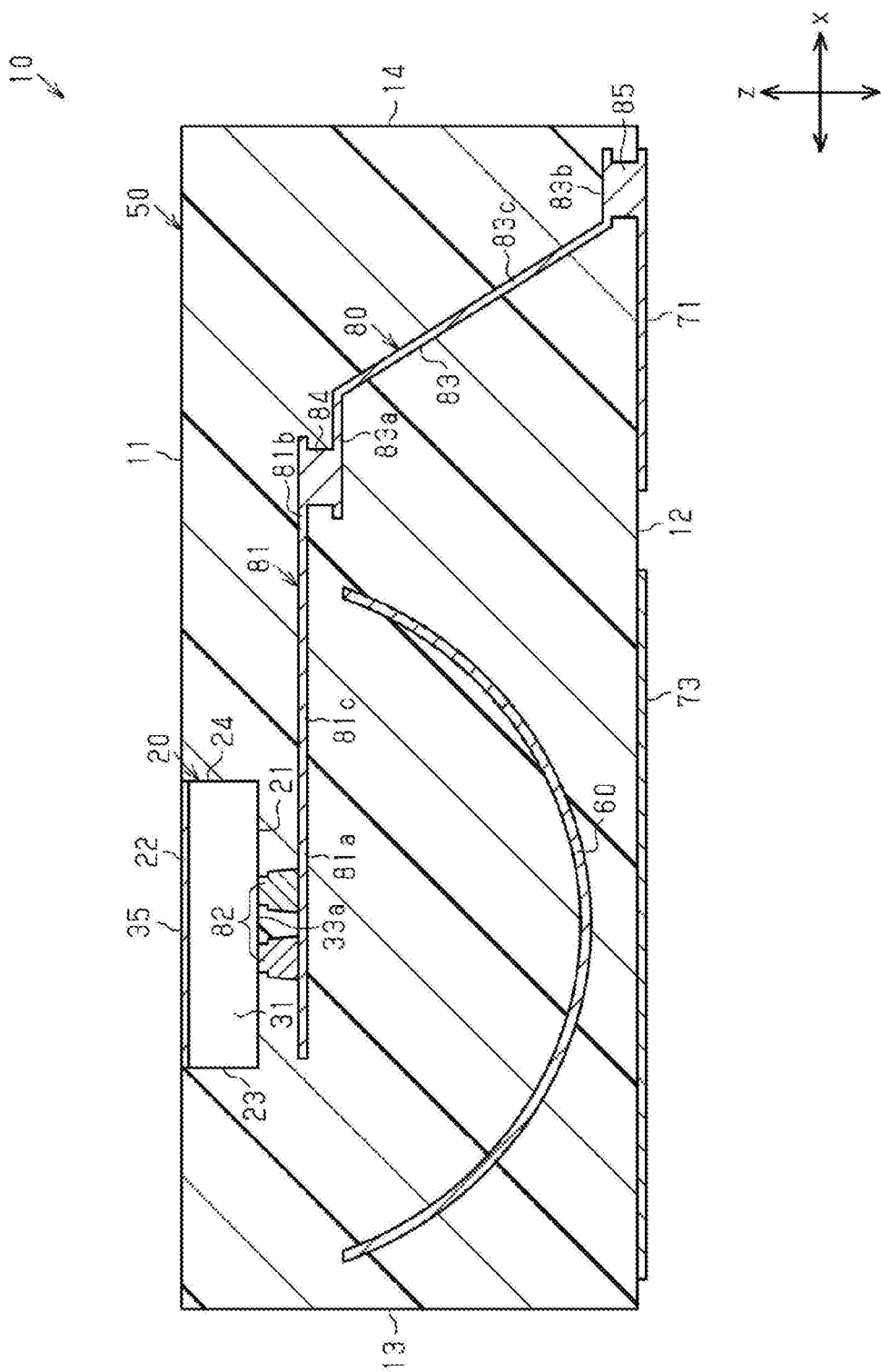
FIG. 53 is an end view schematically showing a terahertz device according to a modification.

As shown in FIG. 53, the encapsulating material 50 may not cover the element back surface 22. That is, the element back surface 22 (or the element reflection layer 35) may be exposed. In other words, the encapsulating material 50 only needs to surround at least the element main surface 21 and the element side surfaces 23 to 26 of the terahertz element 20.

The specific shape of the encapsulating material 50 may be arbitrarily changed, and may be, for example, a cylindrical shape or a polygonal prism shape other than the rectangular parallelepiped shape.

The direction of the electromagnetic wave reflected by the reflection film 60 (i.e., one direction) is arbitrary. Furthermore, the reflection film 60 may be one that reflects electromagnetic waves as a whole in one direction. It is not necessary for all the electromagnetic waves reflected by the reflection film 60 to have the same direction. For example, the electromagnetic waves reflected by the reflection film 60 may include those inclined with respect to the one direction.

A portion or the entirety of the conductive portions 80 and 90 may be formed outside the encapsulating material 50. For example, a portion of the conductive portions 80 and 90 may be formed on at least one selected from the group of the device side surfaces 13 to 16. In view of suppressing a short circuit between the conductive portions 80 and 90 and other components, the conductive portions 80 and 90 may be provided inside the encapsulating material 50.

The terahertz element 20 may receive an electromagnetic wave and may convert the received electromagnetic wave into electric energy. Specifically, the terahertz element 20 may receive, for example, the electromagnetic wave emitted (inputted) to the oscillation point P1. In this case, the oscillating point P1 can be said to be a reception point for receiving an electromagnetic wave, or can be said to be a resonance point for resonating with a terahertz band electromagnetic wave.

In this configuration, the reflection film 60 may reflect the incident electromagnetic wave toward the terahertz element 20 (preferably the reception point). According to this configuration, the electromagnetic wave reflected by the reflection film 60 is propagated to the terahertz element 20 via the encapsulating material 50. As a result, the reception intensity of the terahertz device 10 is increased, which makes it possible to improve the gain related to the reception.

Furthermore, since the terahertz element 20 and the reflection film 60 are encapsulated by the encapsulating material 50, it is possible to suppress entry of a foreign material between the terahertz element 20 and the reflection film 60. Therefore, it is possible to prevent propagation of the electromagnetic wave from being hindered by the foreign material. In addition, since the exposure of the reflection film 60 to the air can be suppressed, it is possible to suppress the deterioration of the reflection film 60 due to the moisture or oxygen contained in the air.

In this configuration, the device main surface 11 can be said to be an incident surface on which an electromagnetic wave is incident, and the reflection film 60 can be said to reflect the electromagnetic wave incident from the device main surface 11 toward the terahertz element 20. In addition, the device main surface 11 can also be said to be an input surface to which an electromagnetic wave is inputted, and the terahertz device 10 can be said to receive the electromagnetic wave inputted from the device main surface 11.

The reflection film 60 may be configured to reflect a part of the incident electromagnetic wave toward the terahertz element 20 or may be configured to reflect the entire incident electromagnetic wave toward the terahertz element 20.

In the terahertz device 10 of the fourth embodiment, when the terahertz element 20 that receives the electromagnetic wave is adopted, the reflection film 60 may be configured to reflect the electromagnetic wave incident from the device main surface 11 toward the sub-reflection film 250, and the sub-reflection film 250 may be configured to reflect the electromagnetic wave reflected by the reflection film 60 toward the terahertz element 20. In other words, it can be said that the sub-reflection film 250 reflects the electromagnetic wave incident from the reflection film 60 toward the terahertz element 20. In this case, the sub-reflection film 250 may reflect a part or the entirety of the electromagnetic wave reflected by the reflection film 60 toward the oscillation point P1.

Furthermore, the terahertz element 20 may perform both oscillation (generation) and reception of an electromagnetic wave. That is, the oscillation point P1 may be a point at which at least one selected from the group of oscillation and reception of an electromagnetic wave is performed.

<Aspects of Present Disclosure>

Hereinafter, some aspects of the present disclosure will be additionally described as supplementary notes.

(Supplementary Note 1)

According to one aspect of the present disclosure, a terahertz device include: a terahertz element configured to generate an electromagnetic wave; a reflection film provided at a position facing the terahertz element and configured to reflect the electromagnetic wave generated from the terahertz element in one direction; and an encapsulating material configured to encapsulate the terahertz element and the reflection film.

(Supplementary Note 2)

In the terahertz device of Supplementary Note 1, an encapsulating refractive index as a refractive index of the encapsulating material is higher than a refractive index of air and lower than an element refractive index as a refractive index of the terahertz element.

(Supplementary Note 3)

In the terahertz device of Supplementary Note 2, the terahertz element includes an element substrate, and the element refractive index is a refractive index of the element substrate.

(Supplementary Note 4)

In the terahertz device of Supplementary Note 3, the element substrate is made of InP.

(Supplementary Note 5)

In the terahertz device of Supplementary Note 1, the encapsulating material is made of an epoxy resin.

(Supplementary Note 6)

In the terahertz device of Supplementary Note 1, the reflection film is in an electrically floating state.

(Supplementary Note 7)

In the terahertz device of Supplementary Note 1, the reflection film is formed to be larger than the terahertz element when viewed in a height direction of the terahertz device.

(Supplementary Note 8)

In the terahertz device of Supplementary Note 1, the terahertz element includes, as surfaces intersecting a height direction of the terahertz device, an element main surface having an oscillation point and an element back surface which is a surface opposite to the element main surface, and the terahertz element is encapsulated in a state in which the element main surface faces the reflection film.

(Supplementary Note 9)

In the terahertz device of Supplementary Note 8, the terahertz element is configured to irradiate the electromagnetic wave radially from the oscillation point over a range of an opening angle, and the reflection film is formed over a range of an angle equal to or greater than the opening angle with respect to the oscillation point.

(Supplementary Note 10)

In the terahertz device of Supplementary Note 8, the reflection film has a parabolic antenna shape.

(Supplementary Note 11)

In the terahertz device of Supplementary Note 10, the reflection film is arranged such that a focal point of the reflection film is located at the oscillation point.

(Supplementary Note 12)

In the terahertz device of Supplementary Note 10, when viewed in the height direction of the terahertz device, a center point of the reflection film and the oscillation point coincide with each other.

(Supplementary Note 13)

In the terahertz device of Supplementary Note 10, a distance between a center point of the reflection film and the oscillation point is set so as to satisfy a resonance condition of the electromagnetic wave generated from the terahertz element.

(Supplementary Note 14)

In the terahertz device of Supplementary Note 10, when viewed in the height direction of the terahertz device, the terahertz element is arranged at a position where a center point of the reflection film is deviated from the oscillation point.

(Supplementary Note 15)

In the terahertz device of Supplementary Note 8, an element reflection layer configured to reflect the electromagnetic wave generated from the terahertz element is formed at the element back surface.

(Supplementary Note 16)

The terahertz device of Supplementary Note 1, further includes: a protection diode provided inside the encapsulating material and connected in parallel to the terahertz element.

(Supplementary Note 17)

In the terahertz device of Supplementary Note 1, the encapsulating material includes a device main surface and a device back surface as both end surfaces in a height direction of the terahertz device, the reflection film is curved so as to be convex toward the device back surface, the terahertz element is arranged inside the curved reflection film, the terahertz device further includes a sub-reflection film encapsulated by the encapsulating material separately from the reflection film and configured to face the terahertz element and the reflection film, the sub-reflection film is configured to reflect the electromagnetic wave generated from the terahertz element toward the reflection film, and the reflection film is configured to reflect the electromagnetic wave propagated from the sub-reflection film in the one direction.

(Supplementary Note 18)

The terahertz device of Supplementary Note 17, further includes: an electrode formed at a portion of the device back surface that overlaps with the reflection film when viewed in the height direction of the terahertz device; and a conductive portion provided inside the encapsulating material and erected from the electrode toward the terahertz element, wherein the conductive portion extends to the inside of the reflection film via a through-hole formed in the reflection film, and wherein the terahertz element is electrically connected to the conductive portion.

(Supplementary Note 19)

In the terahertz device of Supplementary Note 18, the conductive portion and the reflection film are insulated from each other.

(Supplementary Note 20)

In the terahertz device of Supplementary Note 17, the sub-reflection film is arranged in a projection region of the terahertz element when viewed in the height direction of the terahertz device.

(Supplementary Note 21)

According to another aspect of the present disclosure, a terahertz device includes: a terahertz element configured to receive an electromagnetic wave; a reflection film provided at a position facing the terahertz element and configured to reflect the electromagnetic wave incident on the reflection film toward the terahertz element; and an encapsulating material configured to encapsulate the terahertz element and the reflection film.

(Supplementary Note 22)

In the terahertz device of Supplementary Note 21, a conductive portion is provided inside the encapsulating material, and the terahertz element is flip-chip mounted on the conductive portion.

(Supplementary Note 23)

In the terahertz device of Supplementary Note 22, the encapsulating material includes, as both end surfaces in a height direction of the terahertz device, a device main surface on which the electromagnetic wave is incident and a device back surface opposite to the device main surface, the reflection film is configured to reflect the incident electromagnetic wave from the device main surface toward the terahertz element, an electrode is formed at the device back surface, and the conductive portion is configured to electrically connect the terahertz element and the electrode.

(Supplementary Note 24)

In the terahertz device of Supplementary Note 23, the terahertz element is arranged closer to the device main surface than to the device back surface, and the reflection film is arranged closer to the device back surface than to the terahertz element.

(Supplementary Note 25)

In the terahertz device of Supplementary Note 23, the electrode is formed at a portion of the device back surface that does not overlap with the reflection film when viewed in the height direction of the terahertz device.

(Supplementary Note 26)

In the terahertz device of Supplementary Note 25, a heat dissipation electrode to which heat of the reflection film is transferred is formed at a portion of the device back surface that overlaps with the reflection film when viewed in the height direction of the terahertz device.

(Supplementary Note 27)

In the terahertz device of Supplementary Note 23, the electrode is formed to straddle a portion of the device back surface that overlaps with the reflection film when viewed in the height direction of the terahertz device and a portion of the device back surface that does not overlap with the reflection film when viewed in the height direction of the terahertz device.

(Supplementary Note 28)

In the terahertz device of Supplementary Note 23, the terahertz element includes a pad facing the reflection film, the conductive portion includes: an element facing portion provided between the terahertz element and the reflection film to face the pad in the height direction of the terahertz device; and a bump provided between the pad and the element facing portion, and the terahertz element is flip-chip mounted on the element facing portion via the bump.

(Supplementary Note 29)

In the terahertz device of Supplementary Note 28, the pad has a shape having a longitudinal direction and a lateral direction when viewed in the height direction of the terahertz device, the element facing portion extends in the longitudinal direction of the pad, and the bump includes a plurality of bumps arranged in the longitudinal direction of the pad.

(Supplementary Note 30)

In the terahertz device of Supplementary Note 28, the conductive portion includes: an element-side conductive portion including the element facing portion, a protruding portion protruding from the reflection film when viewed in the height direction of the terahertz device and a connection portion configured to connect the element facing portion and the protruding portion; and an electrode-side conductive portion provided at a position that does not overlap with the terahertz element and the reflection film when viewed in the height direction of the terahertz device, and electrically connected to both the protruding portion and the electrode.

(Supplementary Note 31)

In the terahertz device of Supplementary Note 30, the electrode-side conductive portion is formed in a crank shape bent in the height direction of the terahertz device.

(Supplementary Note 32)

In the terahertz device of Supplementary Note 31, the electrode-side conductive portion includes: a first flat portion facing the protruding portion in the height direction of the terahertz device; a second flat portion arranged closer to the device back surface than to the first flat portion and configured to face the electrode in the height direction of the terahertz device; and an inclined portion configured to connect the first flat portion and the second flat portion, and inclined so as to approach the device back surface as the inclined portion extends from the first flat portion to the second flat portion.

(Supplementary Note 33)

In the terahertz device of Supplementary Note 32, the conductive portion includes: an element-side joining portion provided between the protruding portion and the first flat portion, and configured to join the protruding portion and the first flat portion; and an electrode-side joining portion provided between the second flat portion and the electrode, and configured to join the second flat portion and the electrode.

(Supplementary Note 34)

In the terahertz device of Supplementary Note 30, the element-side conductive portion extends in a first direction orthogonal to the height direction of the terahertz device, and if a second direction orthogonal to both the height direction of the terahertz device and the first direction is defined as a width direction in the element-side conductive portion, at least a portion of the connection portion is formed to have a narrower width than the element facing portion.

(Supplementary Note 35)

In the terahertz device of Supplementary Note 34, the connection portion includes: a connection body portion formed to have a narrower width than the element facing portion; and an element-side tapered portion configured to connect the connection body portion and the element facing portion, and formed to gradually widen from the connection body portion toward the element facing portion.

(Supplementary Note 36)

In the terahertz device of Supplementary Note 23, the electrode includes a first electrode and a second electrode, the conductive portion includes a first conductive portion and a second conductive portion, the first electrode and the second electrode are disposed at positions displaced in a first direction with respect to the reflection film on the device back surface when viewed in the height direction of the terahertz device, and are arranged side by side in a second direction orthogonal to the first direction, and the first conductive portion and the second conductive portion extend in the first direction while being arranged side by side in the second direction when viewed in the height direction of the terahertz device.

(Supplementary Note 37)

In the terahertz device of Supplementary Note 36, the terahertz element includes: a resonance point; and a first pad and a second pad arranged to face each other and spaced apart in the second direction with the resonance point interposed between the first pad and the second pad, the first pad and the second pad having a longitudinal direction extending in the first direction, the first conductive portion includes: a first element facing portion facing the first pad and having a longitudinal direction extending in the first direction; and a plurality of first bumps provided between the first pad and the first element facing portion and arranged along the first direction, and the second conductive portion includes: a second element facing portion facing the second pad and having a longitudinal direction extending in the first direction; and a plurality of second bumps provided between the second pad and the second element facing portion and arranged along the first direction.

(Supplementary Note 38)

In the terahertz device of Supplementary Note 23, the electrode includes a first electrode and a second electrode, the conductive portion includes a first conductive portion and a second conductive portion, the first electrode and the second electrode are disposed at both sides of the reflection film in a first direction on the device back surface when viewed in the height direction of the terahertz device, and the first conductive portion and the second conductive portion extend from the terahertz element in the first direction so as to be spaced apart from each other when viewed in the height direction of the terahertz device.

(Supplementary Note 39)

In the terahertz device of Supplementary Note 38, the terahertz element includes: a resonance point; and a first pad and a second pad arranged to face each other and spaced apart in the first direction with the resonance point interposed between the first pad and the second pad, the first pad and the second pad having a longitudinal direction extending in a second direction orthogonal to both the height direction of the terahertz device and the first direction, the first conductive portion includes: a first element facing portion facing the first pad and having a longitudinal direction extending in the second direction; and a plurality of first bumps provided between the first pad and the first element facing portion and arranged along the second direction, and wherein the second conductive portion includes: a second element facing portion facing the second pad and having a longitudinal direction extending in the second direction; and a plurality of second bumps provided between the second pad and the second element facing portion and arranged along the second direction.

(Supplementary Note 40)

In the terahertz device of Supplementary Note 21, an encapsulating refractive index as a refractive index of the encapsulating material is higher than a refractive index of air and lower than an element refractive index as a refractive index of the terahertz element.

(Supplementary Note 41)

In the terahertz device of Supplementary Note 40, the terahertz element includes an element substrate, and the element refractive index is a refractive index of the element substrate.

(Supplementary Note 42)

In the terahertz device of Supplementary Note 41, the element substrate is made of InP.

(Supplementary Note 43)

In the terahertz device of Supplementary Note 21, the encapsulating material is made of an epoxy resin.

(Supplementary Note 44)

In the terahertz device of Supplementary Note 21, the reflection film is in an electrically floating state.

(Supplementary Note 45)

In the terahertz device of Supplementary Note 21, the reflection film is formed to be larger than the terahertz element when viewed in a height direction of the terahertz device.

(Supplementary Note 46)

In the terahertz device of Supplementary Note 21, the terahertz element includes, as surfaces intersecting a height direction of the terahertz device, an element main surface having a resonance point and an element back surface which is a surface opposite to the element main surface, and the terahertz element is encapsulated in a state in which the element main surface faces the reflection film.

(Supplementary Note 47)

In the terahertz device of Supplementary Note 46, the terahertz element is configured to irradiate the electromagnetic wave radially from the resonance point over a range of an opening angle, and the reflection film is formed over a range of an angle equal to or greater than the opening angle with respect to the resonance point.

(Supplementary Note 48)

In the terahertz device of Supplementary Note 46, the reflection film has a parabolic antenna shape.

(Supplementary Note 49)

In the terahertz device of Supplementary Note 48, the reflection film is arranged such that a focal point of the reflection film is located at the resonance point.

(Supplementary Note 50)

In the terahertz device of Supplementary Note 48, when viewed in the height direction of the terahertz device, a center point of the reflection film and the resonance point coincide with each other.

(Supplementary Note 51)

In the terahertz device of Supplementary Note 48, a distance between a center point of the reflection film and the resonance point is set so as to satisfy a resonance condition of the electromagnetic wave generated from the terahertz element.

(Supplementary Note 52)

In the terahertz device of Supplementary Note 48, when viewed in the height direction of the terahertz device, the terahertz element is arranged at a position where a center point of the reflection film is deviated from the resonance point.

(Supplementary Note 53)

In the terahertz device of Supplementary Note 46, an element reflection layer configured to reflect the electromagnetic wave is formed at the element back surface.

(Supplementary Note 54)

The terahertz device of Supplementary Note 21, further includes: a protection diode provided inside the encapsulating material and connected in parallel to the terahertz element.

(Supplementary Note 55)

In the terahertz device of Supplementary Note 21, the encapsulating material includes a device main surface and a device back surface as both end surfaces in a height direction of the terahertz device, the reflection film is curved so as to be convex toward the device back surface, the terahertz element is arranged inside the curved reflection film, the terahertz device further includes a sub-reflection film encapsulated by the encapsulating material separately from the reflection film and configured to face the terahertz element and the reflection film, the reflection film is configured to reflect the electromagnetic wave incident on the reflection film toward the sub-reflection film, and the sub-reflection film is configured to reflect the electromagnetic wave reflected by the reflection film toward the terahertz element.
(Supplementary Note 56)

The terahertz device of Supplementary Note 55, further includes: an electrode formed at a portion of the device back surface that overlaps with the reflection film when viewed in the height direction of the terahertz device; and a conductive portion provided inside the encapsulating material and erected from the electrode toward the terahertz element, wherein the conductive portion extends to the inside of the reflection film via a through-hole formed in the reflection film, and wherein the terahertz element is electrically connected to the conductive portion.
(Supplementary Note 57)

In the terahertz device of Supplementary Note 56, the conductive portion and the reflection film are insulated from each other.
(Supplementary Note 58)

In the terahertz device of Supplementary Note 55, the sub-reflection film is arranged in a projection region of the terahertz element when viewed in the height direction of the terahertz device.

According to the present disclosure in some embodiments, it is possible to provide a terahertz device capable of improving the gain.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A terahertz device comprising:
a terahertz element configured to generate an electromagnetic wave;
a reflection film provided at a position facing the terahertz element and configured to reflect the electromagnetic wave generated from the terahertz element in one direction; and
an encapsulating material configured to encapsulate the terahertz element and the reflection film,
wherein an encapsulating refractive index as a refractive index of the encapsulating material is higher than a refractive index of air and lower than an element refractive index as a refractive index of the terahertz element.

2. The terahertz device of claim 1,
wherein a conductive portion is provided inside the encapsulating material, and
wherein the terahertz element is flip-chip mounted on the conductive portion.

3. The terahertz device of claim 2,
wherein the encapsulating material includes, as both end surfaces in a height direction of the terahertz device:
a device main surface to which the electromagnetic wave reflected by the reflection film is outputted; and
a device back surface opposite to the device main surface,
wherein an electrode is formed at the device back surface, and
wherein the conductive portion is configured to electrically connect the terahertz element and the electrode.

4. A terahertz device, comprising:
a terahertz element configured to generate an electromagnetic wave;
a reflection film provided at a position facing the terahertz element and configured to reflect the electromagnetic wave generated from the terahertz element in one direction; and
an encapsulating material configured to encapsulate the terahertz element and the reflection film,
wherein a conductive portion is provided inside the encapsulating material,
wherein the terahertz element is flip-chip mounted on the conductive portion,
wherein the encapsulating material includes, as both end surfaces in a height direction of the terahertz device:
a device main surface to which the electromagnetic wave reflected by the reflection film is outputted, and
a device back surface opposite to the device main surface,
wherein an electrode is formed at the device back surface,
wherein the conductive portion is configured to electrically connect the terahertz element and the electrode,
wherein the terahertz element is arranged closer to the device main surface than to the device back surface, and
wherein the reflection film is arranged closer to the device back surface than to the terahertz element.

5. A terahertz device, comprising:
a terahertz element configured to generate an electromagnetic wave;
a reflection film provided at a position facing the terahertz element and configured to reflect the electromagnetic wave generated from the terahertz element in one direction; and
an encapsulating material configured to encapsulate the terahertz element and the reflection film,
wherein a conductive portion is provided inside the encapsulating material,
wherein the terahertz element is flip-chip mounted on the conductive portion,
wherein the encapsulating material includes, as both end surfaces in a height direction of the terahertz device:
a device main surface to which the electromagnetic wave reflected by the reflection film is outputted, and
a device back surface opposite to the device main surface,
wherein an electrode is formed at the device back surface,
wherein the conductive portion is configured to electrically connect the terahertz element and the electrode, and
wherein the electrode is formed at a portion of the device back surface that does not overlap with the reflection film when viewed in the height direction of the terahertz device.

6. The terahertz device of claim 5, wherein a heat dissipation electrode to which heat of the reflection film is transferred is formed at a portion of the device back surface that overlaps with the reflection film when viewed in the height direction of the terahertz device.

7. The terahertz device of claim 3, wherein the electrode is formed to straddle a portion of the device back surface that overlaps with the reflection film when viewed in the height direction of the terahertz device and a portion of the device back surface that does not overlap with the reflection film when viewed in the height direction of the terahertz device.

8. The terahertz device of claim 3,
wherein the terahertz element includes a pad facing the reflection film,
wherein the conductive portion includes:
   an element facing portion provided between the terahertz element and the reflection film to face the pad in the height direction of the terahertz device, and
   a bump provided between the pad and the element facing portion, and
wherein the terahertz element is flip-chip mounted on the element facing portion via the bump.

9. The terahertz device of claim 8,
wherein the pad has a shape having a longitudinal direction and a lateral direction when viewed in the height direction of the terahertz device,
wherein the element facing portion extends in the longitudinal direction of the pad, and
wherein the bump includes a plurality of bumps arranged in the longitudinal direction of the pad.

10. The terahertz device of claim 8, wherein the conductive portion includes:
   an element-side conductive portion including:
      the element facing portion,
      a protruding portion protruding from the reflection film when viewed in the height direction of the terahertz device, and
      a connection portion configured to connect the element facing portion and the protruding portion; and
   an electrode-side conductive portion provided at a position that does not overlap with the terahertz element and the reflection film when viewed in the height direction of the terahertz device, and electrically connected to both the protruding portion and the electrode.

11. The terahertz device of claim 10, wherein the electrode-side conductive portion is formed in a crank shape bent in the height direction of the terahertz device.

12. The terahertz device of claim 11, wherein the electrode-side conductive portion includes:
   a first flat portion facing the protruding portion in the height direction of the terahertz device;
   a second flat portion arranged closer to the device back surface than to the first flat portion and configured to face the electrode in the height direction of the terahertz device; and
   an inclined portion configured to connect the first flat portion and the second flat portion, and inclined so as to approach the device back surface as the inclined portion extends from the first flat portion to the second flat portion.

13. The terahertz device of claim 12, wherein the conductive portion includes:
   an element-side joining portion provided between the protruding portion and the first flat portion, and configured to join the protruding portion and the first flat portion; and
   an electrode-side joining portion provided between the second flat portion and the electrode, and configured to join the second flat portion and the electrode.

14. The terahertz device of claim 10,
wherein the element-side conductive portion extends in a first direction orthogonal to the height direction of the terahertz device, and
wherein, if a second direction orthogonal to both the height direction of the terahertz device and the first direction is defined as a width direction in the element-side conductive portion, at least a portion of the connection portion is formed to have a narrower width than the element facing portion.

15. The terahertz device of claim 14, wherein the connection portion includes:
   a connection body portion formed to have a narrower width than the element facing portion; and
   an element-side tapered portion configured to connect the connection body portion and the element facing portion, and formed to gradually widen from the connection body portion toward the element facing portion.

16. The terahertz device of claim 3,
wherein the electrode includes a first electrode and a second electrode,
wherein the conductive portion includes a first conductive portion and a second conductive portion,
wherein the first electrode and the second electrode are disposed at positions displaced in a first direction with respect to the reflection film on the device back surface when viewed in the height direction of the terahertz device, and are arranged side by side in a second direction orthogonal to the first direction, and
wherein the first conductive portion and the second conductive portion extend in the first direction while being arranged side by side in the second direction when viewed in the height direction of the terahertz device.

17. The terahertz device of claim 16,
wherein the terahertz element includes:
   an oscillation point, and
   a first pad and a second pad arranged to face each other and spaced apart in the second direction with the oscillation point interposed between the first pad and the second pad, the first pad and the second pad having a longitudinal direction extending in the first direction;
wherein the first conductive portion includes:
   a first element facing portion facing the first pad and having a longitudinal direction extending in the first direction, and
   a plurality of first bumps provided between the first pad and the first element facing portion and arranged along the first direction, and
wherein the second conductive portion includes:
   a second element facing portion facing the second pad and having a longitudinal direction extending in the first direction, and
   a plurality of second bumps provided between the second pad and the second element facing portion and arranged along the first direction.

18. The terahertz device of claim 3,
wherein the electrode includes:
   a first electrode, and
   a second electrode,
wherein the conductive portion includes:
   a first conductive portion, and
   a second conductive portion,
      wherein the first electrode and the second electrode are disposed at both sides of the reflection film in a first direction on the device back surface when viewed in the height direction of the terahertz device, and wherein the first conductive portion and the second conductive portion extend from the terahertz element in the first direction so as to be spaced apart from each other when viewed in the height direction of the terahertz device.

19. The terahertz device of claim 18,
wherein the terahertz element includes:
- an oscillation point, and
- a first pad and a second pad arranged to face each other and spaced apart in the first direction with the oscillation point interposed between the first pad and the second pad, the first pad and the second pad having a longitudinal direction extending in a second direction orthogonal to both the height direction of the terahertz device and the first direction, wherein the first conductive portion includes:
- a first element facing portion facing the first pad and having a longitudinal direction extending in the second direction, and
- a plurality of first bumps provided between the first pad and the first element facing portion and arranged along the second direction, and wherein the second conductive portion includes:
- a second element facing portion facing the second pad and having a longitudinal direction extending in the second direction, and
- a plurality of second bumps provided between the second pad and the second element facing portion and arranged along the second direction.

* * * * *